US008772783B2

(12) United States Patent
Hirosue et al.

(10) Patent No.: US 8,772,783 B2
(45) Date of Patent: *Jul. 8, 2014

(54) DISPLAY DEVICE

(75) Inventors: Misako Hirosue, Tochigi (JP);
Masahiro Katayama, Tochigi (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1011 days.

This patent is subject to a terminal disclaimer.

(21) Appl. No.: 11/240,568

(22) Filed: Oct. 3, 2005

(65) Prior Publication Data

US 2006/0081844 A1    Apr. 20, 2006

(30) Foreign Application Priority Data

Oct. 14, 2004    (JP) ................................. 2004-300807

(51) Int. Cl.
*H01L 27/14* (2006.01)
*H01L 27/146* (2006.01)

(52) U.S. Cl.
CPC ............................... *H01L 27/14605* (2013.01)
USPC .................. 257/72; 257/59; 438/48; 438/128

(58) Field of Classification Search
CPC .................................................. H01L 27/14605
USPC ............. 257/59, 72, 350, E33.064, E31.126, 257/E27.13, E27.137; 438/34, 809; 348/803
See application file for complete search history.

(56) References Cited

U.S. PATENT DOCUMENTS

| 4,653,864 | A | | 3/1987 | Baron et al. |
| 4,678,282 | A | * | 7/1987 | Yaniv et al. ..................... 349/42 |
| 4,759,610 | A | * | 7/1988 | Yanagisawa .................. 349/162 |
| 5,119,156 | A | * | 6/1992 | Kawahara et al. ............ 257/432 |
| 5,550,066 | A | | 8/1996 | Tang et al. |
| 6,067,134 | A | | 5/2000 | Akiyama et al. |
| 6,175,345 | B1 | * | 1/2001 | Kuribayashi et al. .......... 345/76 |
| 6,373,453 | B1 | * | 4/2002 | Yudasaka ........................ 345/76 |
| 6,392,722 | B1 | | 5/2002 | Sekime et al. |
| 6,465,268 | B2 | | 10/2002 | Hirakata et al. |

(Continued)

FOREIGN PATENT DOCUMENTS

| EP | 0 717 439 A2 | 6/1996 |
| EP | 0 989 778 A1 | 3/2000 |

(Continued)

*Primary Examiner* — Ajay K Arora
(74) *Attorney, Agent, or Firm* — Nixon Peabody LLP; Jeffrey L. Costellia

(57) ABSTRACT

The invention provides a technique to manufacture a display device with high image quality and reliability at low cost with high yield. According to the invention, a spacer is provided over a pixel electrode layer in a pixel region. Moreover, a surface of an insulating layer which functions as a partition which covers the periphery of the pixel electrode layer is formed at a high position from the surface of the pixel electrode due to stacked layers under the insulating layer. These spacer and insulator which function as a spacer support a mask used for selectively forming a light emitting material over a pixel electrode layer, thereby preventing the mask from contacting the pixel electrode layer due to a twist and deflection of the mask. Accordingly, such a damage as a crack does not occur in the pixel electrode layer which results in having no defect in shape. Therefore, a display device which performs a high resolution display with high reliability can be manufactured.

10 Claims, 28 Drawing Sheets

(56) References Cited

U.S. PATENT DOCUMENTS

| | | |
|---|---|---|
| 6,469,439 B2 | 10/2002 | Himeshima et al. |
| 6,559,594 B2 | 5/2003 | Fukunaga et al. |
| 6,592,933 B2 | 7/2003 | Himeshima et al. |
| 6,597,121 B2 * | 7/2003 | Imura .................. 315/169.3 |
| 6,614,174 B1 | 9/2003 | Urabe et al. |
| 6,638,781 B1 | 10/2003 | Hirakata et al. |
| 6,720,198 B2 | 4/2004 | Yamagata et al. |
| 6,743,650 B2 | 6/2004 | Hirakata et al. |
| 6,768,257 B1 | 7/2004 | Yamada et al. |
| 6,781,162 B2 | 8/2004 | Yamazaki et al. |
| 6,787,407 B2 | 9/2004 | Nakamura et al. |
| 6,798,132 B2 | 9/2004 | Satake |
| 6,815,723 B2 | 11/2004 | Yamazaki et al. |
| 6,821,827 B2 | 11/2004 | Nakamura et al. |
| 6,828,726 B2 * | 12/2004 | Sakurai et al. ............ 313/506 |
| 6,833,668 B1 | 12/2004 | Yamada et al. |
| 6,836,069 B2 * | 12/2004 | Iga .......................... 313/506 |
| 6,852,997 B2 | 2/2005 | Yamazaki et al. |
| 6,882,102 B2 * | 4/2005 | Yamazaki ................ 313/504 |
| 6,952,020 B1 | 10/2005 | Yamazaki et al. |
| 6,953,949 B2 | 10/2005 | Murade |
| 6,969,291 B2 | 11/2005 | Urabe et al. |
| 6,991,506 B2 | 1/2006 | Yamada et al. |
| 6,992,332 B2 | 1/2006 | Yamazaki et al. |
| 6,992,439 B2 | 1/2006 | Yamazaki et al. |
| 7,015,503 B2 | 3/2006 | Seki et al. |
| 7,057,209 B2 | 6/2006 | Yamazaki et al. |
| 7,094,684 B2 | 8/2006 | Yamazaki et al. |
| 7,112,115 B1 | 9/2006 | Yamazaki et al. |
| 7,214,959 B2 | 5/2007 | Seki et al. |
| 7,265,391 B2 | 9/2007 | Yamazaki et al. |
| 7,273,801 B2 | 9/2007 | Seki et al. |
| 7,384,860 B2 | 6/2008 | Nakamura et al. |
| 7,420,210 B2 | 9/2008 | Yamazaki et al. |
| 7,423,293 B2 | 9/2008 | Yamagata et al. |
| 7,442,955 B2 | 10/2008 | Seki et al. |
| 7,579,203 B2 | 8/2009 | Yamazaki et al. |
| 7,585,761 B2 | 9/2009 | Yamazaki et al. |
| 7,601,236 B2 | 10/2009 | Yamashita et al. |
| 7,683,535 B2 | 3/2010 | Fukunaga et al. |
| 7,719,014 B2 | 5/2010 | Yamazaki et al. |
| 7,723,179 B2 | 5/2010 | Yamazaki et al. |
| 7,745,993 B2 | 6/2010 | Fukunaga et al. |
| 7,792,489 B2 | 9/2010 | Hirakata et al. |
| 2001/0004469 A1 | 6/2001 | Himeshima et al. |
| 2001/0017517 A1 * | 8/2001 | Yamazaki ................ 313/504 |
| 2002/0047514 A1 * | 4/2002 | Sakurai et al. ............ 313/503 |
| 2002/0151252 A1 | 10/2002 | Kawase et al. |
| 2002/0158570 A1 | 10/2002 | Yamada et al. |
| 2002/0180371 A1 | 12/2002 | Yamazaki et al. |
| 2003/0122140 A1 | 7/2003 | Yamazaki et al. |
| 2003/0143794 A1 | 7/2003 | Nakamura et al. |
| 2003/0146439 A1 | 8/2003 | Yamazaki et al. |
| 2003/0173567 A1 | 9/2003 | Kokubo et al. |
| 2003/0189400 A1 | 10/2003 | Nishio et al. |
| 2004/0061118 A1 | 4/2004 | Yamazaki et al. |
| 2004/0084673 A1 | 5/2004 | Hirakata et al. |
| 2004/0090175 A1 | 5/2004 | Urabe et al. |
| 2004/0135501 A1 | 7/2004 | Nishikawa |
| 2004/0207789 A1 | 10/2004 | Hirakata et al. |
| 2004/0218112 A1 | 11/2004 | Hirakata et al. |
| 2005/0067617 A1 | 3/2005 | Yamazaki et al. |
| 2005/0140291 A1 | 6/2005 | Hirakata et al. |
| 2006/0199461 A1 | 9/2006 | Yamazaki et al. |
| 2006/0202615 A1 | 9/2006 | Murakami et al. |
| 2007/0015430 A1 | 1/2007 | Nishio et al. |
| 2007/0114921 A1 | 5/2007 | Yamazaki et al. |
| 2008/0018229 A1 | 1/2008 | Yamazaki |
| 2009/0020751 A1 | 1/2009 | Seki et al. |
| 2009/0298210 A1 | 12/2009 | Yamazaki et al. |
| 2010/0176720 A1 | 7/2010 | Yamazaki |
| 2010/0295052 A1 | 11/2010 | Yamazaki et al. |

FOREIGN PATENT DOCUMENTS

| | | | |
|---|---|---|---|
| EP | 1 102 317 | 5/2001 | |
| EP | 1 331 666 A2 | 7/2003 | |
| EP | 1 365 277 A2 | 11/2003 | |
| EP | 1 793 650 A2 | 6/2007 | |
| JP | 05-045677 JP | 2/1993 | |
| JP | 08-241047 | 9/1996 | |
| JP | 11-339958 | 12/1999 | |
| JP | 11-339968 | 12/1999 | |
| JP | 2000-129419 | 5/2000 | |
| JP | 2000-353594 | 12/2000 | |
| JP | 2001-148291 | 5/2001 | |
| JP | 2001-203076 | 7/2001 | |
| JP | 2002-015861 | 1/2002 | |
| JP | 2002-151252 | 5/2002 | |
| JP | 2003-059671 | 2/2003 | |
| JP | 2003059671 A * | 2/2003 | ............ H05B 33/22 |
| JP | 2003-123969 | 4/2003 | |
| JP | 2003-202818 | 7/2003 | |
| JP | 2003-270665 | 9/2003 | |
| JP | 2003-337553 | 11/2003 | |
| JP | 2004-047446 | 2/2004 | |
| JP | 2004-083650 | 3/2004 | |
| JP | 2004-165067 | 6/2004 | |
| JP | 2004-235048 | 8/2004 | |

* cited by examiner

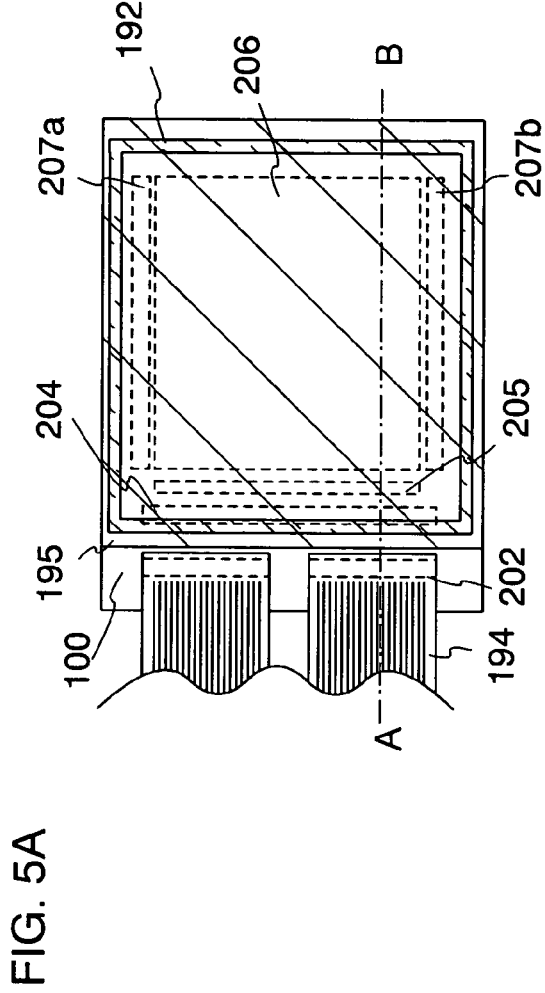
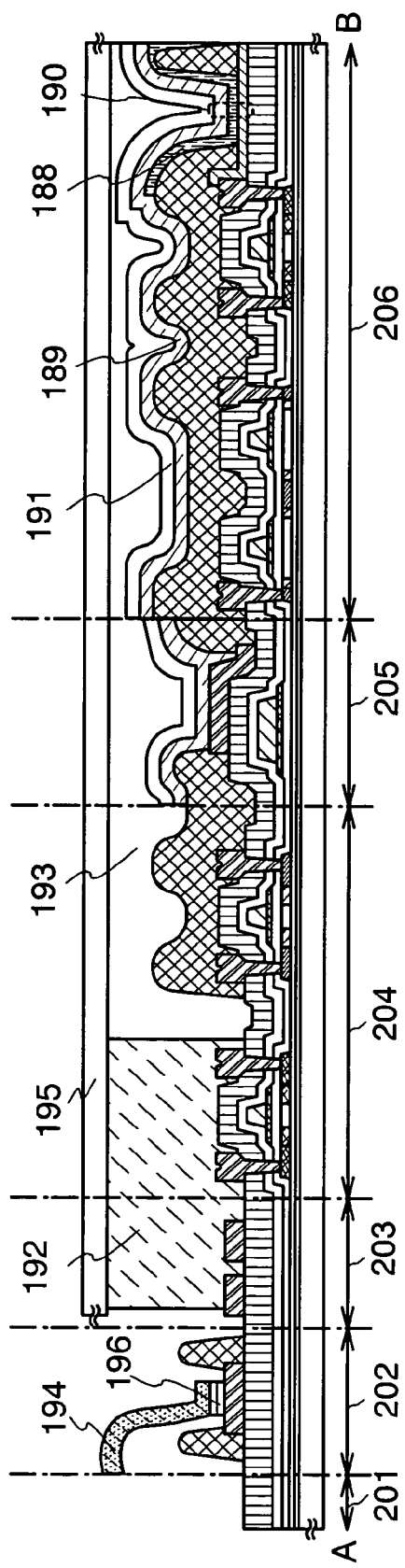
FIG. 5A
FIG. 5B

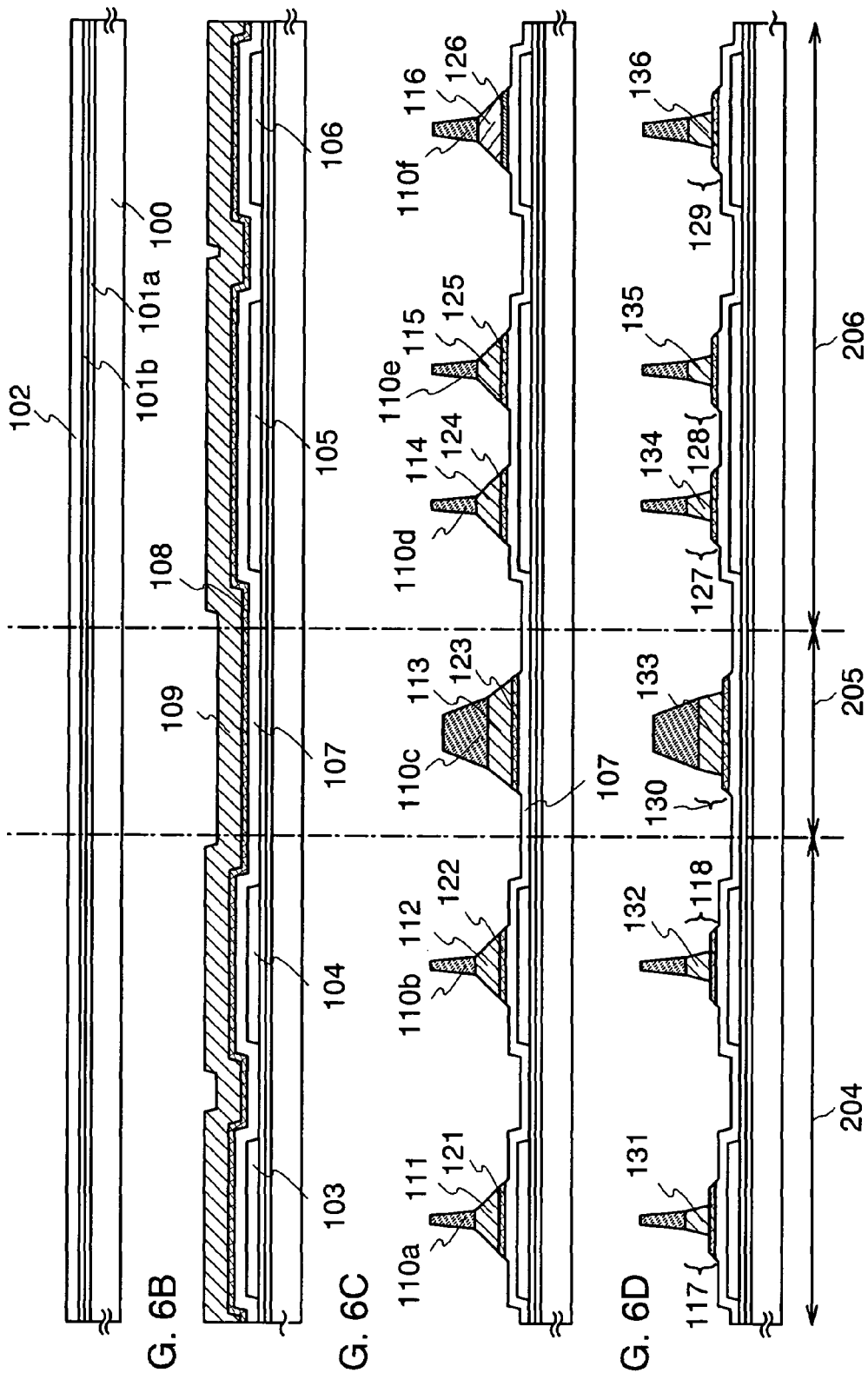

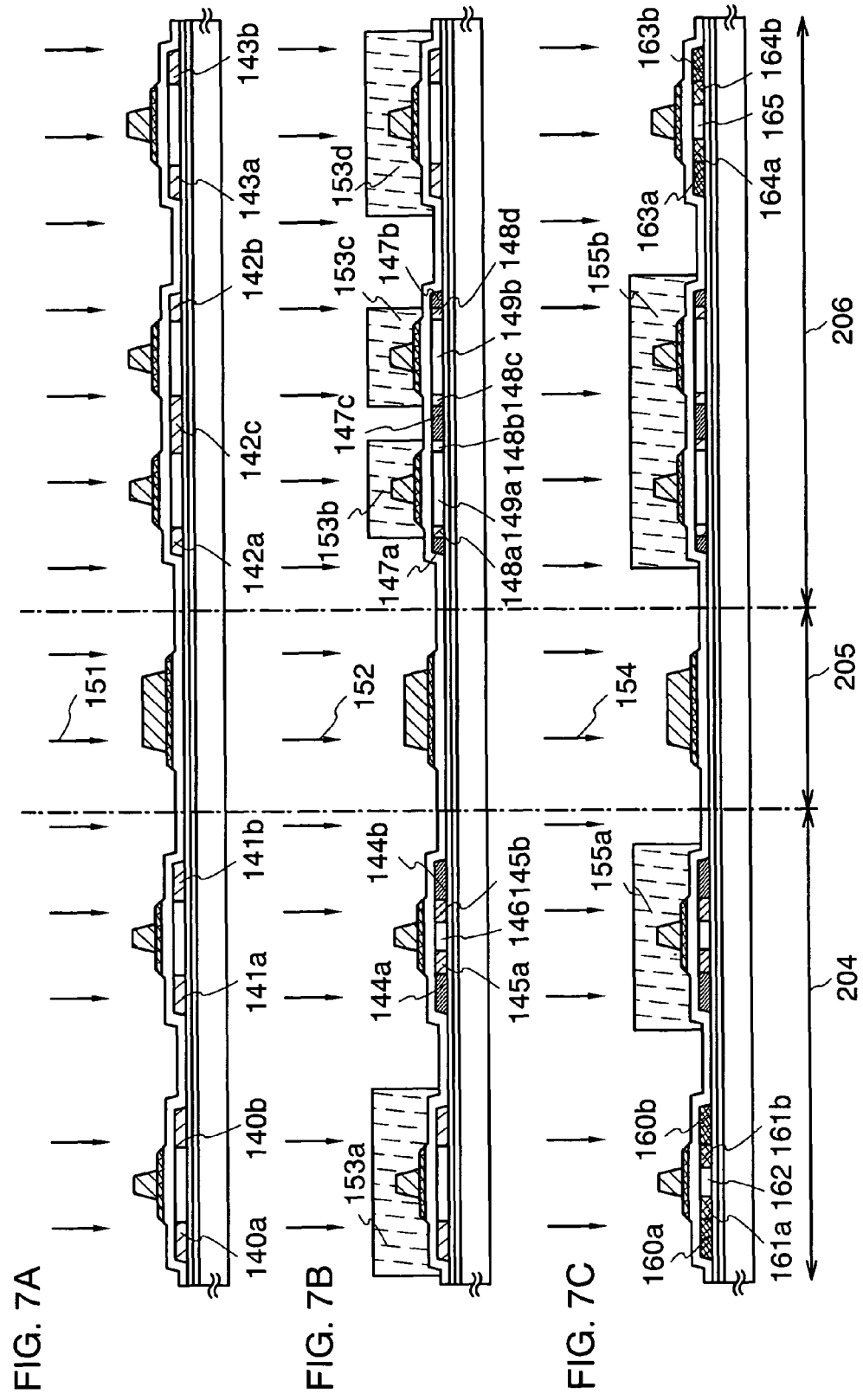

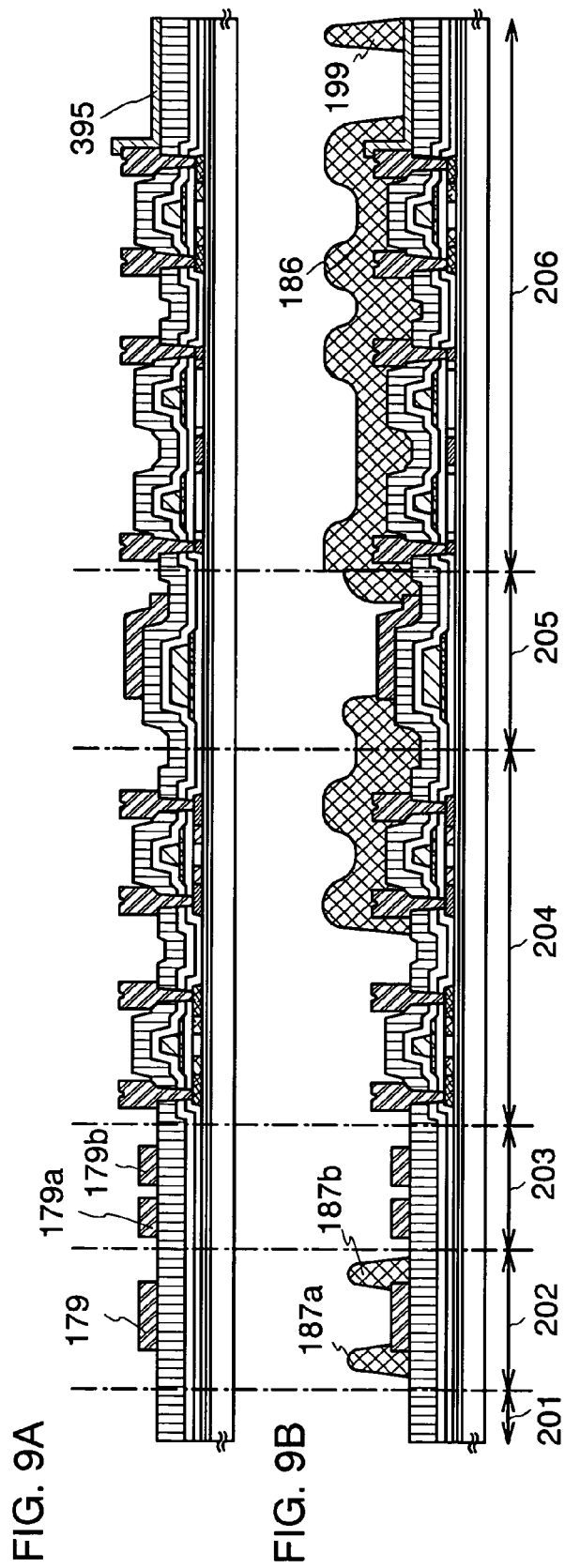

DISPLAY DEVICE

BACKGROUND OF THE INVENTION

1. Field of the Invention

The present invention relates to a manufacturing method of a display device.

2. Description of the Related Art

In order to perform a full color display by a display device provided with an electroluminescence (hereinafter also referred to as EL) element, a color light emitting element which emits color light is used. It is one of important factors for forming a color light emitting element to form a light emitting material of each color in a fine pattern on an electrode.

In order to achieve the aforementioned, generally used is a method for forming a fine pattern by using a mask when forming a material by a vapor deposition method and the like.

However, there is a problem in that a defect occurs due to a precision and a deflection of a mask used for deposition caused by the fineness of a pixel region and the large size of a substrate. A research aimed at high precision and reliability of a deposition mask has been reported (for example, see Patent Document 1).

Patent Document 1

Japanese Patent Laid-Open No. 2000-129419

SUMMARY OF THE INVENTION

The invention provides a technique to manufacture a display device having high resolution and reliability with high yield without complicating manufacturing steps and the apparatus.

According to the invention, a spacer is provided over a pixel electrode layer in a pixel region. Moreover, a surface of an insulating layer which functions as a partition which covers the periphery of the pixel electrode layer is formed at a high position from the surface of the pixel electrode due to a stacked object under the insulating layer. These spacer and insulator which function as a spacer support a mask used for selectively forming a light emitting material over a pixel electrode layer, thereby preventing the mask from contacting the pixel electrode layer due to a twist and deflection of the mask. Accordingly, such a damage as a crack does not occur in the pixel electrode layer which results in having no defect in shape. Therefore, a display device which performs a high resolution display with high reliability can be manufactured.

A display device to which the invention can be applied includes a light emitting display device in which a thin film transistor (hereinafter also referred to as a TFT) is connected to a light emitting element including a layer containing an organic substance which emits light called electroluminescence or a mixture of organic and inorganic substances interposed between electrodes.

According to the invention, a gate electrode layer is provided, an insulating layer is provided over the gate electrode layer, a source electrode layer or a drain electrode layer is provided over the insulating layer, a first electrode layer is provided in contact with the source electrode layer or the drain electrode layer over the insulating layer, an insulator covering a portion of the first electrode layer and the gate electrode layer, the insulating layer, the source electrode layer, or the drain electrode layer is provided, an electroluminescent layer is provided over the first electrode layer, a second electrode layer is provided over the electroluminescent layer, the insulator has a projection portion, and the projection portion is provided over the gate electrode layer and the source electrode layer or the drain electrode layer.

According to the invention, a gate electrode layer is provided, an insulating layer is provided over the gate electrode layer, a source electrode layer or a drain electrode layer is provided over the insulating layer, a first electrode layer having a spacer is provided in contact with the source electrode layer or the drain electrode layer over the insulating layer, an insulator covering a portion of the first electrode layer and the gate electrode layer, the insulating layer, the source electrode layer, or the drain electrode layer is provided, an electroluminescent layer is provided over the first electrode layer and the spacer, the second electrode layer is provided over the electroluminescent layer, the insulator has a projection portion, and the projection portion is provided over the gate electrode layer and the source electrode layer or the drain electrode layer.

According to the invention, a semiconductor layer is provided, a gate insulating layer is provided over the semiconductor layer, a gate electrode layer is provided over the gate insulating layer, an interlayer insulating layer is provided over the gate electrode layer, a source electrode layer or a drain electrode layer is provided over the interlayer insulating layer, a first electrode layer is provided in contact with the source electrode layer or the drain electrode layer over the interlayer insulating layer, an insulator covering a portion of the first electrode layer and the gate electrode layer, the insulating layer, the source electrode layer, or the drain electrode layer is provided, an electroluminescent layer is provided over the first electrode layer, a second electrode layer is provided over the electroluminescent layer, the insulator has a projection portion, and the projection portion is provided over the semiconductor layer, the gate electrode layer, and the source electrode layer or the drain electrode layer.

According to the invention, a semiconductor layer is provided, a semiconductor layer is provided, a gate insulating layer is provided over the semiconductor layer, a gate electrode layer is provided over the gate insulating layer, an interlayer insulating layer is provided over the gate electrode layer, a source electrode layer or a drain electrode layer is provided over the interlayer insulating layer, a first electrode layer having a spacer is provided in contact with the source electrode layer or the drain electrode layer over the interlayer insulating layer, an insulator covering a portion of the first electrode layer and the gate electrode layer, the insulating layer, the source electrode layer or the drain electrode layer is provided, an electroluminescent layer is provided over the first electrode layer and the spacer, a second electrode layer is provided over the electroluminescent layer, the insulator has a projection portion, and the projection portion is provided over the semiconductor layer, the gate electrode layer, and the source electrode layer or the drain electrode layer.

According to the invention, a gate electrode layer is provided, an insulating layer is provided over the gate electrode layer, a source electrode layer or a drain electrode layer is provided over the insulating layer, a first electrode layer is provided in contact with the source electrode layer or the drain electrode layer over the insulating layer, an insulator covering a portion of the first electrode layer and the gate electrode layer, the insulating layer, the source electrode layer or the drain electrode layer is provided, an electroluminescent layer is provided over the first electrode layer, a second electrode layer is provided over the electroluminescent layer, the insulator has a first projection portion and a second projection portion, the first projection portion is provided over the gate electrode layer, and the second projection portion is provided over the gate electrode layer and the source electrode layer or the drain electrode layer.

According to the invention, a gate electrode layer is provided, an insulating layer is provided over the gate electrode layer, a source electrode layer or a drain electrode layer is provided over the insulating layer, a first electrode layer having a spacer is provided in contact with the source electrode layer or the drain electrode layer over the insulating layer, an insulator covering a portion of the first electrode layer and the gate electrode, the insulating layer, the source electrode layer or the drain electrode layer is provided, an electroluminescent layer is provided over the first electrode layer and the spacer, a second electrode layer is provided over the electroluminescent layer, the insulator has a first projection portion and a second projection portion, the first projection portion is provided over the gate electrode layer, and the second projection portion is provided over the gate electrode layer and the source electrode layer or the drain electrode layer.

According to the invention, a semiconductor layer is provided, a gate insulating layer is provided over the semiconductor layer, a gate electrode layer is provided over the gate insulating layer, an interlayer insulating layer is provided over the gate electrode layer, a source electrode layer or a drain electrode layer is provided over the interlayer insulating layer, a first electrode layer is provided in contact with the source electrode layer or the drain electrode layer over the interlayer insulating layer, an insulator covering a portion of the first electrode layer and the gate electrode layer, the insulating layer, the source electrode layer or the drain electrode layer is provided, an electroluminescent layer is provided over the first electrode layer, a second electrode layer is provided over the electroluminescent layer, the insulator has a first projection portion, a second projection portion, and a third projection portion, the first projection portion is provided over the gate electrode layer, the second projection portion is provided over the gate electrode layer and the source electrode layer or the drain electrode layer, and the third projection portion is provided over the semiconductor layer, the gate electrode layer, and the source electrode layer or the drain electrode layer.

According to the invention, a semiconductor layer is provided, a gate insulating layer is provided over the semiconductor layer, a gate electrode layer is provided over the gate insulating layer, an interlayer insulating layer is provided over the gate electrode layer, a source electrode layer or a drain electrode layer is provided over the interlayer insulating layer, a first electrode layer having a spacer is provided in contact with the source electrode layer or the drain electrode layer over the interlayer insulating layer, an insulator covering a portion of the first electrode layer and the gate electrode layer, the insulating layer, the source electrode layer or the drain electrode layer is provided, an electroluminescent layer is provided over the first electrode layer and the spacer, a second electrode layer is provided over the electroluminescent layer, the insulator has a first projection portion, a second projection portion, and a third projection portion, the first projection portion is provided over the gate electrode layer, the second projection portion is provided over the gate electrode layer and the source electrode layer or the drain electrode layer, and the third projection portion is provided over the semiconductor layer, the gate electrode layer, and the source electrode layer or the drain electrode layer.

According to the aforementioned structures, the spacer and the insulator may be separated as shown in FIGS. 15 and 18B or continuously connected as shown in FIGS. 24A to 25D. The spacer functions after forming an electroluminescent layer and sealing with a sealing substrate to complete a display device to prevent a damage and deformation of a display device due to a pressure and shock, as well as functions for a mask used for forming the electroluminescent layer over the first electrode layer which functions as a pixel electrode layer.

According to the invention, a display device with high reliability can be manufactured by simplified steps. Therefore, a display device with high resolution and image quality can be manufactured at low cost with high yield.

BRIEF DESCRIPTION OF THE DRAWINGS

FIGS. 5A and 5B are diagrams showing a display device of the invention.

FIGS. 6A to 6D are diagrams showing manufacturing steps of a display device of the invention.

FIGS. 7A to 7C are diagrams showing manufacturing steps of a display device of the invention.

FIGS. 9A and 9B are diagrams showing manufacturing steps of a display device of the invention.

DETAILED DESCRIPTION OF THE INVENTION

Figure 1:
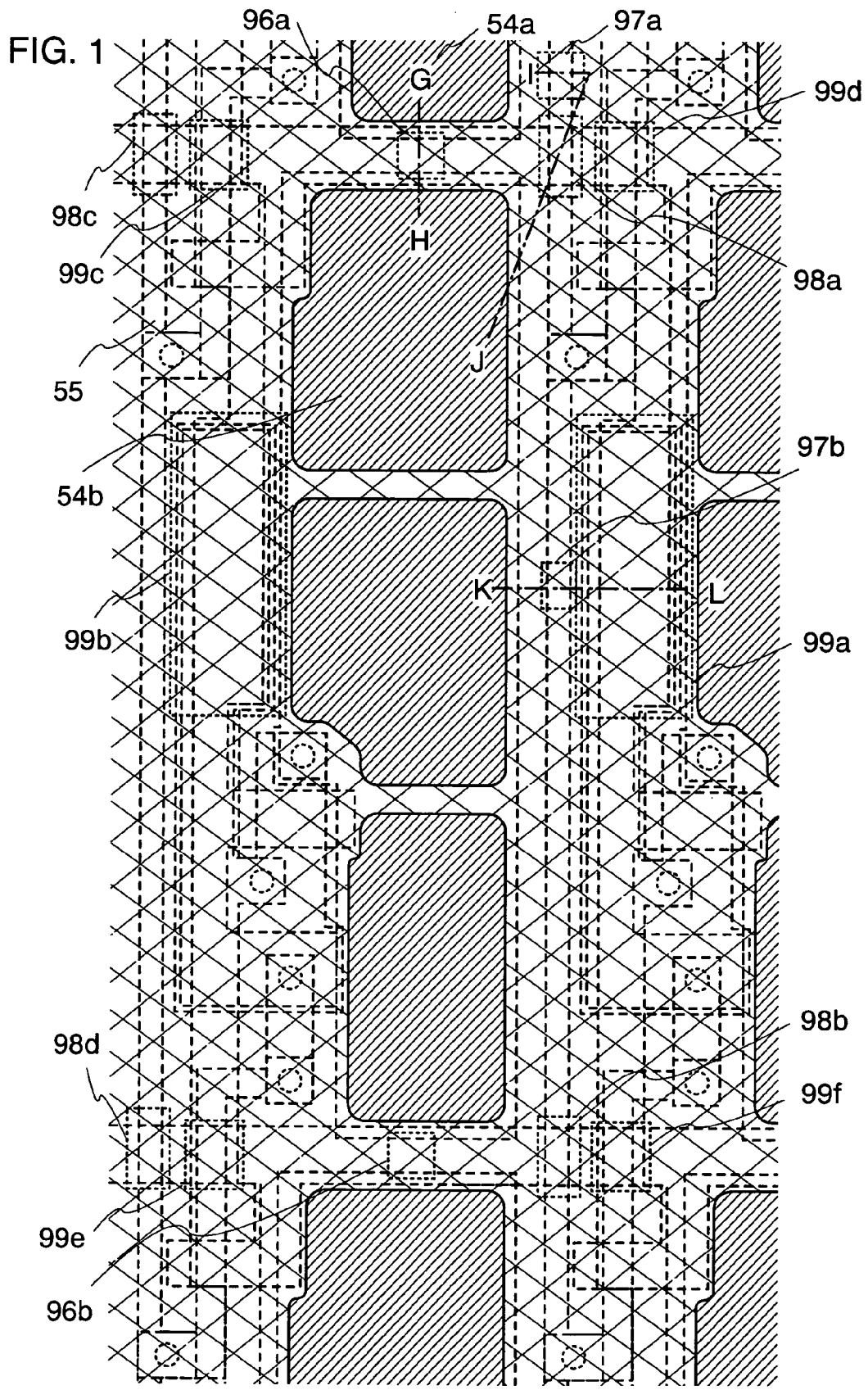
FIG. 1 is a top plan view showing a display device of the invention.

Although the present invention will be fully described by way of embodiment modes and embodiments with reference to the accompanying drawings, it is to be understood that various changes and modifications will be apparent to those skilled in the art. Therefore, unless otherwise such changes and modifications depart from the scope of the invention, they should be construed as being included therein. Note that identical portions in embodiment modes are denoted by the same reference numerals and detailed descriptions thereof are omitted.

EMBODIMENT MODE 1

A manufacturing method of a display device of this embodiment mode is described with reference to FIGS. 1 to 4.

Figure 2:
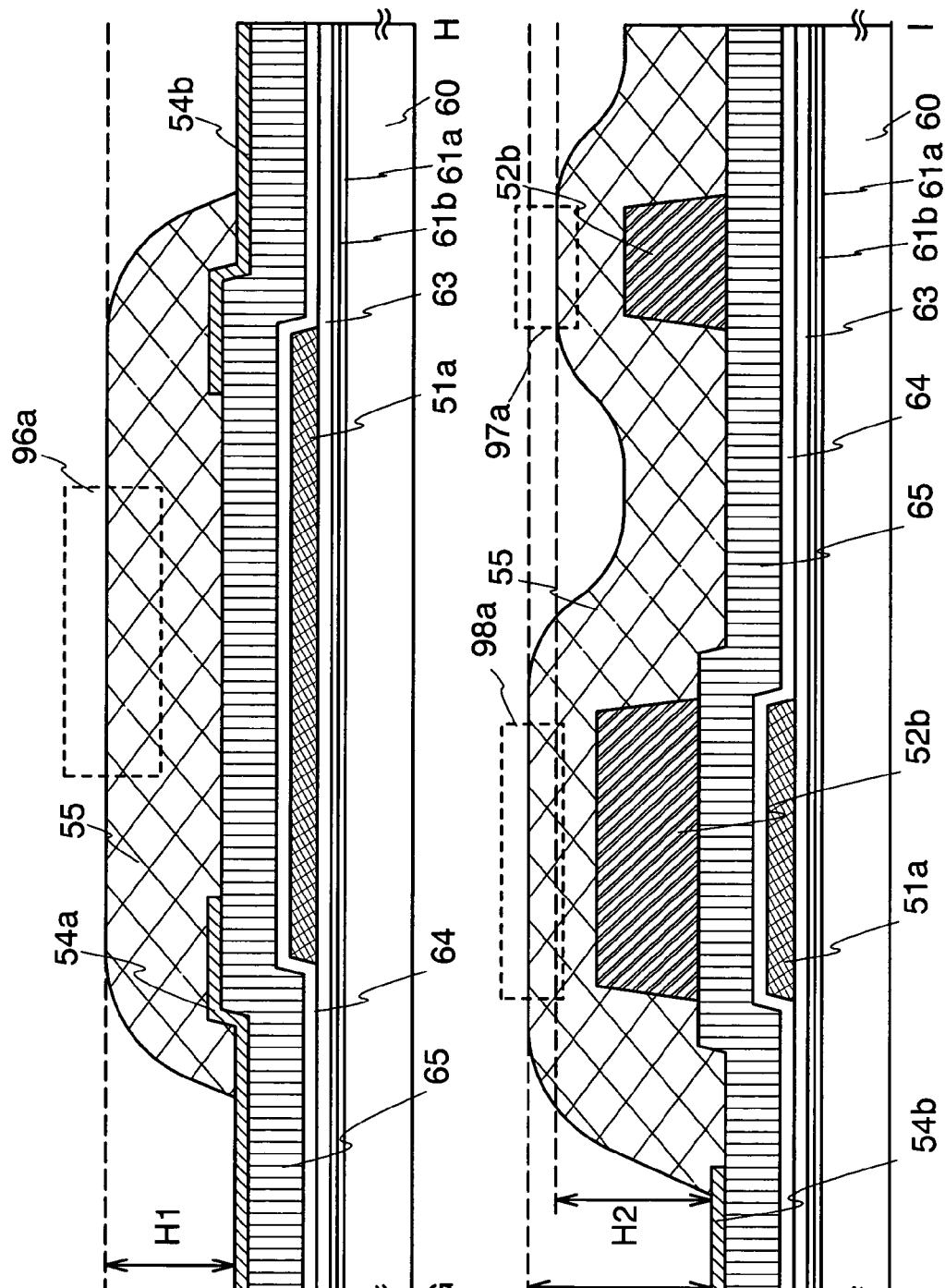
FIGS. 2A and 2B are cross sectional views each showing a display device of the invention.
Figure 3:
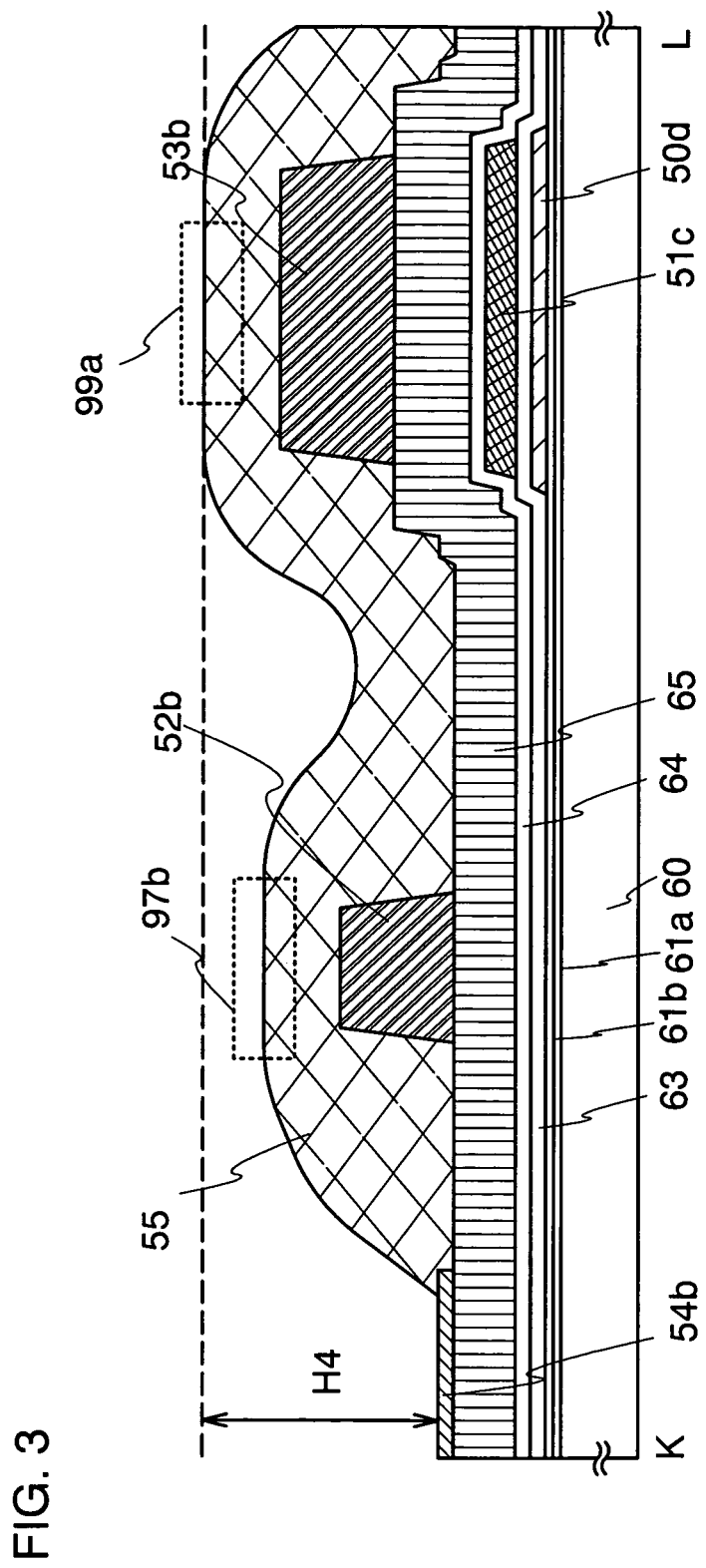
FIG. 3 is a cross sectional view showing a display device of the invention.
Figure 4:
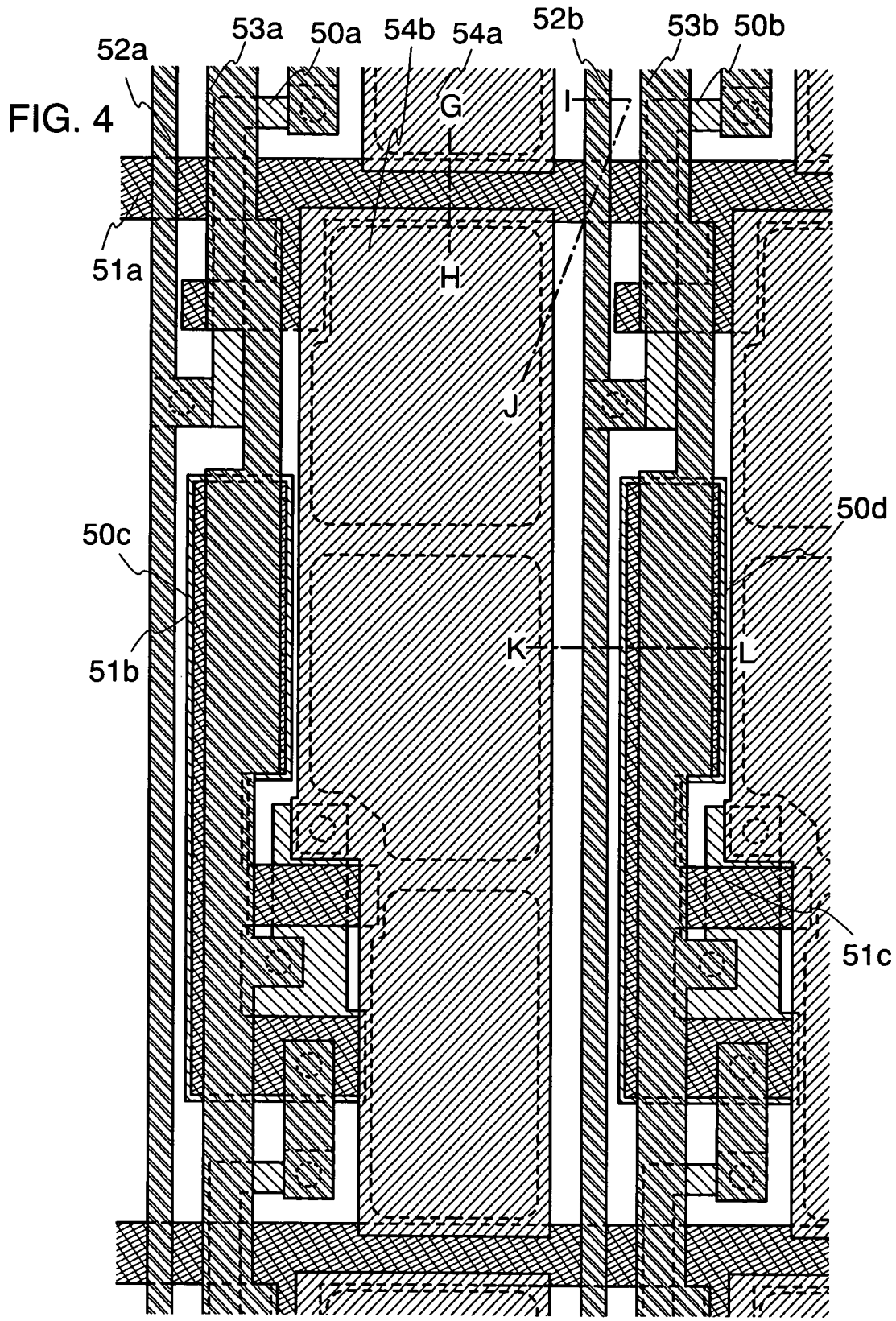
FIG. 4 is a top plan view showing a display device of the invention.

FIGS. 1 and 4 are top plan views of a pixel region of a display device manufactured using the invention. FIGS. 2A to 3 are sectional views of FIG. 1 along a line G-H, a line I-J, and a line K-L respectively.

FIG. 4 is a top plan view of a pixel region including a semiconductor layer 50a, a semiconductor layer 50b, a semiconductor layer 50c, a semiconductor layer 50d, a gate electrode layer 51a, a gate electrode layer 51b, a gate electrode layer 51c, a source electrode layer or a drain electrode layer 52a, a source electrode layer or a drain electrode layer 52b, a power supply line 53a, a power supply line 53b, a pixel electrode layer 54a, and a pixel electrode layer 54b.

According to the display device of this embodiment mode, the semiconductor layer, the gate electrode layer, the source electrode layer or the drain electrode layer are stacked and connected to form a thin film transistor and a capacitor, thereby electrical connections are achieved to realize a function as a display device.

As an electroluminescent layer which contributes to light emission is formed over the pixel electrode layer, a region which does not directly contribute to light emission such as the periphery of the pixel electrode layer, the source electrode layer or the drain electrode layer, the gate electrode layer, and the semiconductor layer is covered with an insulator which functions as a partition (also referred to as a bank).

As shown in FIG. 1, each of the pixel electrode layer 54a and the pixel electrode layer 54b has an aperture as an electroluminescent layer forming region and an insulator 55 covers the periphery thereof. In this embodiment mode, the insulator 55 is selectively formed over the pixel electrode layer as well. The surface of the insulator 55 formed as a partition in the periphery of the pixel electrode layer has a projection and a depression affected by a height of an object formed in a forming region of the insulator 55. An aperture of the insulator 55 over the pixel electrode layer has a curvature radius, which is preferably 2 μm or longer. When the insulator has an aperture with a curvature radius, a stress applied to the electroluminescent layer which is stacked can be dispersed.

FIG. 2A is a cross sectional view of FIG. 1 along the line G-H. An insulating film 61a, an insulating film 61b, a gate insulating film 63, a gate electrode layer 51a, an insulating film 64, and an insulating film 65 are formed over a substrate 60. A pixel electrode layer 54a and a pixel electrode layer 54b are formed over the insulating film 65. The insulator 55 is formed over the insulating film 61a, the insulating film 61b, the gate insulating film 63, the gate electrode layer 51a, the insulating film 64, and the insulating film 65 and has a projection portion 96a. The height of the surface of the pixel electrode layer 54a and the projection portion 96a of the insulator 55 is H1.

FIG. 2B is a cross sectional view of FIG. 1 along the line J-I. The insulating films 61a and 61b, the gate insulating film 63, the gate electrode layer 51a, the insulating film 64, and the insulating film 65 are formed over the substrate 60. The pixel electrode layer 54b, the source electrode layer or the drain electrode layer 52b are formed over the insulating film 65. As the line J-I cross the source electrode layer or the drain electrode layer 52b twice, the cross sectional view shows two source electrode layers or the drain electrode layers 52b. The insulator 55 is formed over the insulating films 61a and 61b, the gate insulating film 63, the gate electrode layer 51a, the insulating film 64, the insulating film 65, the source electrode layer or the drain electrode layer 52b. In FIG. 2B, the insulator 55 has a projection portion 98a formed to overlap a region where the gate electrode layer 51b and the source electrode layer or the drain electrode layer 52b are stacked and a projection portion 97a formed to overlap a region where the source electrode layer or the drain electrode layer 52b only is provided without the gate electrode layer 51a stacked thereover. The height from the surface of the pixel electrode layer 54b to the projection portion 97a of the insulator 55 is H2 and that to the projection portion 98a is H3. It is preferable that H3 be 1.5 μm or higher, and more preferably 2 to 5 μm. Further, it is preferable that H3 be higher than H1 by 0.4 μm or more.

FIG. 3 is a sectional view of FIG. 1 along the line K-L. The insulating films 61a and 61b, the semiconductor layer 50d, the gate insulating film 63, the gate electrode layer 51c, the insulating film 64, and the insulating film 65 are formed over the substrate 60. The pixel electrode layer 54b, the source electrode layer or the drain electrode layer 52b, and the power supply line 53b are formed over the insulating film 65. The insulator 55 is formed over the insulating films 61a and 61b, the gate insulating film 63, the gate electrode layer 51c, the insulating film 64, the insulating film 65, the source electrode layer or the drain electrode layer 52b, and the power supply line 53b. In FIG. 3, the insulator 55 has a projection portion 99a formed to overlap a region where the semiconductor layer 50d, the gate electrode layer 51c and the power supply line 53b are stacked, and a projection portion 97b formed to overlap a region where the source electrode layer or the drain electrode layer 52b only is formed without the semiconductor layer and the gate electrode layer stacked thereover. The height from the surface of the pixel electrode layer 54b to the projection portion 99a is H4.

The height from the surface of the pixel electrode layer to the insulator 55 is H1, H2, and H3 from a shorter height, and H4 is the highest. In this embodiment mode, the source electrode layer or the drain electrode layer is formed thicker than the gate electrode layer, therefore, the height H2 is higher than the height H1. However, the height is affected by a film thickness of a stacked layer, therefore, the relation between H1 and H2 becomes opposite when forming the source electrode layer or the drain electrode layer thinner than the gate electrode layer.

The projection portions 99a, 99b, 99c, 99d, 99e, and 99f of the insulator are formed in a region where the semiconductor layer, the gate electrode layer, the power supply line as well as each insulating layer are stacked at the height of H4 from the surface of the pixel electrode layer, which is the highest. Further, projection portions 98a, 98b, 98c, and 98d of an insulator formed in a region where the gate electrode layer and the source electrode layer or the drain electrode layer are stacked are formed at the height H3 from the surface of the pixel electrode layer, which is the second highest. In this embodiment mode, the height H2 of the projection portions 97a and 97b of the insulator formed in a region where the source electrode layer or the drain electrode layer is stacked is lower than H3. The height H1 of the projection portions 96a and 96b of the insulator formed in a region where the gate electrode layer is stacked is lower than H2, that is, H1 is the shortest height among H1 to H4.

In order to perform a full color display, electroluminescent layers for emitting light of RGB have to be formed separately when forming an electroluminescent layer over a pixel electrode layer. Therefore, when forming an electroluminescent layer of another color, the pixel electrode layer is covered with a mask. The mask may be a film formed of a metal material and the like. At this time, the mask may contact the pixel electrode layer by a deflection and a twist of the mask and may cause a crack in the pixel electrode layer. When a defect occurs in shape of the pixel electrode layer by a crack and the like, a light emission defect, a display defect and the like are caused which may decrease image quality. Therefore, reliability and performance may also be degraded.

In this manner, the projection portion can make the height from the surface of the pixel electrode layer to the surface of the insulator high, which can realize a top surface of the insulator to function as a spacer. A mask used when depositing an electroluminescent layer is supported by the spacer formed over the pixel electrode layer and the insulator covering the periphery of the pixel electrode layer as a partition, therefore, the mask does not contact the pixel electrode layer. Accordingly, a defect in shape of the pixel electrode layer due to a mask can be prevented, which leads to manufacture a display device with high reliability and image quality without the first electrode layer generating a light emission defect and a display defect.

EMBODIMENT MODE 2

A manufacturing method of a display device according to this embodiment mode is described in details with reference to FIGS. 5A to 10, 16A to 16C, and 17A and 17B.

Figure 16A:
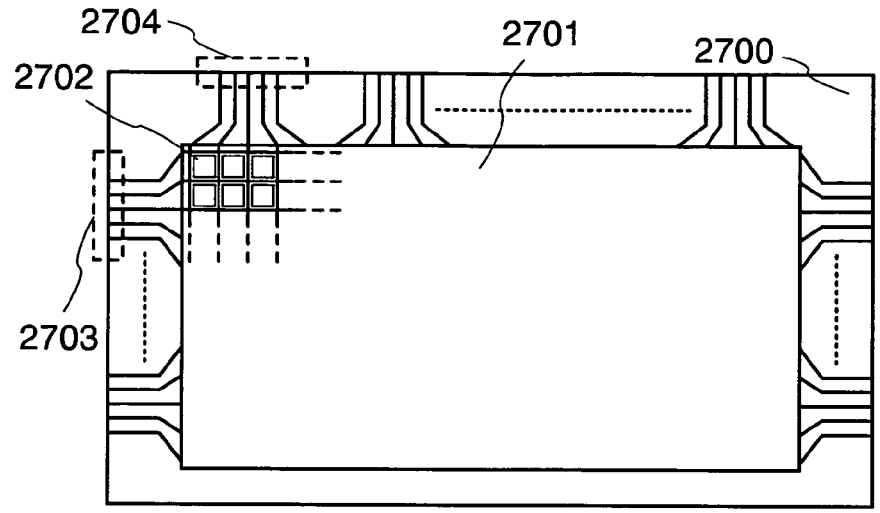
FIGS. 16A to 16C are top plan views of a display device of the invention.

FIG. 16A is a top plan view showing a configuration of a display panel according to the invention, including a pixel portion 2701 in which a pixel 2702 is arranged in matrix, a scan line side input terminal 2703, a signal line side input terminal 2704 which are formed over a substrate 2700 having an insulating surface. The number of pixels may be set according to various standards, for example, 1024×768×3 (RGB) in the case of XGA, 1600×1200×3 (RGB) in the case of UXGA, and 1920×1080×3 (RGB) in the case of the use for a full spec high vision display.

The pixel 2702 is arranged in matrix according to a scan line extending from the scan line side input terminal 2703 and a signal line extending from the signal line side input terminal 2704 crossing each other. Each pixel 2702 is provided with a switching element and a pixel electrode layer connected thereto. A typical example of the switching element is a TFT. A gate electrode layer side of a TFT is connected to the scan line and a source or drain side thereof is connected to the signal line, thereby each pixel can be controlled independently by a signal inputted externally.

A TFT has a semiconductor layer, a gate insulating layer and a gate electrode layer as major components. A wiring layer connected to a source and drain regions formed in the semiconductor layer is further provided. Typically known are a top gate structure in which a semiconductor layer, a gate insulating layer, and a gate electrode layer are provided from a substrate side, a bottom gate structure in which a gate electrode layer, a gate insulating layer, and a semiconductor layer are provided from a substrate side and the like, and the invention may employ any of the aforementioned structures.

Figure 17A:
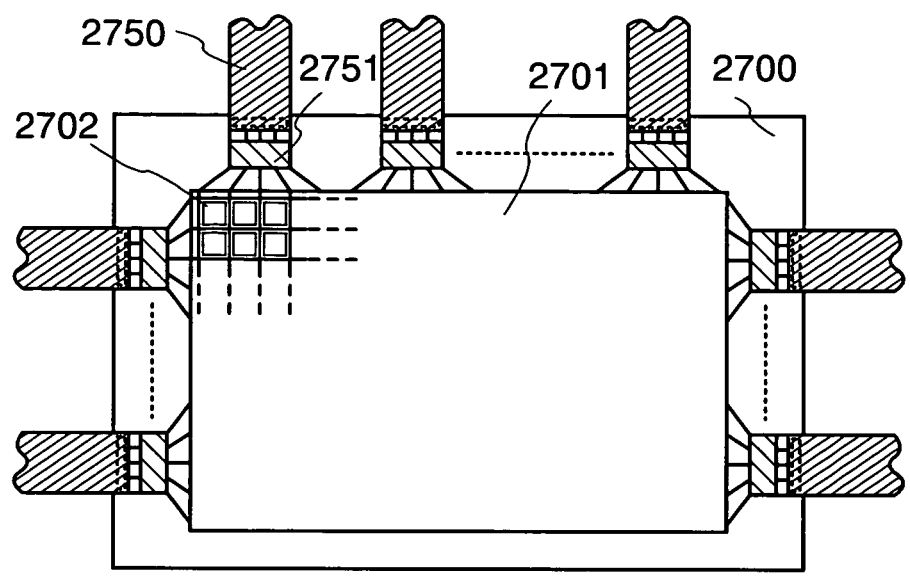
FIGS. 17A and 17B are top plan views of a display device of the invention.
Figure 17B:
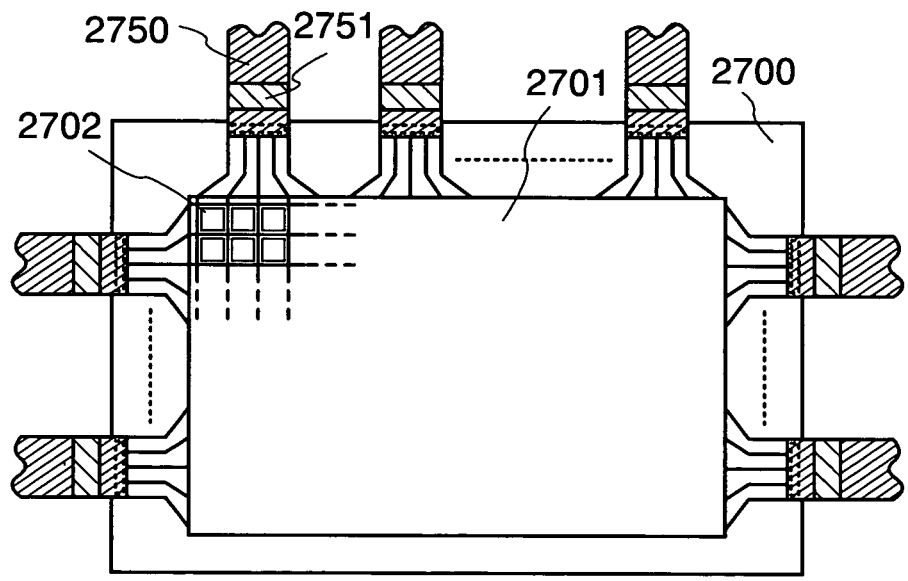

FIG. 16A shows a configuration of a display panel in which a signal to be inputted to the scan line and the signal line is controlled by an external driver circuit, however, a driver IC 2751 may be mounted on the substrate 2700 by a COG (Chip On Glass) method as shown in FIG. 17A. Further, as another mode, a TAB (Tape Automated Bonding) method as shown in FIG. 17B may be employed as well. A driver IC may be formed over a single crystalline semiconductor substrate or a glass substrate over which the circuit is formed by TFTs. In FIGS. 17A and 17B, the driver IC 2751 is connected to an FPC (Flexible Printed Circuit) 2750.

Figure 16B:
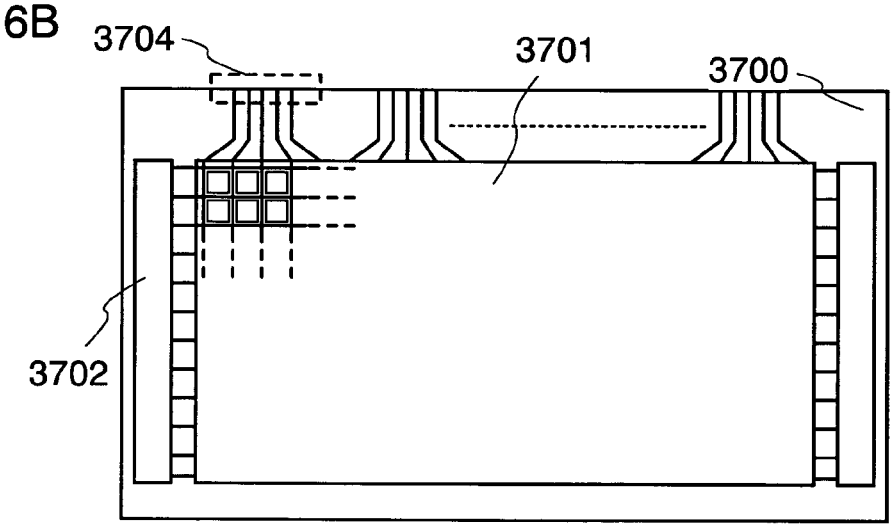

Further, in the case of forming a TFT provided in a pixel using a crystalline semiconductor, a scan line side driver circuit 3702 may be integrated over a substrate 3700 as shown in FIG. 16B. In FIG. 16B, a pixel portion 3701 is controlled by an external driver circuit similarly to FIG. 16A in which the pixel portion 3701 is connected to a signal line side input terminal 3704. In the case of forming a TFT provided in a pixel using a polycrystalline (microcrystalline) semiconductor, a single crystalline semiconductor and the like with high mobility, a pixel portion 4701, a scan line driver circuit 4702, and a signal line driver circuit 4704 can be integrated over a substrate 4700.

As a base film over a substrate 100 having an insulating surface, a silicon nitride oxide film (SiNO) is formed as a base film 101a with a thickness of 10 to 200 nm (preferably 50 to 100 nm) by a sputtering method, a PVD method (Physical Vapor Deposition), and a CVD method (Chemical Vapor Deposition) such as a low pressure CVD method (LPCVD method), or a plasma CVD method and a silicon oxynitride film (SiON) is formed as a base film 101b with a thickness of 50 to 200 nm (preferably 100 to 150 nm). In this embodiment mode, the base film 101a and the base film 101b are formed by a plasma CVD method. The substrate 100 may be a glass substrate, a quartz substrate, a silicon substrate, a metal substrate, or a stainless substrate having a surface covered with an insulating film. Further, a plastic substrate which can resist a processing temperature of this embodiment mode or a flexible substrate such as a film may be used as well. As a plastic substrate, a substrate formed of PET (polyethylene terephthalate) or PEN (polyethylene naphthalate) may be used while a synthetic resin such as acrylic may be used as a flexible substrate.

As a base film, silicon oxide, silicon nitride, silicon oxynitride, silicon nitride oxide and the like may be used in a single layer or stacked layers of two or three layers. It is to be noted that silicon oxynitride has a composition ratio of oxygen higher than that of nitrogen and can also be referred to as silicon oxide containing nitrogen. Similarly, silicon nitride oxide has a composition rate of nitrogen higher than that of oxygen and can also be referred to as silicon nitride containing oxygen. In this embodiment mode, a silicon nitride oxide film is formed with a thickness of 50 nm using as a reaction gas $SiH_4$, $NH_3$, $N_2O$, $N_2$, and $H_2$, and a silicon oxynitride film is formed with a thickness of 100 nm using as a reaction gas $SiH_4$ and $N_2O$. Further, a silicon nitride oxide film may be formed with a thickness of 140 nm and a silicon oxynitride film to be stacked may be formed with a thickness of 100 nm.

It is preferable to form a silicon nitride film or a silicon nitride oxide film with a thickness of 0.3 to 5 nm as a top layer of the base film in contact with the semiconductor layer. In this embodiment mode, a metal element (in this embodiment mode, nickel is used) for promoting crystallization is added to the semiconductor layer and later removed by gettering treatment. An interface condition between a silicon oxide film and a silicon film is favorable, however, there may be a case where a metal element in a silicon film and oxygen in a silicon oxide film react to form a metal oxide (nickel oxide (NiOx) in this embodiment mode), thereby the metal element is not easily gettered. Moreover, a silicon nitride film may adversely affect the interface condition with the semiconductor layer due to a stress of the silicon nitride film and an effect of a trap. Therefore, a silicon nitride film or a silicon nitride oxide film is formed with a thickness of 0.3 to 5 nm as a top layer of an insulating layer in contact with the semiconductor layer. In this embodiment mode, after sequentially stacking a silicon nitride oxide film and a silicon oxynitride film over the substrate 100, a silicon nitride oxide film is formed with a thickness of 0.3 to 5 nm over the silicon oxynitride film to form a stacked-layer structure of three layers. With such a structure, a gettering efficiency of a metal element in the semiconductor layer increases and the adverse effect of a silicon nitride film against the semiconductor layer can be reduced. The insulating layer to be stacked is preferably continuously formed by changing a reaction gas at the same temperature without breaking the vacuum in the same chamber. By continuously forming the insulating layer without breaking the vacuum, an interface between the stacked films can be prevented from contamination.

Subsequently, a semiconductor film is formed over the base film. The semiconductor film may be formed by a known means (a sputtering method, an LPCVD method, a plasma CVD method or the like) with a thickness of 25 to 200 nm (preferably 30 to 150 nm). In this embodiment mode, it is preferable to use a crystalline semiconductor film formed by crystallizing an amorphous semiconductor film by laser irradiation.

A material for forming a semiconductor film may be an amorphous semiconductor (hereinafter also referred to as "amorphous semiconductor: AS") formed by a vapor deposition method and a sputtering method using a semiconductor material gas typified by silane and germane, a polycrystalline semiconductor formed by crystallizing the amorphous semiconductor using an light energy and a heat energy, or a semi-amorphous semiconductor (also referred to as microcrystal and hereinafter referred to as "SAS") and the like.

An SAS is a semiconductor having an intermediate structure between amorphous and crystalline (including single crystalline and polycrystalline) structures and having a third state which is stable in free energy. Moreover, an SAS is a crystalline semiconductor having a short distance order and lattice distortion, and formed by dispersing a grain having a diameter of 0.5 to 20 nm is dispersed at least in a portion of a film. In the case of containing silicon as a main component, Raman spectrum of an SAS is shifted toward lower wave numbers than 520 cm$^{-1}$. The diffraction peaks of (111) and (220), which are believed to be derived from Si crystal lattice, are observed in the SAS film by X-ray diffraction. The semi-amorphous semiconductor film contains hydrogen or halogen by at least 1 atom % or more for terminating dangling bonds. An SAS is formed by depositing a silicide gas source by glow discharge (plasma CVD). The silicide gas is typically $SiH_4$, as well as $Si_2H_6$, $SiH_2Cl_2$, $SiHCl_3$, $SiCl_4$, $SiF_4$ and the like. Also, $F_2$ and $GeF_4$ may be mixed as well. The silicide gas source may be diluted with $H_2$ or a mixed gas of $H_2$ and one or a plurality of rare gas elements such as He, Ar, Kr, and Ne. The silicide gas source is preferably diluted with the dilution ratio of 2 to 1000 times, at a pressure of approximately 0.1 to 133 Pa, and at a power supply frequency of 1 to 120 MHz, more preferably with a high frequency power of 13 to 60 MHz. It is preferable that a temperature for heating the substrate is 300° C. or less, preferably 100 to 250° C. It is preferable that impurities of atmospheric components such as oxygen, nitrogen, and carbon as impurity elements in the film be $1\times10^{20}$ cm$^{-3}$ or less. In particular, oxygen concentration is preferably $5\times10^{19}$/cm$^{-3}$ or less and more preferably $1\times10^{19}$/cm$^{-3}$ or less. Further, when a rare gas element such as helium, argon, krypton, or neon is mixed into an SAS, the lattice distortion is increased and the stability is thus enhanced, leading to form a favorable SAS. Further, as the semiconductor film, an SAS layer formed by a hydrogen-based gas may be stacked over an SAS layer formed by a fluorine-based gas.

As a typical amorphous semiconductor, hydrogenated amorphous silicon may be used while polysilicon and the like may be used as a crystalline semiconductor. Polysilicon (polycrystalline silicon) includes what is called high temperature polysilicon formed using polysilicon as a main material which is formed at a processing temperature of 800° C. or higher, what is called low temperature polysilicon formed using polysilicon as a main material which is formed at a processing temperature of 600° C. or lower, polysilicon crystallized by adding an element which promotes crystallization and the like. It is needless to say that a semiconductor containing a crystal phase in a portion of a semi-amorphous semiconductor or a semiconductor film may be used as described above.

In the case of using a crystalline semiconductor film for the semiconductor film, the crystalline semiconductor film may be formed by a known method (a laser crystallization method, a thermal crystallization method, a thermal crystallization method using an element such as nickel which promotes crystallization and the like). Further, a microcrystalline semiconductor as an SAS may be crystallized by laser irradiation to enhance crystallinity. In the case where an element which promotes crystallization is not used, the amorphous semiconductor film is heated for one hour in a nitrogen atmosphere at 500° C. to let out hydrogen so that a hydrogen concentration becomes $1\times10^{20}$ atoms/cm$^3$ or lower before irradiating the amorphous semiconductor film with laser light. If the amorphous semiconductor film contains a lot of hydrogen, the amorphous semiconductor film may be broken by laser light irradiation. Thermal treatment for crystallization may be performed using an annealing furnace, laser irradiation, irradiation of light emitted from a lamp (also referred to as a lamp annealing) or the like. As a thermal method, an RTA method such as a GRTA (Gas Rapid Thermal Anneal) method and an LRTA (Lamp Rapid Thermal Anneal) method may be used.

A method for introducing a metal element to the amorphous semiconductor film is not limited as long as it is a method for forming the metal element over a surface or inside the amorphous semiconductor film. For example, a sputtering method, a CVD method, plasma treatment (including a plasma CVD method), an absorption method, or a method of applying a solution of metal salt can be used. Among these, a method of using a solution is easy and advantageous in that the concentration of the metal element can be easily controlled. It is desirable to form an oxide film by UV light irradiation in an oxygen atmosphere, a thermal oxidation method, treatment by using ozone water containing hydroxyl radical or using hydrogen peroxide, or the like to improve wettability of a surface of the amorphous semiconductor film to diffuse an aqueous solution over the entire surface of the amorphous semiconductor film.

In order to obtain large grain crystals in crystallization, a second to fourth harmonic of the fundamental wave of a solid state laser capable of continuous oscillation is preferably used. Typically, a second (532 nm) and third (355 nm) harmonic of an Nd:YVO$_4$ laser (fundamental wave is 1064 nm) is used. In specific, laser light emitted from the continuous oscillation type $YVO_4$ laser is converted into a harmonic by using a non-linear optical element, thereby obtaining laser light of output 10 W or higher. It is preferable to form laser light into a rectangular or elliptical shape on an irradiated surface by an optical system for the irradiation on an object. An energy density at this time is required to be about 0.001 to 100 $MW/cm^2$ (preferably 0.1 to 10 $MW/cm^2$). The semiconductor film is irradiated with the laser light at a scan rate of about 0.5 to 2000 cm/sec (preferably 10 to 200 cm/sec).

It is preferable that a shape of a laser beam be linear. As a result, throughput can be improved. Further, it is preferable that a semiconductor film be irradiated with laser at an incident angle $\theta(0<\theta<90°)$, thereby an interference of the laser can be prevented.

By scanning such laser and a semiconductor film relatively, laser irradiation can be realized. Further, a marker may be formed for overlapping beams at high precision and controlling a position to start and finish laser irradiation. The marker may be formed over a substrate at the same time as an amorphous semiconductor film.

It is to be noted that a laser may be a gas laser, a solid state laser, a copper vapor laser, a gold vapor laser and the like capable of continuous oscillation or pulsed oscillation. The gas laser includes an excimer laser, an Ar laser, a Kr laser, a He—Cd laser and the like while the solid state laser includes a YAG laser, a $YVO_4$ laser, a YLF laser, a $YAlO_3$ laser, a $Y_2O_3$ laser, a glass laser, a ruby laser, an alexandrite laser, a Ti: sapphire laser and the like.

The laser crystallization may be performed by a pulse laser at a repetition rate of 0.5 MHz or more, which is a drastically higher range of repetition rates than a generally used range of repetition rates of several ten to several hundred Hz. It is said that the time between irradiation of laser light and solidification of the semiconductor film is several ten to several hundred nsec in a pulse laser. Hence, the semiconductor film can be irradiated with the following pulse of the laser light during the period from melting the semiconductor film by the preceding pulse and solidification of the semiconductor film by using the foregoing range of repetition rate. Since solid-liquid interface can be continuously moved in the semiconductor film, a semiconductor film having crystal grains that have grown continuously in the scanning direction of the laser beam is formed. Specifically, an aggregate of crystal grains having widths of 10 to 30 µm in the scanning direction and widths of 1 to 5 µm in the direction perpendicular to the scanning direction can be formed. By forming crystal grains of single crystal extended long along the scanning direction, a semiconductor film which has almost no crystal boundary at least in a channel direction of a TFT can be formed.

The semiconductor film may be irradiated with laser light in an inert gas atmosphere such as rare gas or nitrogen. Accordingly, roughness of a surface of the semiconductor film due to laser irradiation can be prevented, and variation of a threshold voltage due to variation of interface state densities can be prevented.

An amorphous semiconductor film may be crystallized by the combination of thermal treatment and laser light irradiation, or one of thermal treatment and laser light irradiation may be performed a plurality of times.

In this embodiment mode, a crystalline semiconductor film is formed by forming an amorphous semiconductor film over the base film 101b and crystallizing the amorphous semiconductor film. As the amorphous semiconductor film, amorphous silicon formed using a reaction gas of $SiH_4$ and $H_2$ is used. In this embodiment mode, the base film 101a, the base film 101b, and the amorphous semiconductor film are continuously formed by changing a reaction gas without breaking the vacuum in the same chamber at the same temperature of 330° C.

After removing an oxide film formed over the amorphous semiconductor film, an oxide film is formed with a thickness of 1 to 5 nm by UV light irradiation in an oxygen atmosphere, a thermal oxidization method, treatment by ozone water containing hydroxy radical or hydrogen peroxide solution, or the like. In this embodiment mode, Ni is used as an element for promoting crystallization. An aqueous solution containing 10 ppm of Ni acetate is applied by a spin coating method.

In this embodiment mode, after performing thermal treatment by an RTA method at 650° C. for six minutes, the oxide film formed over the semiconductor film is removed and laser irradiation is applied. The amorphous semiconductor film is crystallized by the aforementioned crystallization treatment to form a crystalline semiconductor film.

In the case of performing crystallization using a metal element, a gettering step is performed for reducing or removing the metal element. In this embodiment mode, the metal element is captured using the amorphous semiconductor film as a gettering sink. First, an oxide film is formed over the crystalline semiconductor film by UV light irradiation in an oxygen atmosphere, thermal oxidation, treatment with ozone water containing hydroxyl radical, treatment with hydrogen peroxide, or the like. In this embodiment mode, after forming the oxide film, the oxide film is formed thicker by performing thermal treatment by an RTA method at 650° C. for six minutes. Further, an amorphous semiconductor film is formed with a thickness of 30 nm by a plasma CVD method (with a condition of this embodiment mode as 350 W and 35 Pa).

After that, thermal treatment is performed at 650° C. for six minutes by an RTA method to reduce or remove the metal element. The thermal treatment may be performed in a nitrogen atmosphere. Then, the amorphous semiconductor film as a gettering sink and an oxide film formed over the amorphous semiconductor film are removed by hydrofluoric acid and the like, thereby a crystalline semiconductor film 102 from which the metal element is reduced or removed can be obtained (see FIG. 6A). In this embodiment mode, the amorphous semiconductor film as a gettering sink is removed by TMAH (Tetramethyl Ammonium Hydroxide).

The semiconductor film formed in this manner may be doped with a slight amount of impurity elements (boron or phosphorus) for controlling a threshold voltage of a thin film transistor. This doping of impurity elements may be performed against an amorphous semiconductor film before crystallization. When the amorphous semiconductor film is doped with impurity elements, the impurities can be activated by thermal treatment for crystallization later. Further, a defect and the like generated at the doping can be improved as well.

Subsequently, the crystalline semiconductor film 102 is patterned using a mask. In this embodiment mode, after removing the oxide film formed over the crystalline semiconductor film 102, an oxide film is newly formed. Then, a photo mask is formed and patterned by a photolithography method, thereby a semiconductor layer 103, a semiconductor layer 104, a semiconductor layer 105, and a semiconductor layer 106 are formed.

An etching process at the patterning may be either plasma etching (dry etching) or wet etching. In the case of processing a large area substrate, plasma etching is more preferable. As an etching gas, a fluorine-based gas such as $CF_4$ and $NF_3$ or a chlorine-based gas such as $Cl_2$ and $BCl_3$ are used, to which an inert gas such as He and Ar may be appropriately added. In the case of employing an etching process by atmospheric pressure electric discharge, local electric discharge can be realized, which does not require a mask layer to be formed over an entire surface of the substrate.

In this embodiment mode, a conductive layer for forming a wiring layer or an electrode layer, a mask layer for forming a predetermined pattern, or the like may be formed by a method where a pattern can be selectively formed, such as a droplet discharge method. In the droplet discharge method (also referred to as an inkjet method according to the system thereof), a predetermined pattern (a conductive layer, an insulating layer, and the like) can be formed by selectively discharging (ejecting) liquid of a composition prepared for a specific purpose. In this case, a process for controlling wettability and adhesion may be performed in a region to be formed thereon. Additionally, a method for transferring or describing a pattern, for example, a printing method (a method for forming a pattern such as a screen printing, and an offset printing) or the like can be used.

In this embodiment mode, a resin material such as an epoxy resin, an acrylic resin, a phenol resin, a novolac resin, a melamine resin, or an urethane resin is used as a mask. Alternatively, the mask may also be made of an organic material such as benzocyclobutene, parylene, flare and polyimide having a light transmitting property; a compound material formed by polymerization of siloxane polymers or the like; a composition material containing a water-soluble homopolymer and a water-soluble copolymer; and the like. In addition, a commercially available resist material containing a photosensitive agent may also be used. For example, it is possible to use a typical positive resist including a novolac resin and a naphthoquinonediazide compound that is a photosensitive agent; a base resin that is a negative resist, diphenylsilanediol, an acid generating material, and the like. The surface tension and the viscosity of any material are appropriately adjusted by controlling the solvent concentration, adding a surfactant, or the like, when a droplet discharge method is used.

A gate insulating layer 107 covering the semiconductor layer 103, the semiconductor layer 104, the semiconductor layer 105, and the semiconductor layer 106 is formed. The gate insulating layer 107 is formed of an insulating film containing silicon with a thickness of 10 to 150 nm by a plasma CVD method or a sputtering method. The gate insulating layer 107 may be formed of a known material such as an oxide material or nitride material of silicon, typified by silicon nitride, silicon oxide, silicon oxynitride, and silicon nitride oxide and may be stacked layers or a single layer. In this embodiment mode, stacked layers of a silicon nitride film, a silicon oxide film, and a silicon nitride film are used for the gate insulating layer. Alternatively, a single layer or stacked layers of two layers of the aforementioned or a silicon oxynitride film may be employed as well. More preferably, a silicon nitride film with a dense film quality is used. A thin silicon oxide film may be formed between the semiconductor layer and the gate insulating layer with a thickness of 1 to 100 nm, preferably 1 to 10 nm, and more preferably 2 to 5 nm. The semiconductor surface of the semiconductor region is oxidized by a GRTA (gas rapid thermal annealing) method, an LRTA (lamp rapid thermal annealing) method, or the like and a thermal oxide film is formed, thereby forming a silicon oxide film with a thin thickness. Note that a rare gas element such as argon may be added to a reactive gas and be mixed into an insulating film to be formed in order to form a dense insulating film having little gate leak current at low film formation temperature.

Subsequently, a first conductive film 108 having a thickness of 20 to 100 nm and a second conductive film 109 having a thickness of 100 to 400 nm, each of which serves as a gate electrode layer are stacked over the gate insulating layer 107 (FIG. 6B). The first conductive film 108 and the second conductive film 109 can be formed by a known method such as a sputtering method, a vapor deposition method, or a CVD method. The first conductive film 108 and the second conductive film 109 may be formed of an element selected from tantalum (Ta), tungsten (W), titanium (Ti), molybdenum (Mo), aluminum (Al), copper (Cu), chromium (Cr), and neodymium (Nd), or an alloy material or compound material having the aforementioned element as a main component. A semiconductor film typified by a polycrystalline silicon film that is doped with an impurity element such as phosphorus or an AgPdCu alloy may be used as the first conductive film 108 and the second conductive film 109. The conductive film is not limited to the two-layer structure, and, for example, may have a three-layer structure in which a tungsten film with a thickness of 50 nm, an alloy film of aluminum and silicon (Al—Si) with a thickness of 500 nm, and a titanium nitride film with a thickness of 30 nm are sequentially stacked. In the case of the three-layer structure, tungsten nitride may be used in stead of tungsten of the first conductive film; an alloy film of aluminum and titanium (Al—Ti) may be used in stead of an alloy film of aluminum and silicon (Al—Si) of the second conductive film; or a titanium film may be used in stead of a titanium nitride film of a third conductive film. Further, a single-layer structure may be also used. In this embodiment mode, tantalum nitride (TaN) with a thickness of 30 nm is used for the first conductive film 108 and tungsten (W) with a thickness of 370 nm is used for the second conductive film 109.

Then, a mask 110a, a mask 110b, a mask 110c, a mask 110d, a mask 110e, and a mask 110f using a resist is formed by a photolithography method and the first conductive film 108 and the second conductive film 109 are patterned to form a first gate electrode layer 121, a first gate electrode layer 122, a conductive layer 123, a first gate electrode layer 124, a first gate electrode layer 125, and a first gate electrode layer 126, and then a conductive layer 111, a conductive layer 112, a conductive layer 113, a conductive layer 114, a conductive layer 115, and a conductive layer 116 are formed (see FIG. 6C). The first gate electrode layer 121, the first gate electrode layer 122, the conductive layer 123, the first gate electrode layer 124, the first gate electrode layer 125, and the first gate electrode layer 126, and then the conductive layer 111, the conductive layer 112, the conductive layer 113, the conductive layer 114, the conductive layer 115, and the conductive layer 116 can be etched to have a desired tapered shape by appropriately adjusting an etching condition (electric power applied to a coil-shaped electrode layer, electric power applied to an electrode layer on a substrate side, electrode temperature on a substrate side, or the like) by an ICP (Inductively Coupled Plasma) etching method. Further, an angle and the like of the tapered shape can be controlled by the shapes of the mask 110a, the mask 110b, the mask 110c, the mask 110d, the mask 110e, and the mask 110f. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. In this embodiment mode, the second conductive film 109 is etched using an etching gas containing $CF_4$, $Cl_2$, and $O_2$ and then the first conductive film 108 is continuously etched using an etching gas containing $CF_4$ and $Cl_2$.

Subsequently, the conductive layer 111, the conductive layer 112, the conductive layer 113, the conductive layer 114, the conductive layer 115, and the conductive layer 116 are patterned using the mask 110a, the mask 110b, the mask 110c, the mask 110d, the mask 110e, and the mask 110f. At this time, the conductive layer is etched with an etching condition of high selection ratio toward the second conductive film 109 which forms the conductive layer and the first conductive film 108 which forms the first gate electrode layer. By this etching, the conductive layer 111, the conductive layer 112, the conductive layer 113, the conductive layer 114, the conductive layer 115, and the conductive layer 116 are etched to form a second gate electrode layer 131, a second gate electrode layer 132, a conductive layer 133, a second gate electrode layer 134, a second gate electrode layer 135, and a second gate electrode layer 136. In this embodiment mode, the conductive layer 163 has a tapered shape of which tapered angle is larger than that of the first gate electrode layer 121, the first gate electrode layer 122, the conductive layer 123, the first gate electrode layer 124, the first gate electrode layer 125, and the first gate electrode layer 126. It is to be noted that the tapered angle is an angle of a side surface relatively to the surface of the first gate electrode layer, the second gate electrode layer, and the conductive layer. Accordingly, when the tapered angle is increased to 90°, the conductive layer has a perpendicular side and no tapered shape. In this embodiment mode, the second gate electrode is formed using an etching gas of $Cl_2$, $SF_6$, and $O_2$ In this embodiment mode, each of the first gate electrode layer, the conductive layer, and the second gate electrode layer is formed to have a tapered shape, therefore, both of the two gate electrode layers have tapered shapes. However, the invention is not limited to this and one of the gate electrode layers may have a tapered shape while the other has a perpendicular side formed by anisotropic etching. As described in this embodiment mode, the tapered angles may be different or the same between the stacked gate electrode layers. With a tapered shape, coverage of a film to be stacked thereover is improved and a defect is reduced, which leads to improve reliability.

By the aforementioned steps, a gate electrode layer 117 formed of the first gate electrode layer 121 and the second gate electrode layer 131, and a gate electrode layer 118 formed of the first gate electrode layer 122 and the second gate electrode layer 132 can be formed in a peripheral driver circuit region 204, a gate electrode layer 127 formed of the first gate electrode layer 124 and the second gate electrode layer 134, a gate electrode layer 128 formed of the first gate electrode layer 125 and the second gate electrode layer 135, a gate electrode layer 129 formed of the first gate electrode layer 126 and the second gate electrode layer 136 can be formed in a pixel region 206, and a conductive layer 130 formed of the conductive layer 123 and the conductive layer 133 can be formed in a connecting region 205 (see FIG. 6D). In this embodiment mode, the gate electrode layers are formed by dry etching, however, wet etching may be employed as well.

The gate insulating layer 107 may be etched to some extent and reduced in thickness by an etching step for forming the gate electrode layers.

By forming a width of the gate electrode layer thin, a thin film transistor capable of high speed operation can be formed. Two methods for forming a width of the gate electrode layer in a channel direction thin are described below.

A first method is to form a mask for a gate electrode layer, slim the mask in a width direction by etching, ashing and the like, and then forming a mask with a thinner width. By using a mask with a thinner width, the gate electrode layer can be formed in a shape with a thinner width.

A second method is to form a normal mask and then form a gate electrode layer using the mask. Then, the gate electrode layer is etched in the side in a width direction to be thinned. Accordingly, a gate electrode layer with a thinner width can be formed. By the aforementioned steps, a thin film transistor with a short channel length can be formed, which can realize a thin film transistor capable of high speed operation.

Next, impurity element 151 which imparts n-type conductivity is added using the gate electrode layer 117, the gate electrode layer 118, the gate electrode layer 127, the gate electrode layer 128, the gate electrode layer 129, and the conductive layer 130 as masks to form a first n-type impurity region 140a, a first n-type impurity region 140b, a first n-type impurity region 141a, a first n-type impurity region 141b, a first n-type impurity region 142a, a first n-type impurity region 142b, a first n-type impurity region 142c, a first n-type impurity region 143a, and a first n-type impurity region 143b (see FIG. 7A). In this embodiment mode, doping is performed by using phosphine ($PH_3$) ($PH_3$ is diluted with hydrogen ($H_2$) as the doping gas, the composition rate of $PH_3$ is 5% in the gas.) as a doping gas containing an impurity element at a gas flow rate of 80 sccm, a beam current of 54 μA/cm, an acceleration voltage of 50 kV, and a dosage of $7.0\times10^{13}$ ions/cm². Here, doping is performed so that the impurity element which imparts n-type conductivity is contained at a concentration of about $1\times10^{17}$ to $5\times10^{18}$/cm³ in the first n-type impurity region 140a, the first n-type impurity region 140b, the first n-type impurity region 141a, the first n-type impurity region 141b, the first n-type impurity region 142a, the first n-type impurity region 142b, the first n-type impurity region 142c, the first n-type impurity region 143a, and the first n-type impurity region 143b. In this embodiment mode, phosphorus (P) is used as the impurity element which imparts n-type conductivity.

In this embodiment mode, the impurity regions of the regions overlapping the gate electrode layers with the gate insulating layer interposed therebetween are denoted as Lov regions while the impurity regions of the regions which do not overlap the gate electrode layers with the gate insulating layer interposed therebetween are denoted as Loff regions. In FIG. 7A, the impurity regions are shown by hatching and blank spaces. This does not mean that the blank spaces are not added impurity elements, but shows that the concentration distribution of the impurity element in this region reflects the mask and the doping condition. Note that this is the same as in other diagrams of this specification.

Subsequently, masks 153a, 153b, 153c, and 153d which cover the semiconductor layer 103 and a portion of the semiconductor layer 105 and the semiconductor layer 106 are formed. By using the masks 153a, 153b, 153c, 153d, and the second gate electrode layer 133 as masks, an impurity element 152 which imparts n-type conductivity is added to form a second n-type impurity region 144a, a second n-type impurity region 144b, a third n-type impurity region 145a, a third n-type impurity region 145b, a second n-type impurity region 147a, a second n-type impurity region 147b, a second n-type impurity region 147c, a third n-type impurity region 148a, a third n-type impurity region 148b, a third n-type impurity region 148c, and a third n-type impurity region 148d are formed (see FIG. 7B). In this embodiment mode, doping is performed using $PH_3$ ($PH_3$ is diluted with hydrogen ($H_2$) as the doping gas, the composition rate of $PH_3$ is 5% in the gas.) as a doping gas containing an impurity element at a gas flow rate of 80 sccm, a beam current of 540 μA/cm, an acceleration voltage of 70 kV, and a dosage of $5.0\times10^{15}$ ions/cm². Here, doping is performed so that each of the second n-type impurity regions 144a and 144b contains the impurity element at a concentration of about $5\times10^{19}$ to $5\times10^{20}$/cm³. The third n-type impurity regions 145a and 145b are formed to contain at an approximately the same concentration of the impurity element which imparts n-type conductivity as the third n-type impurity regions 148a, 148b, 148c, and 148d or a little higher concentration. Further, a channel forming region 146 is formed in the semiconductor layer 104, and channel forming regions 149a and 149b are formed in the semiconductor layer 105.

The second n-type impurity regions 144a, 144b, 147a, 147b, and 147c are high concentration n-type impurity regions which function as sources and drains. On the other hand, the third n-type impurity regions 145a, 145b, 148a, 148b, 148c, and 148d are low concentration impurity regions which function as LDD (Lightly Doped Drain) regions. The n-type impurity regions 145a and 145b overlapped with the first gate electrode layer 122 with the gate insulating layer 107 interposed therebetween are Lov regions which can alleviate an electric field around a drain and suppress a degradation of an on current due to a hot carrier. As a result, a thin film transistor capable of high speed operation can be formed. On the other hand, the third n-type impurity regions 148a, 148b, 148c, and 148d are formed in Loff regions which are not overlapped with the gate electrode layers 127 and 128, therefore, an electric field around a drain can be alleviated and degradation due to a hot carrier injection can be prevented as well as reduce an off current. As a result, a semiconductor device with high reliability and low power consumption can be formed.

Subsequently, the masks 153a, 153b, 153c, and 153d are removed and masks 155a and 155b to cover the semiconductor layers 104 and 105 are formed. By adding an impurity element 154 which impart p-type conductivity using the masks 155a and 155b, and the gate electrode layers 117 and 129 as masks, first p-type impurity regions 160a, 160b, 163a, 163b, second p-type impurity regions 161a, 161b, 164a, and 164b are formed (see FIG. 7C). In this embodiment mode, boron (B) is used as an impurity element, therefore, doping is performed using diborane ($B_2H_6$) ($B_2H_6$ is diluted with hydrogen ($H_2$) as the doping gas, the composition rate of $B_2H_6$ is 15% in the gas.) as a doping gas containing an impurity element at a gas flow rate of 70 sccm, a beam current of 180 μA/cm, an acceleration voltage of 80 kV, and a dosage of $2.0 \times 10^{15}$ ions/cm$^2$. Here, doping is performed so that the first p-type impurity regions 160a, 160b, 163a, 163b, the second p-type impurity regions 161a, 161b, 164a, and 164b contains the impurity element which imparts p-type conductivity at a concentration of about $1 \times 10^{20}$ to $5 \times 10^{21}$/cm$^3$. In this embodiment mode, the second p-type impurity regions 161a, 161b, 164a, and 164b are formed by reflecting the shapes of the gate electrode layers 117 and 129 to contain a lower concentration of impurity element than the first p-type impurity regions 160a, 160b, 163a, and 163b in a self-aligned manner. Further, a channel forming region 162 is formed in the semiconductor layer 103 and a channel forming region 165 is formed in the semiconductor layer 106.

The second n-type impurity regions 144a, 144b, 147a, 147b, and 147c are high concentration n-type impurity regions which function as sources and drains. On the other hand, the second p-type impurity regions 161a, 161b, 164a, and 164b are low concentration impurity regions which function as LDD (Lightly Doped Drain) regions. The second p-type impurity regions 161a, 161b, 164a, and 164b overlapped with the first gate electrode layers 121 and 126 with the gate insulating layer 107 interposed therebetween are Lov regions which can alleviate an electric field around a drain and suppress a degradation of an on current due to a hot carrier.

The masks 155a and 155b are removed by $O_2$ ashing or using a resist peeling solution, thereby the oxide film is also removed. After that, an insulating film, namely a sidewall may be formed so as to cover sides of the gate electrode layers. The sidewall may be formed of an insulating film containing silicon by a plasma CD method and a low pressure CVD (LPCVD) method.

In order to activate the impurity element, thermal treatment, strong light irradiation, or laser light irradiation may be performed. At the same time as the activation, a plasma damage to the gate insulating layer and to an interface between the gate insulating layer and the semiconductor layer can be recovered.

Subsequently, the interlayer insulating layer which covers the gate insulating layer and the gate electrode layer is formed. In this embodiment mode, a stacked-layer structure of the insulating films 167 and 168 is employed (see FIG. 8A). A silicon nitride oxide film is formed as the insulating film 167 with a thickness of 200 nm and a silicon oxynitride film is formed as the insulating film 168 with a thickness of 800 nm to form a stacked-layer structure. Further, a stacked-layer structure of three layers may be employed by forming a silicon oxynitride film with a thickness of 30 nm, a silicon nitride oxide film with a thickness of 140 nm, and a silicon oxynitride film with a thickness of 800 nm. In this embodiment mode, the insulating films 167 and 168 are continuously formed by a plasma CVD method similarly to the base film. The insulating films 167 and 168 are not limited to silicon nitride films and may be a silicon nitride oxide film, a silicon oxynitride film, and a silicon oxide film formed by a plasma CVD method. Alternatively, a single layer structure or a stacked-layer structure of three or more layers of an insulating film containing other silicon may be employed as well.

Further, thermal treatment is performed in a nitrogen atmosphere at 300 to 550° C. for 1 to 12 hours, thereby the semiconductor layer is hydrogenated. Preferably, this step is performed at 400 to 500° C. According to this step, dangling bonds in the semiconductor layer can be terminated by hydrogen contained in the insulating film 167 as an interlayer insulating layer. In this embodiment mode, thermal treatment is performed at 410° C.

The insulating films 167 and 168 may be formed of a material selected from aluminum nitride (AlN), aluminum oxynitride (AlON), aluminum nitride oxide containing more nitrogen than oxygen (AlNO), aluminum oxide, diamond-like carbon (DLC), a carbon nitride film (CN) and other substance containing an inorganic insulating material. Further, a siloxane material may be used as well. It is to be noted that a siloxane material corresponds to a resin containing a Si—O—Si bond. Siloxane has a skeleton of a bond of silicon (Si) and oxygen (O). As a substituent, an organic group containing at least hydrogen (for example, an alkyl group and an aromatic carbon hydride) or a fluoro group may be used. Alternatively, an organic group containing at least hydrogen and a fluoro group may be used as a substituent. Further, an organic insulating material may be used such as polyimide, acrylic, polyamide, polyimide amide, resist, benzocyclobutene, or polysilazane. A coated film with a superior planarity formed by a coating method may be used as well.

Subsequently, contact holes (apertures) reaching the semiconductor layer are formed in the insulating films 167 and 168, and the gate insulating layer 107 using a mask of resist. Etching may be performed once or a plurality of times according to a selection ratio of a material to be used. In this embodiment mode, first etching is performed with a condition that a selection ratio can be obtained between the insulating film 167 as a silicon nitride oxide film and the gate insulating layer 107, thereby the insulating film 168 is removed. Then, the insulating film 167 and the gate insulating layer 107 are removed by second etching, apertures reaching the first p-type impurity regions 160a, 160b, 163a and 163b and the second n-type impurity regions 144a, 144b, 147a and 147b as source regions or drain regions, the second n-type impurity regions 144a and 144b, and the second n-type impurity regions 147a, and 147b are formed. In this embodiment mode, the first etching is performed by wet etching while the second etching is performed by dry etching. A fluorine-based solution such as ammonium hydrogen fluoride or a mixture containing ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be appropriately used. Further, an inert gas may be added to an etching gas. As an inert element to be added, one or a plurality of elements selected from He, Ne, Ar, Kr, and Xe can be used.

The conductive film is formed so as to cover the apertures, and the conductive film is etched to form a source electrode layer or a drain electrode layer 169a, a source electrode layer or a drain electrode layer 169b, a source electrode layer or a drain electrode layer 170a, a source electrode layer or a drain electrode layer 170b, a source electrode layer or a drain electrode layer 171a, a source electrode layer or a drain electrode layer 171b, a source electrode layer or a drain electrode layer 172a, a source electrode layer or a drain electrode layer 172b, and a wiring layer 156 which are electrically connected to a portion of each source region or drain region are formed. The source electrode layer or drain electrode layer can be formed by forming a conductive film by a PVD method, a CVD method, a vapor deposition method and the like and then etching the conductive film into a desired shape. Further, a conductive layer can be selectively formed in a predetermined place by a droplet discharge method, a printing method, an electrolytic plating method and the like. Further, a reflow method and a damascene method may be used as well. The source electrode layer or drain electrode layer is formed of a metal selected from Ag, Au, Cu, Ni, Pt, Pd, Ir, Rh, W, Al, Ta, Mo, Cd, Zn, Fe, Ti, Si, Ge, Zr, Ba, and the like, or an alloy or a metal nitride thereof. Further, a stacked-layer structure of these may be used. In this embodiment mode, titanium (Ti) is formed with a thickness of 100 nm, aluminum is formed with a thickness of 700 nm, and titanium (Ti) is formed with a thickness of 100 nm, and then patterned into a desired shape. An aluminum film sandwiched by the titanium films is preferably formed with a thickness of 500 to 2000 nm. A stacked-layer structure of a titanium film (thickness of 100 nm), an aluminum film (thickness of 1500 to 2000 nm), and a titanium film (thickness of 100 nm) may be employed as well.

Figure 8A:
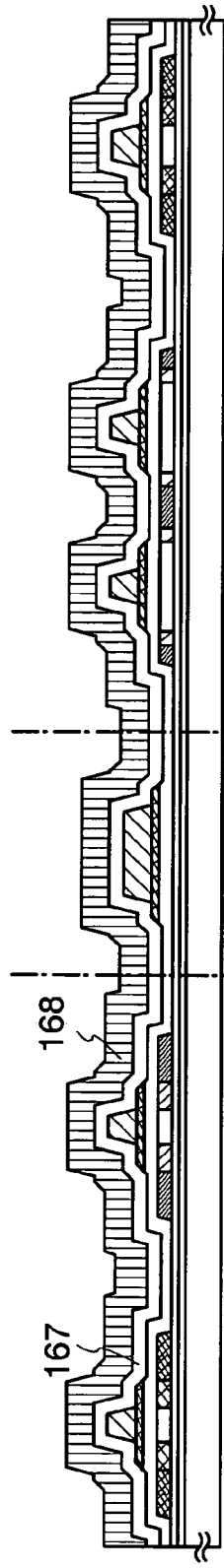
FIGS. 8A and 8B are diagrams showing manufacturing steps of a display device of the invention.
Figure 8B:
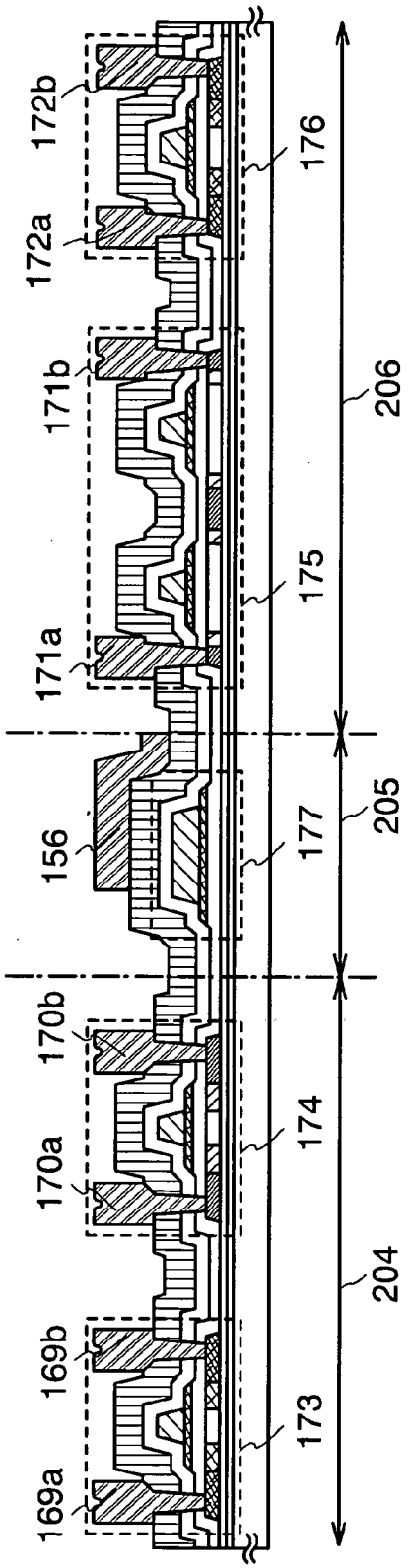

By the aforementioned steps, an active matrix substrate can be formed in which a p-channel thin film transistor 173 having a p-type impurity region in a Lov region and an n-channel thin film transistor 174 having an n-channel impurity region in a Lov region can be formed in the peripheral driver circuit region 204, a conductive layer 177 can be formed in the connecting region, and a multi-channel type n-channel thin film transistor 175 having an n-type impurity region in a Loff region and a p-channel thin film transistor 176 having a p-type impurity region in a Lov region can be formed in the pixel region 206 (see FIG. 8B).

Then, the active matrix substrate can be used for a light emitting device having a self-luminous element, a liquid crystal display device having a liquid crystal element, and other display devices. Moreover, the active matrix substrate can be used for a semiconductor device such as various processors typified by a CPU (Central Processing Unit) and a card which incorporates an ID chip and the like.

The invention is not limited to this embodiment mode and a thin film transistor may have a single gate structure in which one channel forming region is formed, a double gate structure in which two channel forming regions are formed, or a triple gate structure in which three channel forming regions are formed. Further, a thin film transistor in the peripheral driver circuit region may have a single gate structure, a double gate structure, or a triple gate structure.

It is to be noted that the invention is not limited to the manufacturing method of a thin film transistor described in this embodiment mode, but can also be applied to a top gate type (planar type), a bottom gate type (inversely staggered type), or a dual gate type in which two gate electrode layers are arranged at the top and bottom of a channel region with a gate insulating film interposed therebetween, or other structures.

FIGS. 9A and 9B show manufacturing steps of a display device, in which a separating region 201 for separating by scribing, an external terminal connecting region 202 to which an FPC is attached, a wiring region 203 as a lead wiring region of a peripheral portion, a peripheral driver circuit region 204, a connecting region 205, and a pixel region 206 are provided. The wiring region 203 is provided with a wiring 179a and a wiring 179b, and the external terminal connecting region 202 is provided with a terminal electrode layer 178 to be connected to an external terminal.

Subsequently, a first electrode layer 395 (also referred to as a pixel electrode layer) is formed in contact with the source electrode layer or drain electrode layer 172b. The first electrode layer functions as an anode or cathode, and may be formed of a film containing as a main component an element selected from Ti, TiN, $TiSi_xN_y$, Ni, W, $WSi_x$, $WN_x$, $WSi_xN_y$, NbN, Cr, Pt, Zn, Sn, In, or Mo, an alloy material or a compound material containing the aforementioned element, or stacked films thereof with a thickness of 100 to 800 nm.

In this embodiment mode, a light emitting element is used as a display element of which light is extracted from the first electrode layer 395 side, therefore, the first electrode layer 395 transmits light. A light transmissive conductive film is formed as the first electrode layer 395 and then etched into a desired shape to form the first electrode layer 395. The first electrode layer 395 used in the invention may be formed of indium tin oxide (also referred to as indium tin oxide containing silicon oxide and hereinafter referred to as "ITSO"), zinc oxide, tin oxide, indium oxide and the like. Besides, a light transmissive conductive film such as indium zinc oxide alloy obtained by mixing zinc oxide (ZnO) in indium oxide by 2 to 20% and the like may be used. As the first electrode layer 395, a titanium nitride film or a titanium film may be used as well as the aforementioned light transmissive film. In this case, after forming a light transmissive film, a titanium nitride film or a titanium film is formed with a thickness thin enough to transmit light (preferably about 5 to 30 nm). In this embodiment mode, ITSO using indium tin oxide and silicon oxide as the first conductive layer 395 is used. In this embodiment mode, an ITSO film is formed using a target obtained by mixing silicon oxide ($SiO_2$) in indium tin oxide by 1 to 10% at an Ar gas flow rate of 120 sccm, an $O_2$ gas flow rate of 5 sccm, a pressure of 0.25 Pa, a power of 3.2 kW by sputtering with a thickness of 395 nm. The first electrode layer 395 may be swabbed and polished by a polyvinylalcohol-based porous media by a CMP method. After the polish by a CMP method, the surface of the first electrode layer 395 may be applied UV light irradiation, oxygen plasma treatment and the like.

After forming the first electrode layer 395, thermal treatment may be performed. Accordingly, moisture contained in the first electrode layer 395 is discharged. Therefore, the first electrode layer 395 does not generate degasification and the like, and a light emitting material is not deteriorated even when a light emitting material which is easily deteriorated by moisture is formed over the first electrode layer, which leads to manufacture a display device with high reliability. In this embodiment mode, the first electrode layer 395 formed of ITSO is not crystallized by baking unlike ITO (indium tin oxide alloy) and remains in an amorphous state. Therefore, ITSO has higher planarity than ITO and does not easily generate a short-circuit with a cathode even when a layer containing an organic compound is thin.

Subsequently, an insulator (insulating layer) 186 (also referred to as a bank, a partition, and the like) to cover an end portion of the first electrode layer 395, and the source electrode layers or drain electrode layers is formed (see FIG. 9B). Further, insulators 187a and 187b are formed in an external terminal connecting region 202 by the same step.

In order to perform a full color display, electroluminescent layers for emitting light of RGB have to be formed separately when forming an electroluminescent layer over the first electrode layer. Therefore, when forming an electroluminescent layer of another color, the pixel electrode layer (first electrode layer) is covered with a mask. The mask may be a film formed of a metal material and the like. At this time, even though the mask is provided over the insulator 186 as a partition and supported thereby, the mask may contact the pixel electrode layer by a deflection and a twist of the mask and may cause a crack in the pixel electrode layer. When a defect occurs in shape of the pixel electrode layer by a crack and the like, a light emission defect, a display defect and the like are caused which may decrease image quality. Therefore, reliability and performance may also be degraded.

According to the invention, a spacer 199 is formed with an equivalent thickness to that of the insulator 186 over the first electrode layer 395 as a pixel electrode layer. The insulator 186 formed as a partition in the periphery of the pixel electrode layer is formed to have a projection and depression affected by a height of an object formed in a forming region of the insulator 186. Accordingly, a height from the surface of the first electrode layer 395 as a pixel electrode layer to the surface of the insulator 186 is formed high, thereby the top surface of the insulator 186 can function as a spacer A mask 763 used when depositing an electroluminescent layer is supported by a spacer 767 and an insulator covering the periphery of the pixel electrode layer as a partition, therefore, it does not contact the first electrode layer. Accordingly, a defect in shape of the first electrode layer is prevented and a display device with high reliability and image quality can be formed without the first electrode layer generating a light emission defect and a display defect.

In this embodiment mode, the spacer 199 is formed of the same material and by the same step as the insulator 186 as a partition, however, another step may be employed as well. The shape and size of the spacer are not particularly limited, but the size, aperture ratio and the like of the pixel region are only required to be considered. In this embodiment mode, the spacer has columnar shape of which top portion has a round shape like a semi-sphere as shown in FIG. 9B, of which height is 1 to 2 μm (preferably 1 to 1.5 μm).

An example of the shape of a spacer is described with reference to FIGS. 24A to 25D. As shown in FIGS. 24A to 25D, an insulator (insulating layer) as a partition and a spacer may be continuously connected. Each of FIGS. 25A, 25C, 24A and 24C shows a top plan view of a pixel region. FIGS. 25B, 25D, 24B and 24D are cross sectional diagrams along lines X1-Y1, X2-Y2, X3-Y3, and X4-Y4 of FIGS. 25A, 25C, 24A and 24C respectively. In FIGS. 25A and 25B, a first electrode layer 607 as a pixel electrode layer is formed over a substrate 600, base films 601a and 601b, a gate insulating layer 602, insulating films 603 and 604. An insulator 608 as a partition is formed to cover an edge portion of the first electrode layer 607, and a spacer 609 is formed of the same material and by the same step as the insulator 608.

In FIGS. 25A and 25B, the spacer 609 is formed to be in contact with the insulator 608. The spacer 609 is continuously formed so as to cross over the first electrode layer 607 diagonally. By continuously forming the spacer 609 in this manner, a mask is always supported by the spacer 609 even when being moved, thus it can be prevented that the mask contacts the first electrode layer 607 and a defect in shape of the first electrode layer 607 is generated.

Figure 25A:
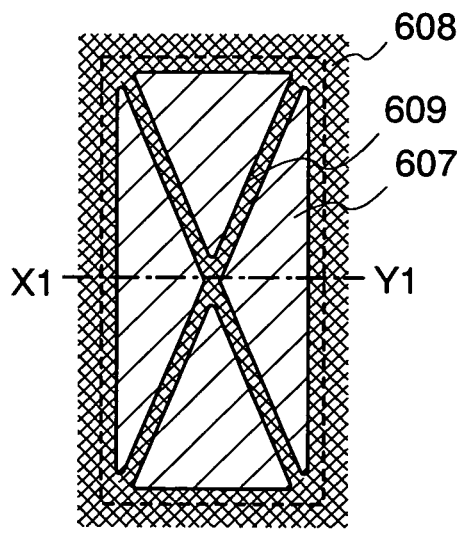
FIGS. 25A to 25D are diagrams showing a display device of the invention.
Figure 25B:
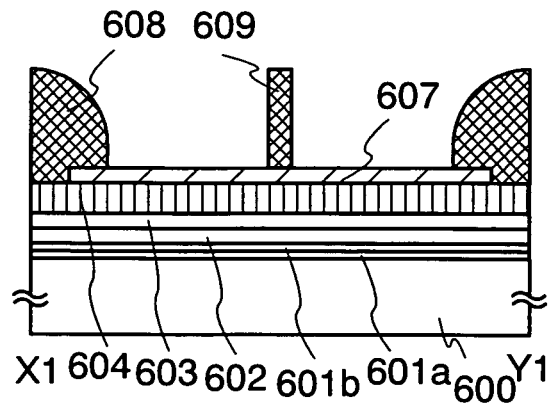
Figure 25C:
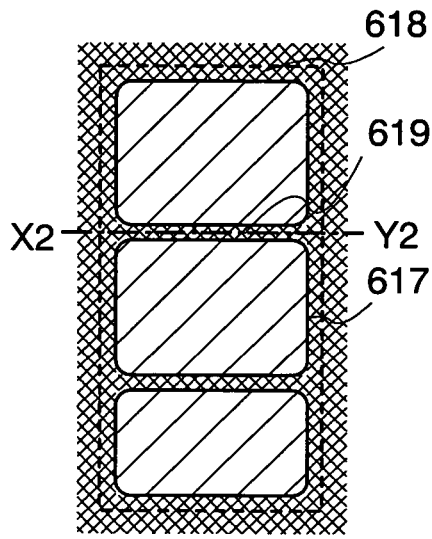
Figure 25D:
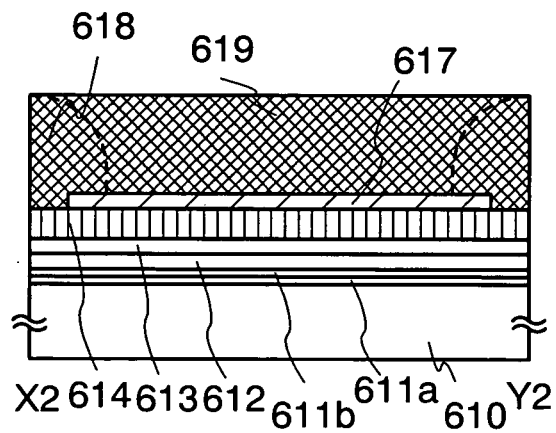

In FIGS. 25C and 25D, a first electrode layer 617 as a pixel electrode layer is formed over a substrate 610, base films 611a and 611b, a gate insulating layer 612, and insulating films 613 and 614. An insulator 618 as a partition is formed to cover an edge portion of the first electrode layer 617, and a spacer 619 is formed of the same material and by the same step as the insulator 618.

In FIGS. 25C and 25D, the spacer 619 is formed to be in contact with the insulator 618. The spacer 619 is continuously formed at two places so as to cross over the first electrode layer 617 in a short side direction thereof. By continuously forming the spacer 619 at a plurality of places in this manner, a mask is always supported by the spacer 619 even when being moved, thus it can be prevented that the mask contacts the first electrode layer 617 and a defect in shape of the first electrode layer 617 is generated.

Figure 24A:
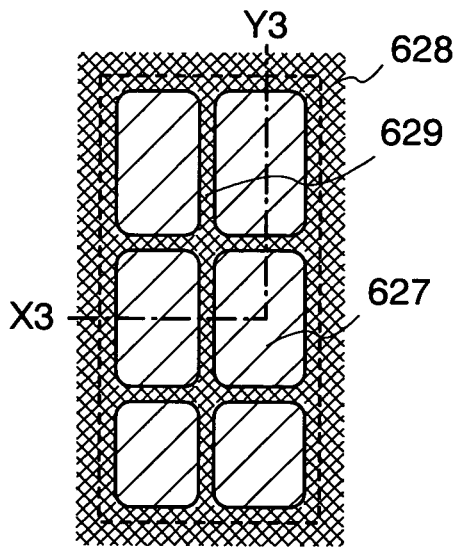
FIGS. 24A to 24D are diagrams showing a display device of the invention.
Figure 24B:
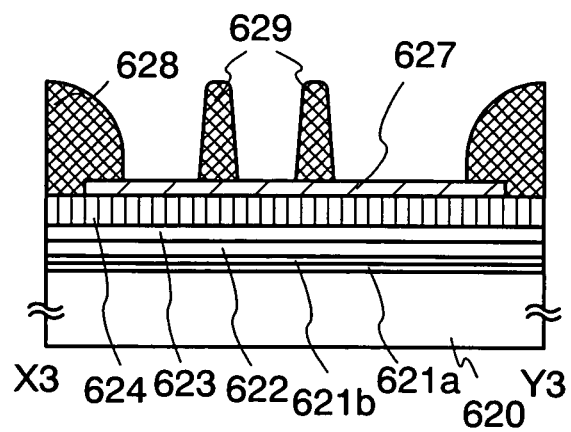

In FIGS. 24A and 24B, a first electrode layer 627 as a pixel electrode layer is formed over a substrate 620, base films 621a and 621b, a gate insulating layer 622, and insulating films 622, 623, and 624. An insulator 628 as a partition is formed to cover an edge portion of the first electrode layer 627, and a spacer 629 is formed of the same material and by the same step as the insulator 628.

In FIGS. 24A and 24B, the spacer 629 is formed to be in contact with the insulator 628. The spacer 629 is continuously formed so as to cross over the first electrode layer 627 in a long side direction and a short side direction thereof in a lattice shape. By continuously forming the spacer 629 in a lattice shape in this manner, a mask is always supported by the spacer 629 even when being moved, thus it can be prevented that the mask contacts the first electrode layer 627 and a defect in shape of the first electrode layer 627 is generated.

Figure 24C:
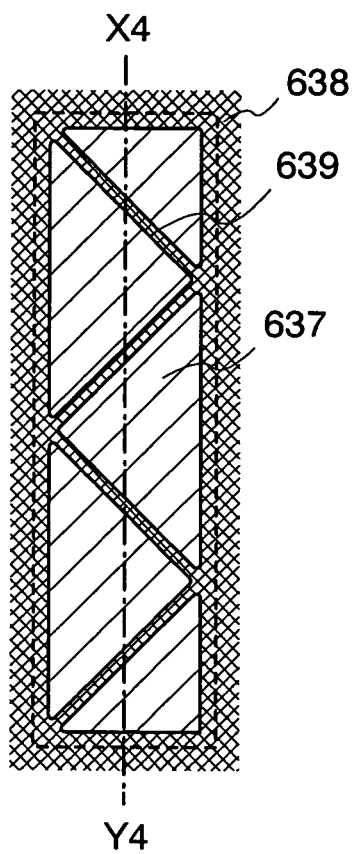
Figure 24D:
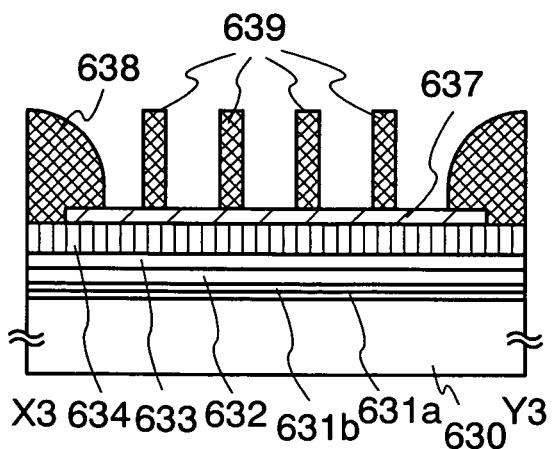

In FIGS. 24C and 24D, a first electrode layer 637 as a pixel electrode layer is formed over a substrate 630, base films 631a and 631b, a gate insulating layer 632, and insulating films 633 and 634. An insulator 638 as a partition is formed to cover an edge portion of the first electrode layer 637, and a spacer 639 is formed of the same material and by the same step as the insulator 638.

In FIGS. 24C and 24D, a spacer 639 is formed to be in contact with the insulator 638. The spacer 639 is formed so as to obliquely cross over the first electrode layer 637 a plurality of times relatively to an interface with the insulator 638. In this embodiment mode, an angle between a short axis of the interface between the first electrode layer 637 and the insulator and the spacer 639 is 45°. By continuously forming the spacer 639 in this manner, a mask is always supported by the spacer 639 even when being moved, thus it can be prevented that the mask contacts the first electrode layer 637 and a defect in shape of the first electrode layer 637 is generated.

As shown in FIG. 24B, the spacer 629 is formed to have a tapered shape. The spacer may be in an approximate cube as shown in FIGS. 25B and 24D and may also be in various shapes such as a columnar shape, a prism, a cone, a pyramid, and a tapered shape.

The spacer is formed in contact with the insulator as a partition in FIGS. 24A to 25D, however, it may be separated from the insulator.

The spacer may be formed of an inorganic insulating material such as silicon oxide, silicon nitride, silicon oxynitride, aluminum oxide, aluminum nitride, and aluminum oxynitride, acrylic acid, methacrylic acid, and a derivative thereof, or heat resistant high molecular substance such as polyimide, aromatic polyamide, and polybenzoimidazole, or a siloxane resin material. In this embodiment mode, acrylic is used for the spacer 199.

In this embodiment mode, acrylic is used for the insulator 186. Further, by forming the insulating film 186 using same material as the insulating film 168 and the same step, manufacturing cost can be reduced. Moreover, cost can be reduced by using a deposition apparatus, an etching apparatus and the like in common.

The insulator 186 may be formed by using an insulating material such as an inorganic insulating material such as silicon oxide, silicon nitride, silicon oxynitride, aluminum oxide, aluminum nitride, or aluminum oxynitride, acrylic acid, methacrylic acid, a derivative thereof, a heat-resistant high molecular weight material such as polyimide, aromatic polyamide, or polybenzimidazole, or siloxane material. Alternatively, the insulator 186 may be formed by using a photosensitive or non-photosensitive material such as acrylic or polyimide. The insulator 186 preferably has a side face with such a shape that a curvature radius continuously changes. Accordingly, coverage of an electroluminescent layer 188 and a second electrode layer 189 formed thereover is improved.

In the connecting region 205, a wiring layer formed of the same material by the same step as the second electrode layer is electrically connected to the wiring layer 156. In this embodiment mode, the second electrode layer 189 is electrically connected to the wiring layer 156 directly, however, another wiring may be interposed therebetween.

The insulator 186 and the spacer 199 can be formed by dipping, spray application, a doctor knife, a roll coater, a curtain coater, a knife coater, a CVD method, a vapor deposition method and the like. The insulator 186 and the spacer 199 may be formed by a droplet discharge method. In the case of employing the droplet discharge method, a material liquid can be saved. Further, a method for transferring or drawing a pattern like the droplet discharge method, for example a printing method (a method for forming a pattern such as a screen printing and an offset printing) and the like can also be used.

After forming the insulator 186 and the spacer 199, the surfaces thereof may be planarized by pressing. As a method for pressing, a roller type press may be scanned over the surface to planarize the projection and depression, or the surface may be perpendicularly pressed by a plane board type press. In pressing, thermal step may be performed. Further, the surface may be softened or melted by a solvent and the like and the projection and depression of the surface may be removed by an air knife. Furthermore, a CMP method may be employed for polishing the surface.

In the case of forming the spacer 199 using a different material and steps than that of the insulator 186, a spacer having different shape and thickness than the insulator 186 can be freely formed. In this embodiment mode, a plurality of the spacer 199 may be provided, thereby a mask can be provided more stably by being supported by more spacers.

Further, in order to improve the reliability, it is preferable to perform degasification of the substrate by vacuum heating before forming the electroluminescent layer (layer containing an organic compound) 188. For example, it is preferable to perform thermal treatment for removing gas contained in the substrate in a low pressure atmosphere or an inert gas atmosphere at 200 to 400° C. or preferably 250 to 350° C. Further, it is preferable to form the electroluminescent layer 188 by a vacuum vapor deposition method or a droplet discharge method under a reduced pressure without exposing the substrate to air. By this thermal treatment, moisture contained or attached to a conductive film to be the first electrode layer or an insulating layer (partition) can be discharged. This thermal treatment can be combined with a prior thermal step as long as the substrate can be transferred in a vacuum chamber without breaking the vacuum. Therefore, the prior thermal treatment is only required to be performed once after forming an insulating layer (partition). Here, by forming the interlayer insulating film and insulating layer (partition) using a highly heat resistant substance, thermal treatment step can be sufficiently performed for improving the reliability.

Figure 18A:
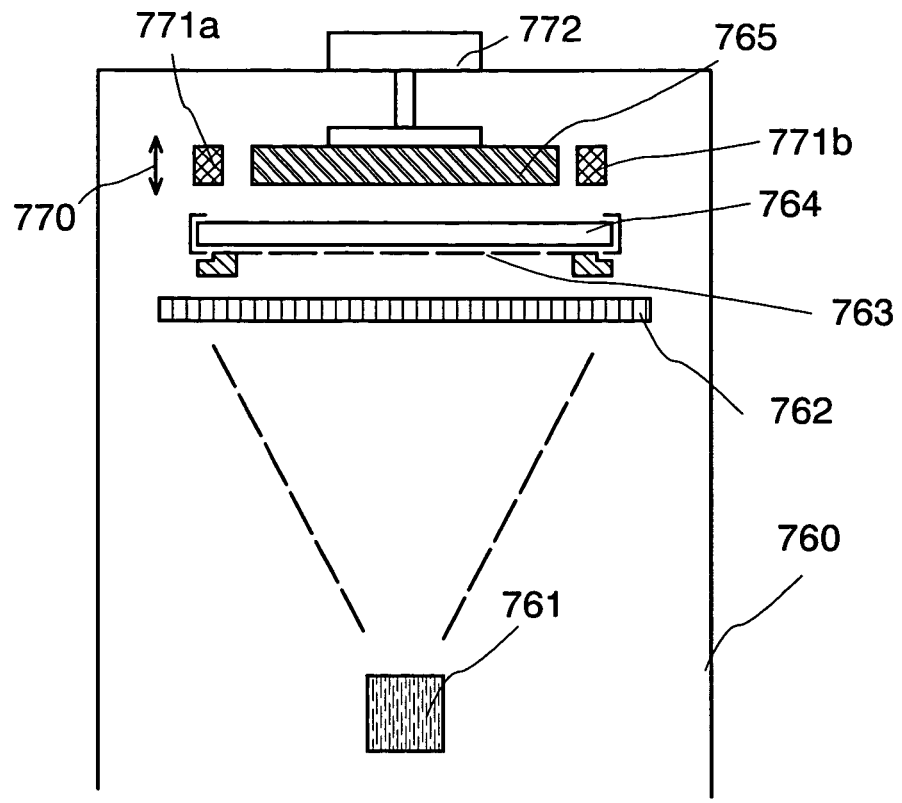
FIGS. 18A and 18B are diagrams showing manufacturing steps of a display device of the invention.
Figure 18B:
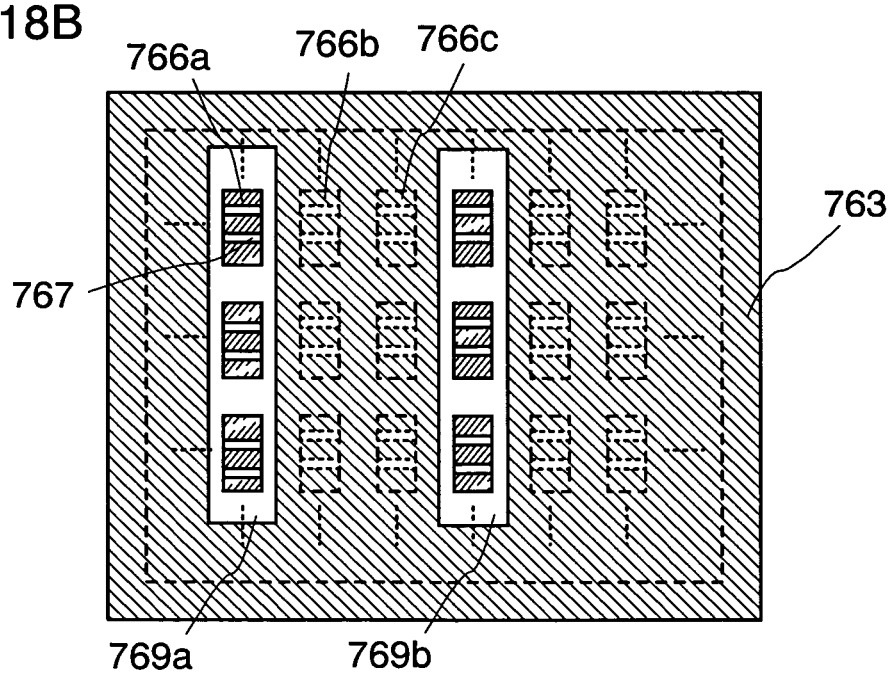

The electroluminescent layer 188 is formed over the first electrode layer 395. It is to be noted that only one pixel is shown in FIG. 1, however, electroluminescent layers corresponding to R (red), G (green), and B (blue) are formed separately in this embodiment mode. In this embodiment mode, each of FIGS. 18A and 18B shows a step of selectively forming the materials which exhibit the light emission of red (R), green (G), and blue (B) as the electroluminescent layer 188 by a vapor deposition method using a vapor deposition mask. FIGS. 18A and 18B both show a step of forming a material which exhibits red light emission. In this embodiment mode, the each color of material is formed using different vapor deposition apparatuses or a vapor deposition masks, however, the light emission materials of three colors may be formed in the same chamber by moving one mask.

FIG. 18A is a schematic diagram showing a vapor deposition step and FIG. 18B is a diagram showing an element substrate and a vapor deposition mask seen from a vapor deposition source 761 side. As shown in FIG. 18A, a magnetic body 765 for controlling the position of a mask and detaching and attaching the mask to an element substrate 764, the element substrate 764, a mask 763, a shutter 762, and a vapor deposition source 761 are provided in a chamber 760 of a vapor deposition apparatus. The magnetic body 765 is moved in a direction of an arrow 770 by a control apparatus 772, and cameras 771a and 771b are used to control an alignment of the element substrate 764 and the mask 763. Besides, a heater for heating the vapor deposition source, a quartz oscillator for controlling a film thickness, a control apparatus for controlling the temperature and position at each portion, and the like are provided. The element substrate 764 is provided with an element side down relatively to the vapor deposition source 761, and the mask 763 is provided close to the element substrate 764 and the shutter 762 for controlling the start and finish of vapor deposition is provided between the mask 763 and the vapor deposition source 761 relatively to the vapor deposition source 761 side. The mask 763 is formed of a metal material and has a magnetic property, therefore, the position of the mask 763 in the direction of the arrow 770 is controlled by the magnetic body 765 formed of a magnetic material.

FIG. 18B shows the mask 763 and the element substrate 764 seen from the vapor deposition source 761 side. The mask 763 is closely attached to the element side of the element substrate 764 by the magnetic force of the magnetic body 765. Further, an alignment of each pixel may be any one of a stripe arrangement in which pixels corresponding to red, green, and blue are arranged in stripe, a delta arrangement in which the pixels are arranged so as to be shifted a half pitch per one line, and a mosaic arrangement in which sub-pixels corresponding to red, green, and blue are arranged obliquely. The stripe arrangement is suitable for displaying a line, a figure, text, and the like, therefore, it is favorably applied to a monitor. Further, the mosaic arrangement can provide a more natural image than the stripe arrangement, therefore, it is favorably applied to a television device and the like. Furthermore, the delta arrangement can also provide a natural image, therefore, it is favorably applied to a television device and the like.

In this embodiment mode, the stripe arrangement is employed for the arrangement of pixels. As shown in FIG. 18B, a slit type mask having a slit shape aperture is employed for the mask 763 having apertures 769a and 769b. With the slit type mask, pixels which emit the same color can be all formed at the same time for each color, thereby high productivity can be achieved. Other than the slit type, a slot type mask having a slot shape aperture for every pixel may be used instead of the slit type mask having a continuous aperture. The slot type mask sometimes requires a plurality of times (twice or more) of vapor depositions for each color in the pixels of the stripe arrangement, however, the slot type mask is suitable for the delta arrangement in which pixels are not arranged linearly, and is highly rigid as one aperture is small.

The element substrate 764 includes a pixel electrode layer 766a to be a pixel for displaying red color, a pixel electrode layer 766b to be a pixel for displaying green color, and a pixel electrode layer 766c to be a pixel for displaying blue color. FIGS. 18A and 18B show the case of forming a light emission material for red color, therefore, the mask 763 is provided so that the apertures 769a and 769b correspond to the pixel electrode layer for displaying red color.

According to the invention, a spacer is formed over a pixel electrode layer. Accordingly, a spacer 767 is provided over a pixel electrode layer shown in FIG. 18B as well. Further, the insulator formed in the periphery of the pixel electrode layer as a partition is formed at a high position from the surface of the pixel electrode layer due to the electrode layer, the wiring layer, the semiconductor layer and the like formed under the insulator, thereby the insulator can function as a spacer. The mask 763 is supported by an insulator as a partition covering the periphery of the pixel electrode layer, therefore, it can be prevented that the mask 763 contacts the pixel electrode layers 766a, 766b, and 766c even when the mask 763 is not rigid and twist and deflection occur due to a magnetic force, gravitation and the like. Therefore, the pixel electrode layer is not damaged, which can produce favorable light emission and display. Even in the case where a substrate becomes large and high in resolution, and thereby an aperture of a mask becomes large and a covered portion is thinned, which leads to decrease the rigidness of the mask itself and difficulty in accurately controlling the position of the mask, the mask can be supported by the spacer and provided in a desired position. It is advantageous to form a spacer and an insulator over the pixel electrode layer using the same material by the same step in that the number of steps can be reduced and a material can be efficiently used.

The spacer 199 provided over the first electrode layer 395 is not covered by a vapor deposition mask when the electroluminescent layer 188 is formed over the first electrode layer 395, therefore, there is a case where the electroluminescent layer 188 is formed over the surface and periphery of the spacer 199. On the other hand, as the insulator 186 is almost entirely covered by the vapor deposition mask, the electroluminescent layer 188 is formed over a side edge portion in the periphery of the aperture of the vapor deposition mask, and the like.

Subsequently, the second electrode layer 189 formed of a conductive film is provided over the electroluminescent layer 188. As the second electrode layer 189, a material having a low work function (Al, Ag, Li, Ca, or an alloy thereof such as MgAg, MgIn, AlLi, and a compound thereof such as calcium fluoride such as $CaF_2$ or calcium nitride such as $Ca_3N_2$) may be used. In this manner, a light emitting element 190 formed of the first electrode layer 395, the electroluminescent layer 188, and the second electrode layer 189 is formed.

In the display device of this embodiment mode shown in FIG. 5, light emitted from the light emitting element 190 is emitted from the first electrode layer 395 side to transmit in a direction of an arrow in FIG. 5.

It is effective to provide a passivation film 191 so as to cover the second electrode layer 189. The passivation film 191 may be formed of a single layer or stacked layers of an insulating film containing silicon nitride, silicon oxide, silicon oxynitride (SiON), silicon nitride oxide (SiNO), aluminum nitride (AlN), aluminum oxynitride (AlON) aluminum nitride oxide (AlNO) containing more amount of nitrogen than oxygen, aluminum oxide, diamond-like carbon (DLC), or a carbon nitride film (CN). Moreover, a siloxane material may be used as well.

At this time, it is preferable to form a passivation film with favorable coverage, for which a carbon film, particularly a DLC film is effectively used. A DLC film which can be deposited in the temperature range from a room temperature to 100° C. can be easily formed above the electroluminescent layer 188 with low heat resistance. A DLC film can be formed by a plasma CVD method (typically an RF plasma CVD method, a microwave CVD method, an electron cyclotron resonance (ECR) CVD method, a heat filament CVD method and the like), a combustion method, a sputtering method, an ion beam vapor deposition method, a laser vapor deposition method and the like. As a reactive gas, a hydrogen gas and a carbon hydride based gas (for example, $CH_4, C_2H_2, C_6H_6$ and the like) are used to be ionized by glow discharge and the ions are accelerated to impact against a cathode to which a negative self-bias voltage is applied. Further, a CN film may be formed using a $C_2H_2$ gas and a $N_2$ gas as a reactive gas. A DLC film has a high blocking effect against oxygen, thereby oxidization of the electroluminescent layer 188 can be suppressed. Therefore, a problem in that the electroluminescent layer 188 is oxidized before a subsequent sealing step can be prevented.

In this manner, by firmly fixing a sealing substrate 195 and the substrate 100 over which the light emitting element 190 is formed with a sealing material 192, the light emitting element is sealed (see FIGS. 5A and 5B). In the display device of the invention, the sealing material 192 and the insulator 186 are formed apart so as not to contact each other. By forming the sealing material 192 and the insulator 186 apart from each other, even when an insulating material using an organic material having high moisture absorbing property is used for the insulator 186, moisture does not easily enter, which can prevent deterioration of the light emitting element and improve the reliability of the display device. As the sealing material 192, it is typically preferable to use a visible light curable resin, an ultraviolet ray curable resin, or a heat curable resin. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type (Epichlorohydrin-Bisphenol) epoxy resin, a glycidyl ester resin, a glycidyl amine resin, heterocyclic epoxy resin, and a modified epoxy resin. It is to be noted that a region surrounded by a sealing material may be filled with a filling material 193, which may be charged with nitrogen by sealing in a nitrogen atmosphere. As a bottom emission type is employed in this embodiment mode, the filling material 193 is not required to transmit light. However, in the case of extracting light through the filling material 193, the filling material is required to transmit light. Typically, a visible light curable, ultraviolet ray curable, or heat curable epoxy resin may be used. By the aforementioned steps, a display device having a display function using a light emitting element of this embodiment mode is completed. Further, the filling material may be filled in the display device by dropping a filling material in a liquid state.

Figure 19:
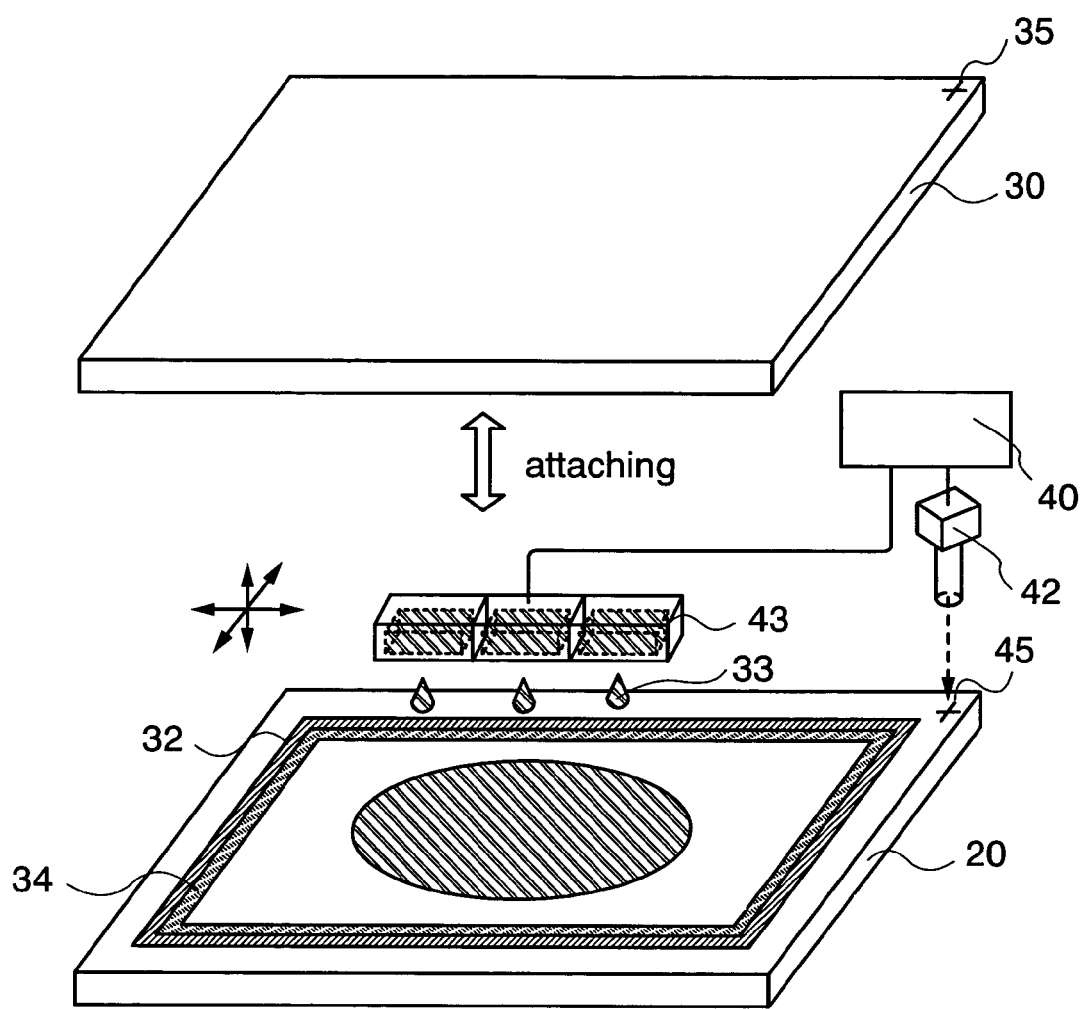
FIG. 19 shows a droplet injecting method applicable to the invention.

A dropping injection method using a dispenser method is described with reference to FIG. 19. The dropping injection method of FIG. 19 includes a control device 40, an image pickup means 42, a head 43, a filling material 33, a marker 35, a marker 45, a barrier layer 34, a sealing material 32, a TFT substrate 30, and a counter substrate 20. The filling material 33 is dropped once or a plurality of times from the head 43 in a closed loop formed by the sealing material 32. In the case where the filling material has high viscosity, the filling material is continuously discharged and attached to a forming region without a break. In the case where the filling material has low viscosity, the filling material is intermittently discharged and dropped as shown in FIG. 19. At this time, the barrier layer 34 may be provided to prevent that the sealing material 32 reacts the filling material 33. Subsequently, the substrates are attached to each other in vacuum and then cured by ultraviolet ray to be filled with the filling material material. As the filling material, a substance having a moisture absorbing property may be used to obtain a further moisture absorbing effect, thereby deterioration of the element can be prevented.

A drying agent is provided in an EL display panel to prevent deterioration by moisture. In this embodiment mode, a drying agent is provided in a depression portion formed so as to surround the pixel region in the sealing substrate not to hinder a thin design. Further, a drying agent is also formed in a region corresponding to a gate wiring layer so that a moisture absorbing area becomes wide, by which moisture can be effectively absorbed. Further, a drying agent is formed over a gate wiring layer which does not emit light, therefore, light extraction efficiency is not decreased either.

It is to be noted that a light emitting element is sealed by a glass substrate, however, any one of a method for mechanically sealing the light emitting element by a cover material, a method for sealing the light emitting element by a heat curable resin or an ultraviolet ray curable resin, or a method for sealing the light emitting element by a thin film having a high barrier property such as a metal oxide, a metal nitride, and the like may be used. As the cover material, glass, ceramics, plastic, or metal can be used, however, a material which transmits light is required to be used in the case where light is emitted to a cover material side. The cover material and the substrate over which the light emitting element is formed are attached using a sealing material such as a heat curable resin or an ultraviolet ray curable resin by curing the resin using heat treatment or ultraviolet ray irradiation treatment, thereby a sealed space is formed. It is also effective to provide a moisture absorbing material typified by barium oxide in this sealed space. This moisture absorbing material may be provided in contact with the sealing material, over or in the periphery of the partition so as not to prevent the light from the light emitting element. Further, the space formed between the cover material and the substrate over which the light emitting element is formed may be filled with a heat curable resin or an ultraviolet ray curable resin. In this case, it is effective to add an absorbing material typified by barium oxide in the heat curable resin or the ultraviolet ray curable resin.

In this embodiment mode, an FPC 194 is connected to a terminal electrode layer 178 through an anisotropic conductive layer 196 in an external terminal connecting region 202 for external electrical connection. As shown in FIG. 5A which is a top plan view of a display device, a display device manufactured in this embodiment mode includes peripheral driver circuit regions 207a and 207b each including a scan line driver circuit as well as a peripheral driver circuit region 204 including a signal line driver circuit. It is to be noted that FIG. 5B is a cross sectional view along a line A-B of FIG. 5A.

Figure 10:
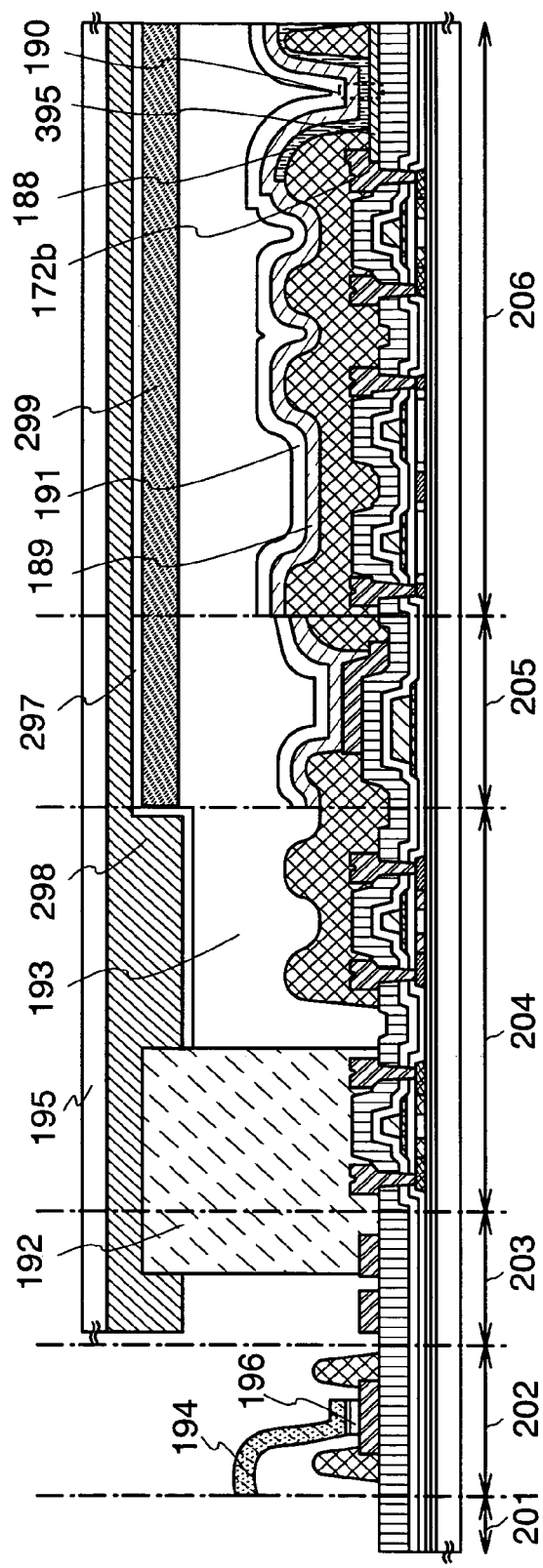
FIG. 10 is a diagram showing a display device of the invention.

In a display device shown in FIG. 10, the first electrode layer 395 may be selectively formed over an insulating film 168 before forming the source electrode layer or drain electrode layer 172b connected to the p-channel thin film transistor 176. In this case, according to this embodiment mode, the source electrode layer or drain electrode layer 172b is stacked on the first electrode layer 395. By forming the first electrode layer 395 prior to the source electrode layer or drain electrode layer 172b, a plane forming region can be formed. Accordingly, a good coverage can be obtained and a polish treatment such as CMP can be sufficiently performed, which leads to a good planarity.

In FIG. 10, the sealing substrate 195 provided to be opposed to the display device is formed to have depression portions in regions where the sealing material 192 and a drying agent 299 are provided.

In the sealing substrate 195, by forming a depression portion in a region to be in contact with the sealing material 192, a contact area between the sealing material 192 and the sealing substrate 195 is increased, thereby an adhesive strength can be enhanced. By securing the adhesive strength between the sealing material 192 and the sealing substrate 195, a width of a seal pattern can be narrowed compared to a conventional one.

Further, in the sealing substrate 195, by forming a depression portion in a region where the drying agent 299 is provided, it can be prevented that the drying agent 299 contacts the light emitting element 190. Accordingly, a pixel defect due to a damage of the light emitting element 190 can be prevented.

The sealing substrate 195 having such depression portions can be formed by various methods. For example, the sealing substrate 195 may be ground to be formed by sandblasting, using a diamond drill, or pressing.

In the case of forming the sealing substrate 195 using a glass material also, a grinding or pressing can be applied. In the case of pressing, liquid glass is used to obtain a predetermined shape. More preferably, a liquid glass layer 298 is formed over the sealing substrate 195 and then pressed to form a depression portion in the liquid glass layer 298. The liquid glass layer 298 may be cured by thermal treatment or heat pressing.

Further, a nitride film such as silicon nitride, silicon nitride oxide, aluminum nitride, and aluminum nitride oxide may be formed as a protective film (also referred to as a blocking layer) 297 for blocking a contaminant. As aluminum nitride, aluminum nitride oxide and the like have high heat conductivity, the temperature of the display panel can be uniform over the surface thereof. It is preferable to form the protective film 297 which can be formed of a nitride film on the interior of the sealing material 192 forming region of the sealing substrate 195.

In this manner, by forming a depression portion in the sealing substrate 195, the display device (also referred to as a display panel) and the sealing substrate 195 can be attached with an extremely narrow distance. Accordingly, for example, it can be suppressed that moisture and the like enter from an edge portion in the periphery of the panel.

In the case of mounting the display device on an electronic device for wireless communication such as a portable phone, a metal substrate used for the sealing substrate 195 may adversely affect the electromagnetic wave and directivity. However, this problem can be solved by forming the sealing substrate 195 using a glass material and the like.

The aforementioned circuit is formed in this embodiment mode, however, the invention is not limited to this. An IC chip may be mounted by the aforementioned COG method or a TAB method as the peripheral driver circuit. Further, each of the gate line driver circuit and the source line driver circuit may be provided in a single number or a plurality of numbers.

In the display device of the invention, a driving method for an image display is not particularly limited, and a dot sequential driving method, a line sequential driving method, an area sequence driving method and the like may be used. Typically, the line sequence driving method may be used, and a time division gray scale driving method and an area gray scale driving method may be appropriately used as well. Further, a video signal inputted to the source line of the display device may be an analog signal or a digital signal. The driver circuit and the like may be appropriately designed according to the video signal.

Further, a display device using a digital video signal employs a constant voltage (CV) or a constant current (CC) video signal inputted to a pixel. The constant voltage (CV) video signal includes a constant voltage applied to a light emitting element (CVCV) and a constant current applied to a light emitting element (CVCC). Further, the constant current (CC) video signal includes a constant voltage applied to a light emitting element (CCCV) and a constant current applied to a light emitting element (CCCC).

According to the invention, a display device with high reliability can be manufactured by simplified steps. Therefore, a display device with high resolution and image quality can be manufactured at low cost with high yield.

EMBODIMENT MODE 3

An embodiment mode of the invention is described with reference to FIGS. 11A to 11C. In this embodiment mode, a description is made on an example where a gate electrode layer of a thin film transistor has a different structure in the display device manufactured according to Embodiment Mode 1. Therefore, description on the same portion or a portion having a similar function will not be repeated.

Figure 11:
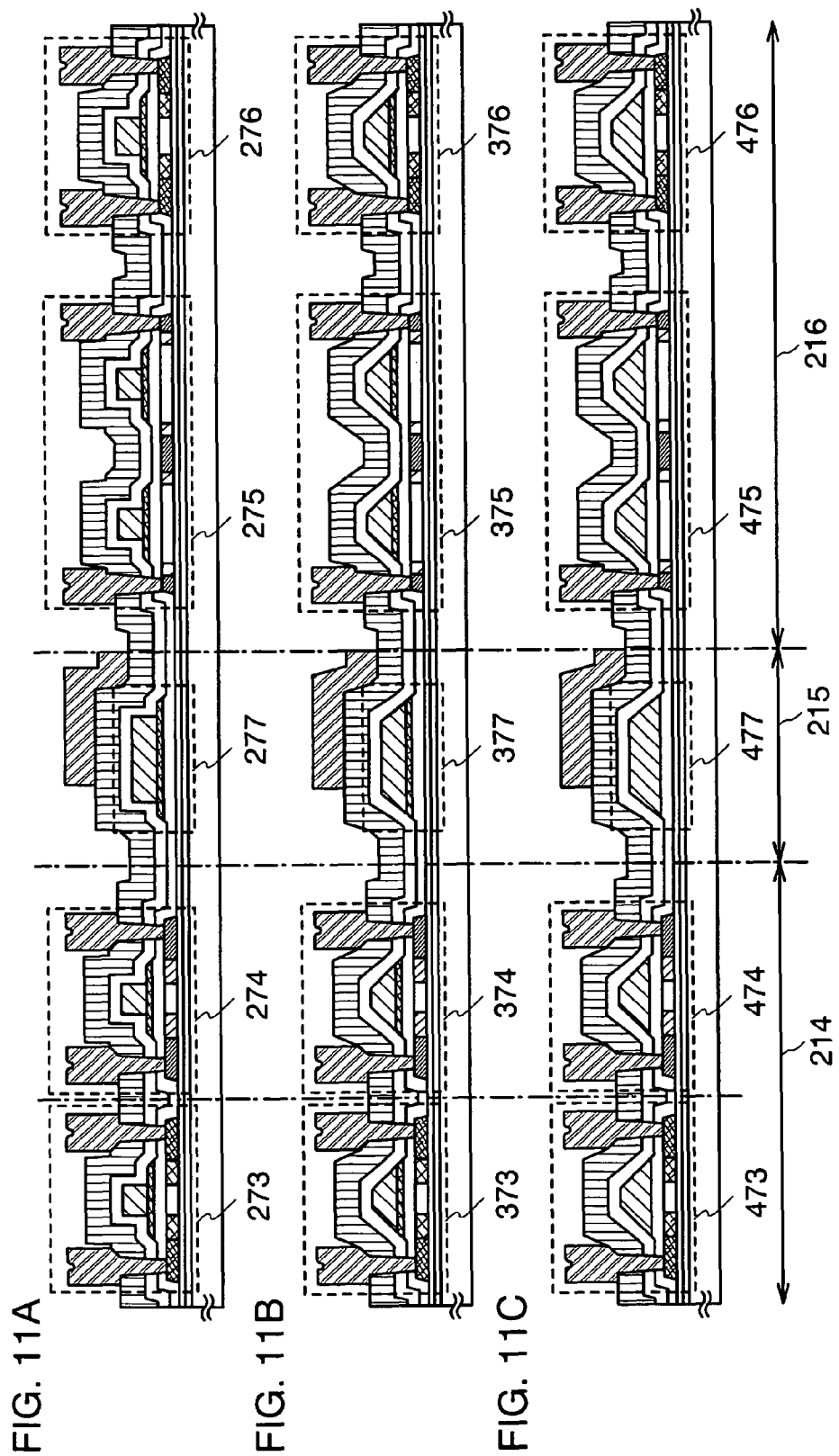
FIGS. 11A to 11C are diagrams showing manufacturing steps of a display device of the invention.

Each of FIGS. 11A to 11C shows a manufacturing step of a display device, which corresponds to the display device of Embodiment Mode 1 shown in FIG. 8B.

In FIG. 11A, thin film transistors 273 and 274 are provided in a peripheral driver circuit region 214, a conductive layer 277 is provided in a connecting region 215, and thin film transistors 275 and 276 are provided in a pixel region 216. A gate electrode layer of the thin film transistor in FIG. 11A is formed of stacked layers of two conductive films, in which a top gate electrode layer is patterned to have a thinner width than a bottom gate electrode layer. The bottom gate electrode layer has a tapered shape while the top gate electrode layer does not have a tapered shape. In this manner, a gate electrode layer may have a tapered shape or a shape of which side angle is almost perpendicular without a taper.

In FIG. 11B, thin film transistors 373 and 374 are provided in the peripheral driver circuit region 214, a conductive layer 377 is provided in the connecting region 215, and thin film transistors 375 and 376 are provided in the pixel region 216. A gate electrode layer of the thin film transistor in FIG. 11B is also formed of stacked layers of two conductive films, in which each of top and bottom gate electrode layers has a continuous tapered shape.

In FIG. 11C, thin film transistors 473 and 474 are provided in the peripheral driver circuit region 214, a conductive layer 477 is provided in the connecting region 215, and thin film transistors 475 and 476 are provided in the pixel region 216. A gate electrode layer of the thin film transistor in FIG. 11C has a single layer structure and a tapered shape. In this manner, the gate electrode layer may have a single layer structure.

As described above, the gate electrode layer may have various structures according to the configuration and shape thereof. Therefore, a display device manufactured thereby has various structures. A structure and concentration distribution of an impurity region in a semiconductor layer changes according to the structure of the gate electrode layer in the case where the impurity region is formed using the gate electrode layer as a mask in a self-aligned manner. A thin film transistor having a desired function can be manufactured by designing in consideration of the aforementioned aspects.

The gate electrode layer, source electrode layer, and drain electrode layer of the thin film transistor formed in this embodiment mode may be formed by a droplet discharge method. The droplet discharge method is a method for discharging a composition containing a liquid conductive material and solidifying the composition by drying and baking, thereby forming a conductive layer and an electrode layer. By discharging a composition containing an insulating material and solidifying it by drying and baking, an insulating layer can also be formed. By the droplet discharge method, a constituent of a display device such as a conductive layer and an insulating layer can be selectively formed, which can simplify the manufacturing steps and reduce the loss of materials. As a result, a display device can be manufactured at low cost with high productivity.

A droplet discharge means used for the droplet discharge method is a generic name of a means for discharging droplets such as a head provided with a nozzle having a discharge orifice of composition, or one or a plurality of nozzles. A diameter of a nozzle of a droplet discharge means is set 0.02 to 100 μm (preferably 30 μm or smaller) and a discharged amount of composition from the nozzle is set 0.001 to 100 pl (preferably 0.1 to 40 pl, and more preferably 10 pl or less). The discharged amount increases in proportion to the diameter of nozzle. A distance between an object and the discharge orifice of the nozzle is preferably as close as possible for discharging at a desired position, which is preferably set 0.1 to 3 mm (preferably 1 mm or less).

As the composition discharged from the discharge orifice, a compound that the conductive material is dissolved or dispersed in a solvent is used. The conductive material corresponds to fine particles or dispersion nanoparticles of metal such as Ag, Au, Cu, Ni, Pt, Pd, Ir, Rh, W, and Al, metal sulfide of Cd and Zn, oxide of Fe, Ti, Si, Ge, Si, Zr, Ba, and the like, and silver halide. Moreover, the conductive material corresponds to indium tin oxide (ITO), ITSO formed by indium tin oxide and silicon oxide, organic indium, organic tin, zinc oxide, titanium nitride, or the like which is used as a light transmissive conductive film. The aforementioned conductive materials may be used by mixing a plurality of types. However, as the composition discharged from the discharge orifice, a composition in which any one of Au, Ag, and Cu is dissolved or dispersed in a solvent is preferably used by considering a specific resistance value, and more preferably, Ag and Cu having low resistance may be used. However, in case of using Ag or Cu, it is preferable to provide a barrier film as a measure against an impurity. As a barrier film, a silicon nitride film or nickel boron (NiB) can be used.

In addition, a particle in which a conductive material is coated with other conductive materials to be a plurality of layers may be used. For example, a three-layer structure particle in which copper is coated with nickel boron (NiB), and then coated with silver may be used. As for such solvents, esters such as butyl acetate and ethyl acetate; alcohols such as isopropyl alcohol and ethyl alcohol; organic solvents such as methyl ethyl ketone and acetone; and water; or the like may be used. The viscosity of the composition is preferably 20 mPa·s (cp) or less. This is because the composition is prevented from drying or the composition is smoothly discharged from the discharge orifice. The surface tension of the composition is preferably 40 mN/m or less. However, the viscosity of the composition and the like may be appropriately adjusted in accordance with a solvent to be used and intended use. For example, the viscosity of a composition in which ITO, organic indium, or organic tin is dissolved or dispersed in the solvent is from 5 to 20 mPa·s, the viscosity of a composition in which silver is dissolved or dispersed in the solvent is from 5 to 20 mPa·s, and the viscosity of a composition in which gold is dissolved or dispersed in the solvent is from 5 to 20 mPa·s.

The conductive layer may be formed by stacking a plurality of conductive materials. In addition, the conductive layer may be formed by a droplet discharge method using silver as a conductive material; thereafter, it may be plated with copper or the like. Plating may be performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed obliquely, there is an advantage of miniaturizing a process apparatus.

The diameter of a particle of the conductive material is preferably as small as possible for the purpose of preventing clogged nozzles and manufacturing a high-definition pattern, although it depends on the diameter of each nozzle, a desired shape of a pattern, and the like. Preferably, the diameter of the particle of the conductive material is 0.1 μm or less. The compound is formed by a known method such as an electrolyzing method, an atomizing method, a wet reducing method, and the particle size thereof is typically about from 0.01 to 10 μm. However, when a gas evaporation method is employed, a nanomolecule protected with a dispersant is as minute as about 7 nm. When each surface of particles is covered with a coating, the nanoparticles do not cohere in the solvent and are uniformly dispersed in the solvent at a room temperature, and show a property similar to that of liquid. Accordingly, it is preferable to use a coating.

The step of discharging the composition may be carried out under reduced pressure. The step of discharging the composition is preferably performed under reduced pressure since an oxide film and the like are not formed on the surfaces of the conductive layers. After discharging the composition to the substrate, one or both of a drying step and a baking step is/are performed. Each of the drying step and baking step is a step of heat treatment. For example, the drying step is performed at a temperature of 100° C. for 3 minutes whereas the baking step is performed at a temperature of 200 to 350° C. for 15 to 60 minutes, and the purposes, temperatures, and time thereof vary. The drying and baking steps are performed at a normal pressure or under reduced pressure by laser light irradiation, rapid thermal annealing, a heating furnace, and the like. Further, the timing of performing the heat treatment and number of the heat treatment are not particularly limited. The substrate may be heated in advance so as to carry out the drying and baking steps favorably. At this time, the heating temperature depends on a material of the substrate and the like, but it is generally set to be 100 to 800° C. (preferably, 200 to 350° C.). According to this process, the nanometer-size particles are in contact with one another and fusing together and fusing bond are accelerated by hardening and shrinking resin in the periphery as well as volatilizing the solvent in the composition or removing the dispersing agent chemically.

A continuous wave or pulsed gas laser or solid state laser may be used for laser light irradiation, which is carried out in the drying or baking step. An excimer laser, a He—Cd laser, an Ar laser and the like are cited for the former gas laser, while lasers using crystals such as YAG, $YVO_4$ and $GdVO_4$ doped with Cr, Nd and the like are cited for the latter solid state laser. Preferably, the continuous wave laser is used in relation to the rate of absorption of laser light. Alternatively, a laser irradiation method combining a pulsed oscillation and a continuous wave may be employed. Further, the heat treatment using laser light may be instantaneously performed for several microseconds to several ten seconds so as not to destroy the substrate according to a heat resistant property of the substrate. Rapid thermal annealing (RTA) is performed by instantaneously heating the substrate for several microseconds to several minutes while rapidly raising the temperature with an infrared lamp, a halogen lamp, and the like that emits ultraviolet light through infrared light under an inert gas atmosphere. Since this treatment is performed instantaneously, only a thin film of a top surface is substantially heated so that underlying films are not adversely affected. That is, this heat treatment does not adversely affect a substrate having a low heat resistance property such as a plastic substrate.

After forming the conductive layer, the surface thereof may be planarized by applying pressure so as to increase the planarity. As the method for pressing the surface of the conductive layer, a roller or the like may scan the surface to level the unevenness, or the surface may be pressed with a flat plate or the like. In pressing the surfaces, a heating step may be carried out. Also, the surface of the conductive layer may be softened or dissolved by using a solvent or the like and the unevenness may be removed by an air knife. Alternatively, the unevenness may be polished by a CMP method. This step can be arbitrarily applied in the case where unevenness occurs due to the droplet discharge method so as to level the uneven surface.

A semiconductor may be formed using an organic semiconductor material by a printing method, a spray application method, a spin coating method, the droplet discharge method or the like. In this case, since the above-described etching step is not required, the number of steps can be reduced. As an organic semiconductor, a low molecular weight organic material, a high molecular weight organic material, an organic pigment, a conductive high molecular weight organic material and the like can be employed. Preferably, a p-conjugated high molecular weight material with skeleton including conjugated double bonds is used as an organic semiconductor material used in the present invention. Typically, a soluble high molecular weight material such as polythiophene, polyfluorene, poly(3-alkyl thiophene), polythiophene derivative and pentacene can be used.

This embodiment mode can be implemented in combination with Embodiment Modes 1 and 2.

EMBODIMENT MODE 4

A display device having a light emitting element can be formed by the invention. The light of the light emitting element is emitted to bottom, top, or dual surfaces. In this embodiment mode, a dual emission type and a top emission type as a one-side emission type are described with reference to FIGS. 12 and 13.

Figure 12:
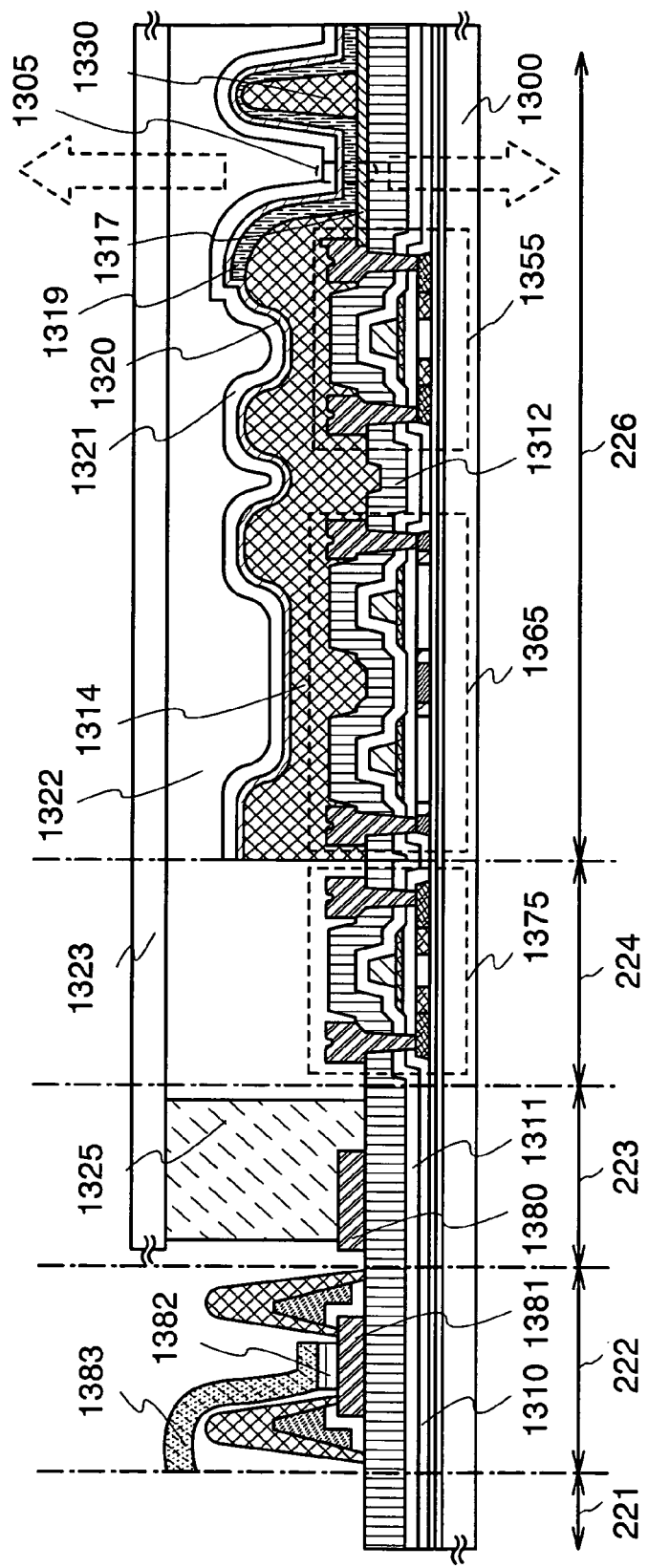
FIG. 12 is a diagram showing a display device of the invention.

A display device shown in FIG. 12 includes an element substrate 1300, thin film transistors 1355, 1365, and 1375, a first electrode layer 1317, an electroluminescent layer 1319, a second electrode layer 1320, a light transmissive conductive film 1321, a filling material 1322, a sealing material 1325, a gate insulating layer 1310, insulating films 1311 and 1312, an insulator 1314, a sealing substrate 1323, a wiring layer 1380, a terminal electrode layer 1381, an anisotropic conductive layer 1382, an FPC 1383, and a spacer 1330. A plurality of spacers having different shapes may be formed over the first electrode layer 1317. The display device includes a separating region 221, an external terminal connecting region 222, a wiring region 223, a peripheral driver circuit region 224, and a pixel region 226. The filling material 1322 can be formed by dropping a liquid composition as in a dropping method of FIG. 19. The element substrate over which the filling material is formed by the dropping method and the sealing substrate 1323 are attached to seal a light emitting display device. In this embodiment mode, a liquid drying agent is injected by dropping and solidified to be used as the filling material 1322. Accordingly, moisture absorbing effect can be obtained and the deterioration of elements can be prevented.

The display device shown in FIG. 12 is a dual emission type which emits light in directions of arrows to the element substrate 1300 side and the sealing substrate 1323 side as well. In this embodiment mode, the first electrode layer 1317 is formed by forming a light transmissive conductive film and etching the film into a desired shape. A light transmissive film can be used as the first electrode layer 1317. As the first electrode layer 1317, a titanium nitride film or a titanium film may be used other than the aforementioned light transmissive conductive film. In this case, after forming a light transmissive conductive film, a titanium nitride film or a titanium film is formed thin enough to transmit light (preferably about 5 to 30 nm). In this embodiment mode, ITSO is used as the first electrode layer 1317.

Subsequently, a second electrode layer 1320 formed of a conductive film is provided over the electroluminescent layer 1319. As the second electrode layer 1320, a material having low work function (Al, Ag, Li, Ca, an alloy thereof such as MgAg, MgIn, or AlLi, or a compound thereof such as calcium fluoride such as $CaF_2$ or calcium nitride such as $Ca_3N_2$) may be used. In the display device of FIG. 12, a metal thin film having a thinner film thickness (MgAg: film thickness of 10 nm) is used for the second electrode layer 1320 and ITSO with a thickness of 100 nm is used for the light transmissive conductive film 1321 so as to transmit light. As the light transmissive conductive film 1321, a similar film to the aforementioned first electrode layer 1317 can be used.

Figure 13:
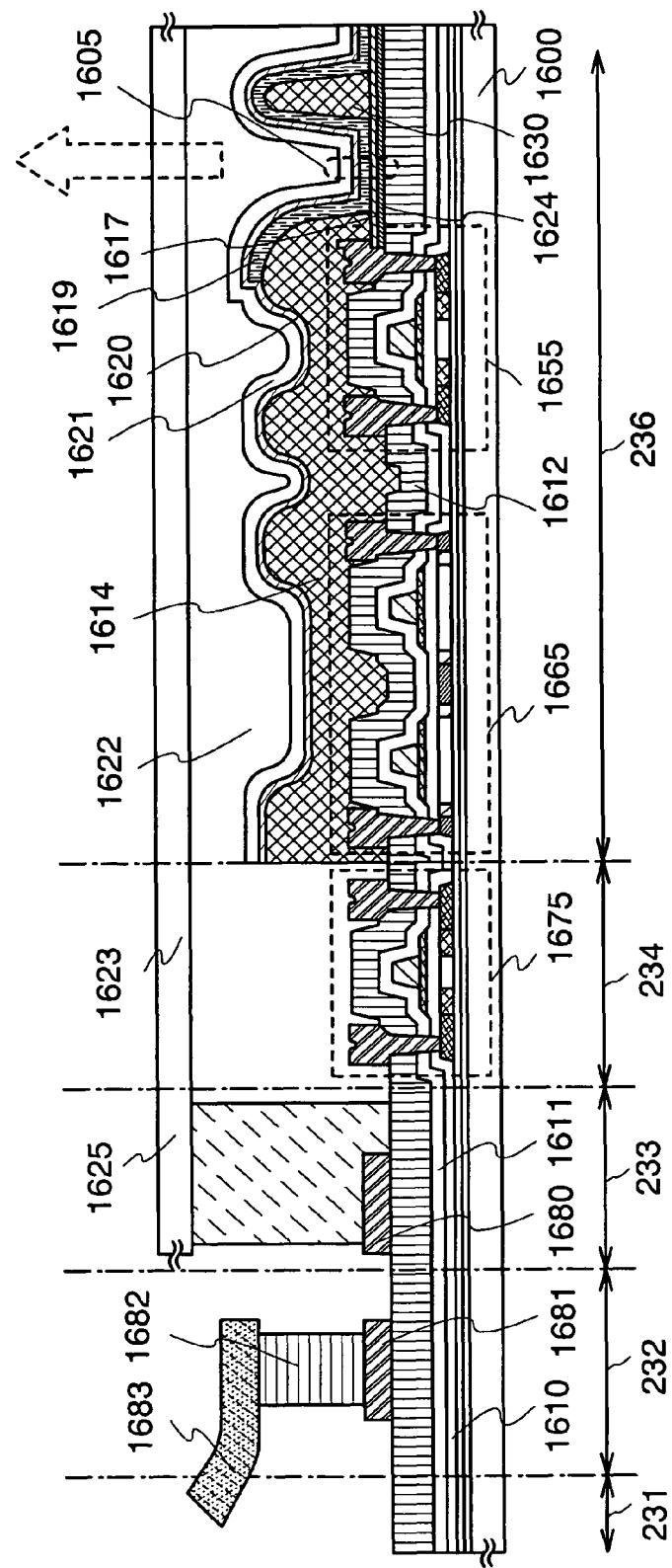
FIG. 13 is a diagram showing a display device of the invention.

The display device in FIG. 13 is a one-side light emission type which emits light to the top in a direction of an arrow. The display device shown in FIG. 13 includes an element substrate 1600, thin film transistors 1655, 1665, and 1675, a metal layer 1624 which is reflective, a first electrode layer 1617, an electroluminescent layer 1619, a second electrode layer 1620, a light transmissive conductive film 1621, a filling material 1622, a sealing material 1625, a gate insulating layer 1610, insulating films 1611, 1612, and 1614, a sealing substrate 1623, a wiring layer 1680, a terminal electrode layer 1681, an anisotropic conductive layer 1682, an FPC 1683, and a spacer 1630. In the display device in FIG. 13, an insulating layer stacked over the terminal electrode layer 1681 is etched and removed. In this manner, a structure that an insulating layer which transmits moisture is not provided in the periphery of the terminal electrode layer can improve the reliability. Further, the display device includes a separating region 231, an external terminal connecting region 232, a wiring region 233, a peripheral driver circuit region 234, and a pixel region 236. In this case, in the dual emission type display device shown in FIG. 12, a metal layer 1624 which is reflective is formed under the first electrode layer 1317. The first electrode layer 1617 which is a light transmissive conductive film which functions as an anode is formed over the metal layer 1624 which is reflective. The metal layer 1624 which is only required to reflect light may be formed of Ta, W, Ti, Mo, Al, Cu, and the like. It is preferable to use a substance having a high reflecting property in a visible light region. In this embodiment mode, a TiN film is used.

The second electrode layer 1620 formed of a conductive film is provided over the electroluminescent layer 1619. As the second electrode layer 1620 which functions as a cathode, a material having a low work function (Al, Ag, Li, or Ca, an alloy thereof such as MgAg, MgIn, or AlLi, or a compound thereof such as calcium fluoride such as $CaF_2$ or calcium nitride such as $Ca_3N_2$) may be used. In this embodiment mode, a metal thin film having a thin thickness (MgAg: thickness of 10 nm) and ITSO with a thickness of 110 nm are stacked as the second electrode layer 1620 and the light transmissive conductive film 1621.

A light emitting element applicable to the invention may use the structure as described in the aforementioned embodiment mode. Further, a structure of a light emitting element in the following embodiment mode can be used in combination with the aforementioned embodiment mode. A light emitting element has a pair of electrodes sandwiching a plurality of layers therebetween, at least one of which is a layer containing a light emitting substance (also referred to as an electroluminescent layer).

For example, a favorable light emitting element has a layer containing a light emitting substance, and at least one layer formed of a mixed layer containing an inorganic substance and an organic substance among other layers. This mixed layer can be a hole injecting/transporting layer or an electron injecting/transporting layer by selecting between an inorganic substance and an organic substance.

An example of a combination of hole injecting/transporting layer is as follows. As an inorganic substance, molybdenum oxide (MoOx), vanadium oxide (VOx), ruthenium oxide (RuOx), tungsten oxide (WOx), and the like can be used. Besides, indium tin oxide (ITO), zinc oxide (ZnO), tin oxide (SnO) can be used. However, the invention is not limited to the aforementioned substances and other substances may be used as well. As an organic substance, an aromatic amine (that is, the one having a benzene ring-nitrogen bond) such as a compound having high hole transporting property, such as 4,4'-bis[N-(1-naphthyl)-N-phenyl-amino]-biphenyl (abbr. a-NPD), 4,4'-bis[N-(3-methylphenyl)-N-phenyl-amino]-biphenyl (abbr. TPD), 4,4',4''-tris(N,N-diphenyl-amino)-triphenylamine (abbr. TDATA), and 4,4',4''-tris[N-(3-methylphenyl)-N-phenyl-amino]-triphenylamine (abbr. MTDATA)

may be used. However, the invention is not limited to the aforementioned, and other substances may be used as well.

The following is an example of a combination of electron injecting/transporting layers. As an inorganic substance, one or more metal having an electron donor selected from lithium, cesium, magnesium, calcium, barium, erbium, and ytterbium is used. As an organic substance, a layer formed of a metal complex having a quinoline skeleton or a benzoquinoline skeleton such as a substance having a high electron transporting property such as tris(8-quinolinolato)aluminum (abbr. Alq$_3$), tris(4-methyl-8-quinolinolato)aluminum (abbr. Almq$_3$), bis(10-hydroxybenzo[h]-quinolinato)beryllium (abbr. BeBq$_2$), and bis(2-methyl-8-quinolinolato)-4-phenylphenolate-aluminum (abbr. BAlq). Further, a metal complex containing oxazole-based or thiazole-based ligand such as bis(2-[2'-hydroxyphenyl]benzoxazolate)zinc (abbr. Zn(BOX)$_2$) and bis(2-[2'-hydroxyphenyl]benzothiazolate) zinc (abbr. Zn(BTZ)$_2$) may also be used. Other than metal complex, 2-(4-biphenylyl)-5-(4-tert-butylphenyl)-1,3,4-oxadiazole (abbr. PBD), 1,3-bis(5-[p-tert-butylphenyl]-1,3,4-oxadiazole-2-yl)benzene (abbr. OXD-7), 3-(4-tert-butylphenyl)-4-phenyl-5-(4-biphenylyl)-1,2,4-triazole (abbr. TAZ), 3-(4-tert-butylphenyl)-4-(4-ethylphenyl)-5-(4-biphenylyl)-1,2,4-triazole (abbr. p-EtTAZ), bathophenanthroline (abbr. BPhen), bathocuproin (abbr. BCP), and the like may be used as well. However, the invention may employ other substances described in the aforementioned embodiment modes as well as the ones described in this embodiment mode.

A light emitting element is formed by appropriately combining a layer containing a light emitting substance and the aforementioned mixed layer. For example, a hole injecting/transporting layer or an electron injecting/transporting layer may be provided on one side of the layer containing a light emitting substance. Further, a hole injecting/transporting layer may be provided on one side while an electron injecting/transporting layer is provided on the other side with the layer containing a light emitting substance sandwiched therebetween.

At least one of or both of the pair of electrodes is formed of indium oxide, tin oxide, zinc oxide, a light transmissive conductive substance in which at least a plurality of the aforementioned substances are mixed. For example, a mixture of indium oxide and tin oxide (also referred to as ITO), a mixture of indium oxide and zinc oxide and the like are used. Further, a light transmissive conductive substance containing an appropriate amount of oxide such as silicon oxide, titanium oxide, molybdenum oxide for suppressing crystallization of these oxide and maintaining the planarity of the surface may be used as well. Further, at least one of the pair of electrodes may be formed of a metal substance containing as a main component aluminum, silver, titanium, tantalum, molybdenum, chromium, tungsten and the like.

A mode of a light emitting element applicable to this embodiment mode is shown in FIGS. 27A to 27D. A light emitting element has an electroluminescent layer 860 sandwiched between a first electrode layer 870 and a second electrode layer 850. A material for the first electrode layer and the second electrode layer is required to be selected in consideration of a work function, and the first electrode layer and the second electrode layer can be an anode or a cathode depending on a pixel structure. In this embodiment mode, in the case where a driving TFT is a p-channel TFT, the first electrode layer is an anode and the second electrode layer is a cathode. Further, the driving TFT is an n-channel TFT, the first electrode layer is a cathode and the second electrode layer is an anode.

Figure 27A:
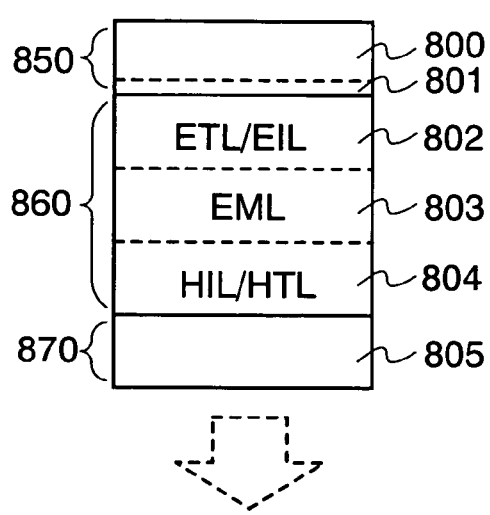
FIGS. 27A to 27D are diagrams showing structures of a light emitting element applicable to the invention.
Figure 27B:
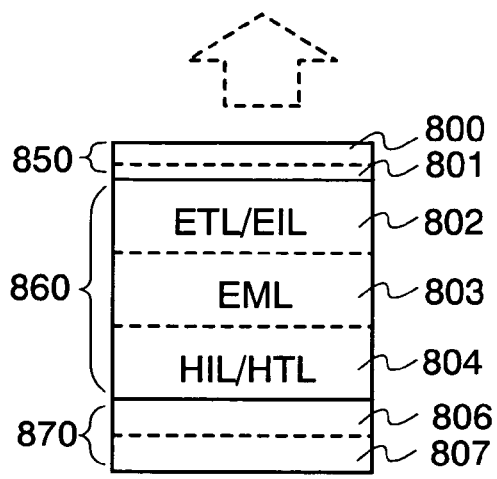

In FIGS. 27A and 27B, the first electrode layer 870 is an anode and the second electrode layer 850 is a cathode. It is preferable that the electroluminescent layer 860 be formed by stacking an HIL (hole injecting layer)/HTL (hole transporting layer) 804, an EML (light emitting layer) 803, an ETL (electron transporting layer)/EIL (electron injecting layer) 802, and a second electrode layer 850 in this order from the first electrode layer 870 side. FIG. 27A shows a structure that light is emitted from the first electrode layer 870 which is formed of an electrode layer 805 formed of an oxide conductive material which transmits light, and the second electrode layer is formed of an electrode layer 800 formed of a metal material such as aluminum and an electrode layer 801 containing an alkali metal or alkaline earth metal such as LiF and MgAg. FIG. 27B shows a structure that light is emitted from the second electrode layer 850 which is formed of an electrode layer 807 formed of a metal such as aluminum and titanium, or a metal material containing the aforementioned metal and nitrogen at a concentration equal to or less than the stoichiometric composition ratio, and a second electrode layer 806 formed of an oxide conductive material containing silicon oxide at a concentration of 1 to 15 atomic %. The second electrode layer is formed of an electrode layer 801 containing an alkaline metal or an alkaline earth metal such as LiF and MgAg and an electrode layer 800 formed of a metal material such as aluminum from the electroluminescent layer 860 side. By forming both of the layers with thickness of 100 nm or less so as to be able to transmit light, light can be emitted from the second electrode layer 850.

Figure 27C:
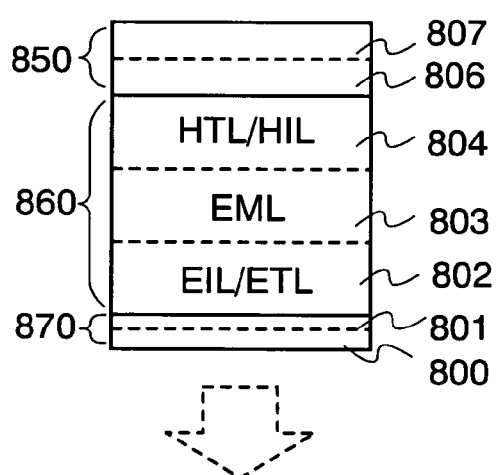
Figure 27D:
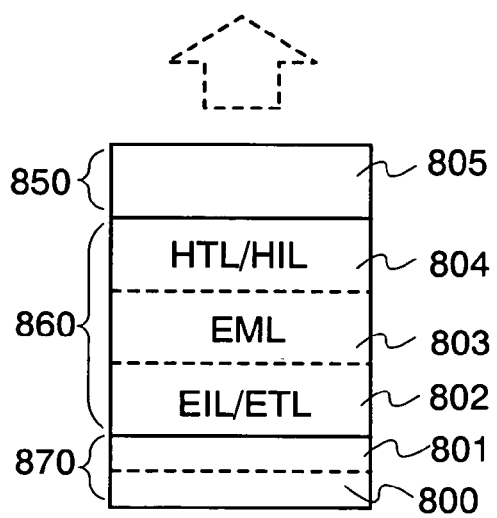

In FIGS. 27C and 27D, the first electrode layer 870 is a cathode and the second electrode layer 850 is an anode. It is preferable that the electroluminescent layer 860 be formed by stacking an EIL (electron injecting layer)/ETL (electron transporting layer) 802, an EML (light emitting layer) 803, an HTL (hole transporting layer)/HIL (hole injecting layer) 804, and the second electrode layer 850 as an anode from the cathode side in this order. FIG. 27C shows a structure to emit light from the first electrode layer 870 which is formed of the electrode layer 801 containing an alkaline metal or an alkaline earth metal such as LiF and MgAg, and the electrode layer 800 formed of a metal material such as aluminum. By forming both of the layers with thickness of 100 nm or less so as to be able to transmit light, light can be emitted from the first electrode layer 870. The second electrode layer is formed of the second electrode layer 806 formed of an oxide conductive material containing silicon oxide at a concentration of 1 to 15 atomic %, and the electrode layer 807 formed of a metal such as aluminum and titanium, or a metal material containing the aforementioned metal and nitrogen at a concentration equal to or less than the stoichiometric composition ratio from the electroluminescent layer 860 side. FIG. 27D shows a structure that light is emitted from the second electrode layer 850. The first electrode layer 870 is formed of the electrode layer 801 containing an alkaline metal or an alkaline earth metal such as LiF and MgAg and the electrode layer 800 formed of a metal material such as aluminum from the electroluminescent layer 860 side, to be thick enough to reflect light emitted from the electroluminescent layer 860. The second electrode layer 850 is formed of the electrode layer 805 formed of an oxide conductive material which transmits light. It is to be noted that the electroluminescent layer may have a single layer structure or a mixed layer structure other than a stacked-layer structure.

Further, a material which exhibits light emission of each of red (R), green (G), and blue (B) is selectively formed by a vapor deposition method using a vapor deposition mask and the like as an electroluminescent layer. The material which exhibits light emission of red (R), green (G), and blue (B) can be formed by a droplet discharge method similarly to a color filter (a low molecular or high molecular weight material and the like). This case is preferable as RGB can be separately deposited without a mask.

In the case of using ITO and ITSO each of which transmits light as the second electrode layer of a top emission type panel, BzOs—Li or the like that is formed by doping Li to benzoxazole derivatives (BzOs) and the like can be used. Further, $Alq_3$ doped with dopant (DCM or the like in the case of R, DMQD in the case of G, or the like) that corresponds to each emission color of R, G, and B can be used as the electroluminescent layer (EML).

A material of the electroluminescent layer (EML) is not limited to the foregoing materials. For example, a hole injecting property can be improved by co-evaporation of oxides such as molybdenum oxide (MoOx: x=2 to 3) or the like, instead of using CuPc or PEDOT, and a-NPD or rubrene. In such a way, an organic material (containing low molecular weight or high molecular weight material) or a composite material of an organic material and an inorganic material can be used as the electroluminescent material. Hereinafter, a material for forming a light emitting element is described in details.

Among charge injecting/transporting substances, as a material having particularly a high electron transporting property, for example, a metal complex or the like having a quinoline skeleton or a benzoquinoline skeleton such as tris (8-quinolinolate) aluminum (abbr. $Alq_3$), tris(5-methyl-8-quinolinolate) aluminum (abbr. $Almq_3$), bis(10-hydroxybenzo[h]-quinolinato) beryllium (abbr. $BeBq_2$), or bis(2-methyl-8-quinolinolato)-4-phenylphenolato-aluminum (abbr. BAlq) can be used. As a material having a high hole transporting property, for example, aromatic amine (that is, the one having a benzene ring-nitrogen bond) based compounds such as 4,4'-bis[N-(1-naphthyl)-N-phenyl-amino]-biphenyl (abbr. a-NPD), 4,4'-bis[N-(3-methylphenyl)-N-phenyl-amino]-biphenyl (abbr. TPD), 4,4',4"-tris(N,N-diphenyl-amino)-triphenyl amine (abbr. TDATA), and 4,4', 4"-tris[N-(3-methylphenyl)-N-phenyl-amino]-triphenylamine (abbr. MTDATA) can be used.

Among charge injecting/transporting substances, as a material having a particularly high electron injecting property, a compound of an alkali metal or an alkali earth metal such as lithium fluoride (LiF), cesium fluoride (CsF), calcium fluoride ($CaF_2$), or the like can be used. Besides, a mixture of a material having a high electron transportation property such as $Alq_3$ and an alkali earth metal such as magnesium (Mg) can be used.

Among charge injecting/transporting substances, as a material having a high hole injecting property, for example, metal oxide such as molybdenum oxide (MoOx), vanadium oxide (VOx), ruthenium oxide (RuOx), tungsten oxide (WOx), manganese oxide (MnOx), or the like can be used. Besides, a phthalocyanine compound such as phthalocyanine (abbr. $H_2Pc$) or copper phthalocyanine (CuPc) can be used.

A light emitting layer may have the structure in which each of light emitting layers having different emission wavelength bands is respectively provided to each pixel for color display. Typically, light emitting layers corresponding to each color of R (red), G (green), and B (blue) are formed. In this instance, color purity can be improved and a pixel portion can be prevented from being a mirror surface (reflection) by providing a filter transmissive to light in each emission wavelength region at the light emission side of the pixel. By providing the filter, a circularly polarizing light plate or the like that is conventionally required becomes not required, further, light can be emitted from the light emitting layer without loss of light. Moreover, color changes which occur in the case of viewing obliquely the pixel portion (display screen) can be further reduced.

There are various light emitting materials. As a low molecular weight organic light emitting material. 4-dicyanomethylene-2-methyl-6-[2-(1,1,7,7-tetramethyl-9julolidyl)-ethenyl]-4H-pyran (abbr. DCJT), 4-dicyanomethylene-2-t-butyl-6-[2-(1,1,7,7-tetramethyl-9-julolidyl)-ethenyl]-4H-pyran (abbr. DCJTB), periflanthene, 2,5-dicyano-1,4-bis(10-metoxy-1,1,7,7-tetramethyl-9-julolidyl)-ethenyl]benzene, N,N'-dimethylquinacridone (abbr. DMQd), coumarin 6, coumarin 545T, tris(8-quinolinolato)aluminum (abbr. $Alq_3$), 9,9'-biantrile, 9,10-diphenylantracene (abbr. DPA), 9,10-bis(2-naphtyl)anthracene (abbr. DNA), or the like can be used. Another material may be used as well.

A high molecular weight organic light emitting material has higher physical strength than that of a low molecular weight organic light emitting material, and so a light emitting element can be manufactured to have high durability. A light emitting element can be comparatively readily manufactured since a light emitting layer can be formed by coating. A structure of a light emitting element using a high molecular weight organic light emitting material is basically same as that of a light emitting element using a low molecular weight organic light emitting material. The structure is formed by sequentially stacking a cathode, an organic light emitting layer, and an anode. However, it is difficult to form a layered structure, which is formed when using a high molecular weight organic light emitting material, in the case of using a low molecular weight organic light emitting material. Specifically, a structure formed by sequentially stacking a cathode, a light emitting layer, a hole transporting layer, and an anode is used.

Since emission color is dependent on a material for forming a light emitting layer, a light emitting element that exhibits desired light emission can be formed by selecting the material. As a high molecular weight electroluminescent material, a polyparaphenylene vinylene based material, a polyparaphenylene based material, polythiophene based material, or a polyfluorene based material can be used.

As the polyparaphenylene vinylene based material, a derivative of poly(paraphenylene vinylene) [PPV], poly(2,5-dialkoxy-1,4-phenylene vinylene) [RO-PPV], poly(2-(2'-ethyl-hexoxy)-5-methoxy-1,4-phenylene vinylene) [MEH-PPV], poly(2-dialkoxyphenyl)-1,4-phenylenevinylene) [ROPh-PPV], and the like are used. As the polyparaphenylene based material, a derivative of polyparaphenylene [PPP], poly(2,5-dialkoxy-1,4-phenylene) [RO-PPP], poly(2, 5-dihexoxy-1,4-phenylene), and the like are used. As the polythiophene based material, a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCMHT], poly(3,4-dicyclohexylthiophene) [PDCHT], poly[3-(4-octylphenyl)-thiophene] [POPT], poly[3-(4-octylphenyl)-2,2-bithiophene] [PTOPT], and the like are used. As the polyfluorene based material, a derivative of polyfluorene [PF], poly(9,9-dialkylfluorene) [PDAF], poly(9,9-dioctylfluorene) [PDOF], and the like are used.

An injecting property of holes from the anode can be improved by interposing a high molecular weight organic light emitting material having a hole transporting property between the anode and a high molecular weight organic light emitting material having a light emitting property. Generally, the high molecular weight organic light emitting material having a hole transporting property and an acceptor material dissolved in water are coated by a spin coating method. The high molecular weight organic light emitting material having a hole transporting property is not dissolved in organic solvent, accordingly, the material can be stacked over the organic light emitting material having a light emitting property. As the high molecular weight organic light emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be used.

The light emitting layer can be formed to exhibit mono emission color or white emission color. In the case of using a white emission material, color display can be realized when a filter that transmits light (colored layer) at a specified wavelength is provided at the side of light emission of a pixel.

To form a light emitting layer that exhibits white emission, for example, $Alq_3$, $Alq_3$ partly doped with Nile red as a red light emitting element, p-EtTAZ, and TPD (aromatic diamine) are deposited sequentially by vapor deposition method. In the case that the light emitting layer is formed by a spin coating method, the material is preferably baked by vacuum heating after being coated. For example, poly(ethylene dioxythiophene)/poly(styrene sulfonate) solution (PEDOT/PSS) may be coated over a whole surface and baked, and polyvinylcarbazole (PVK) doped with pigments functioning as a light emitting layer (1,1,4,4-tetraphenyl-1,3-butadiene (abbr. TPB), 4-dicyanomethylene-2-methyl-6-(p-dimethylamino-styryl)-4H-pyran (DCM1), Nile red, coumarin 6, or the like) may be coated over a whole surface and baked.

The light emitting layer may also be formed by a single layer. In this case, the light emitting layer may be formed of polyvinylcarbazole (PVK) having a hole transporting property dispersed with a 1,3,4-oxadiazole derivative (PBD) having an electron transporting property. Further, white emission can be obtained by dispersing PBD of 30 weight % as an electron transporting agent and dispersing an appropriate amount of four kinds of pigments (TPB, coumarin 6, DCM1, and Nile red). In addition to the light emitting element that exhibits white emission as described in the foregoing, a light emitting element that can exhibit red emission, green emission, and blue emission can be manufactured by approximately selecting a material of a light emitting layer.

Besides the singlet excited light emitting material, a triplet excited material containing a metal complex or the like can be used for the light emitting layer. For example, among a red light emitting pixel, a green light emitting pixel, and a blue light emitting pixel; a red light emitting pixel having comparatively short half-brightness life is formed by a triplet excited light emitting material and the others are formed by singlet excited light emitting materials. The triplet excited light emitting material has a characteristic that it requires lower power consumption than that of the singlet excited light emitting material to obtain a certain level of luminance since the triplet excited light emitting material has high luminous efficiency. In the case that the triplet excited light emitting material is used for forming the red light emitting pixel, the reliability can be improved since the light emitting element requires a small amount of current. To reduce power consumption, the red light emitting pixel and the green light emitting pixel may be formed by the triplet excited light emitting material, and the blue light emitting pixel may be formed by a single excited light emitting material. The power consumption of a green light emitting element that has high visibility to human eyes can be reduced by using the triplet excited light emitting material for forming the green light emitting element.

As an example for the triplet excited light emitting material, a material using a metal complex as a dopant such as a metal complex including platinum that is an element of the third transition series as a central metal or a metal complex including iridium as a central metal is well known. The triplet excited light emitting material is not limited to these compounds. A compound that has the foregoing structure and that has an element belonging to groups 8 to 10 in the periodic table of elements as a central metal can be used.

Above mentioned materials for forming the light emitting layer are illustrative only. The light emitting element can be formed by stacking each functional layer such as a hole injecting layer, a hole transporting layer, an electron injecting layer, an electron transporting layer, a light emitting layer, an electron blocking layer, and a hole blocking layer. A mixed layer or mixed junction of the foregoing layers may be formed. The structure of the light emitting layer is capable of being varied. Therefore, instead of providing a specified electron injecting region or light emitting region, modifications of the structure such as providing an electrode layer in order to be used for the electron injecting region or the light emitting region, or providing a dispersed light emitting material can be allowed unless such modifications depart from the scope of the invention.

The light emitting element formed by the foregoing materials emits light under forward bias. A pixel of a display device formed by using the light emitting element can be driven by either a passive matrix driving method or an active matrix driving method. In any case, each pixel emits light by applying forward bias at a specified timing. Further, the respective pixels are in non-light emission state for a certain period. The reliability of the light emitting element can be improved by applying reverse bias in the non-light emission period. The light emitting element may be in a deterioration mode that light emission intensity is decreased under a regular driving condition or may be in a deterioration mode that apparent luminance is decreased due to the expansion of a non-light emission region in the pixel. The progress of deterioration can be delayed by AC driving to apply forward bias and reverse bias, which leads to the improvement of the reliability of the light emitting device. Further, both digital and analog drive can be applied.

A color filter (colored layer) may be provided to the sealing substrate. The color filter (colored layer) can be formed by a vapor deposition method or a droplet discharge method. By using a color filter (colored layer), high definition display can be realized, since a broad peak in an emission spectrum of each RGB can be corrected into a sharp peak by the color filter (colored layer).

The formation of materials which exhibit RGB has been described. A full color display can be realized by forming a material which exhibits light emission of mono color and combining it with a color filter or a color conversion layer. The color filter (colored layer) or the color conversion layer may be formed, for example, over a second substrate (sealing substrate) and attached to another substrate.

It is needless to say that mono color light emission display may be performed. For example, an area color type display device can be formed by utilizing monochromatic light emission. An area color type display portion is suitable for a passive matrix display portion. The display device can display mainly text or symbols.

In the foregoing structure, a material having a low work function can be used to form the cathode. For example, Ca, Al, CaF, MgAg, AlLi, and the like are preferably used. Further, the electroluminescent layer may be formed of a single layer, stacked layers or mixed layer not having an interface between layers. The electroluminescent layer may be formed by using a singlet material, a triplet material, combined material of the two materials, or a charge injecting-transporting material containing an organic compound and an inorganic compound; and a light emitting material. The light emitting layer may be a layer formed of one or a plurality of layers selected based on its molecularity from the group consisting of a low molecular weight organic compound, an intermediate molecular weight organic compound (an organic compound which does not have a subliming property and which has molecularity of 20 or less), or an organic compound which has a molecular chain length of 10 µm of less), and a high molecular weight organic compound, and an inorganic compound having an electron injecting/transporting property or a hole injecting/transporting property can be combined with the light emitting layer. The first electrode layer is formed of a light transmissive conductive film that transmits light. For example, ITO, ITSO, or a light transmissive conductive film formed by mixing indium oxide with 2 to 20% of zinc oxide (ZnO) is used. Before forming the first electrode layer, plasma treatment in the presence of oxygen or heat treatment under vacuum atmosphere is preferably performed. A partition wall (also referred to as a bank) is formed of a material containing silicon, an organic material, and a compound material. Further, a porous film can also be used for the bank. The bank is preferably formed by a photosensitive material or non-photosensitive material such as acrylic or polyimide, since the bank is formed to have a curved edge portion having a radius of curvature varying continuously, and a thin film formed over the bank can be formed without a break. This embodiment mode can be freely implemented in combination with the foregoing embodiment modes.

Further, the display device shown in FIG. 13 is a top emission type display device in which light is extracted from the sealing substrate 1623 side. In this case, a polarizing plate and a protective film may be provided either on the element substrate side or the opposite side of the sealing substrate 1623. By providing polarizing plate so as to be sandwiched by the protective film and the sealing substrate, the polarizing plate can be protected from contamination, damage and the like. Further, a retardation plate (λ/4 plate and λ/2 plate) or an anti-reflection film may be provided as well as polarizing plate. By using the retardation plate and polarizing plate, reflection of external incident light can be blocked, thereby a high resolution and fine image can be displayed.

Further, a polarizing plate and a protective film may be provided in a dual emission type display device shown in FIG. 12 as well. In the display device shown in FIG. 12, light is emitted from the sealing substrate 1323 side and the element substrate 1300 side as shown by the arrows. Therefore, it is preferable to a provide polarizing plate and a protective film over the sealing substrate 1323 and the opposite side to a side of the element substrate 1300 having elements. The protective film protects the display device and polarizing plate from contamination and damage, thereby improving the reliability thereof. Further, a retardation plate (λ/4 plate and λ/2 plate) or an anti-reflection film may be provided as well as polarizer. By using the retardation plate and polarizing plate, reflection of external incident light can be blocked, thereby a high resolution and fine image can be displayed.

The protective film can be formed of a material selected from silicon oxide, silicon nitride, silicon oxynitride, silicon nitride oxide, aluminum nitride (AlN), aluminum oxynitride (AlON), aluminum nitride oxide containing nitrogen more than oxygen (AlNO), aluminum oxide, diamond-like carbon (DLC), a carbon nitride film (CN) and other substances containing an inorganic insulating material. Further, a siloxane material may be used as well. An organic insulating material may be used as well, for which polyimide, acrylic, polyamide, polyimide amide, resist, benzocyclobutene, and polysilazane may be used. A coated film with a superior planarity formed by a coating method may be used as well. A conductive material may also be used with a design by which a defect of electrical characteristics such as a short-circuit does not occur. Further, by using aluminum nitride oxide ($AlN_xO_Y$) having a heat diffusion effect which diffuses heat as a protective film, heat generated from a light emitting element can be diffused, thereby the deterioration of the light emitting element and display device can be prevented and the reliability thereof can be improved. It is preferable that 0 is contained in the composition of $AlN_xO_Y$ by 0.1 to 30 atomic %. By providing the protective film on the light emitting element side which is closer to the light emitting element, the heat diffusion effect can be more achieved.

According to the invention, a display device with high reliability can be manufactured through simplified steps. Therefore, a display device with high resolution and image quality can be manufactured at low cost with high yield.

This embodiment mode can be implemented in combination with any one of Embodiment Modes 1 to 3.

EMBODIMENT MODE 5

Figure 15:
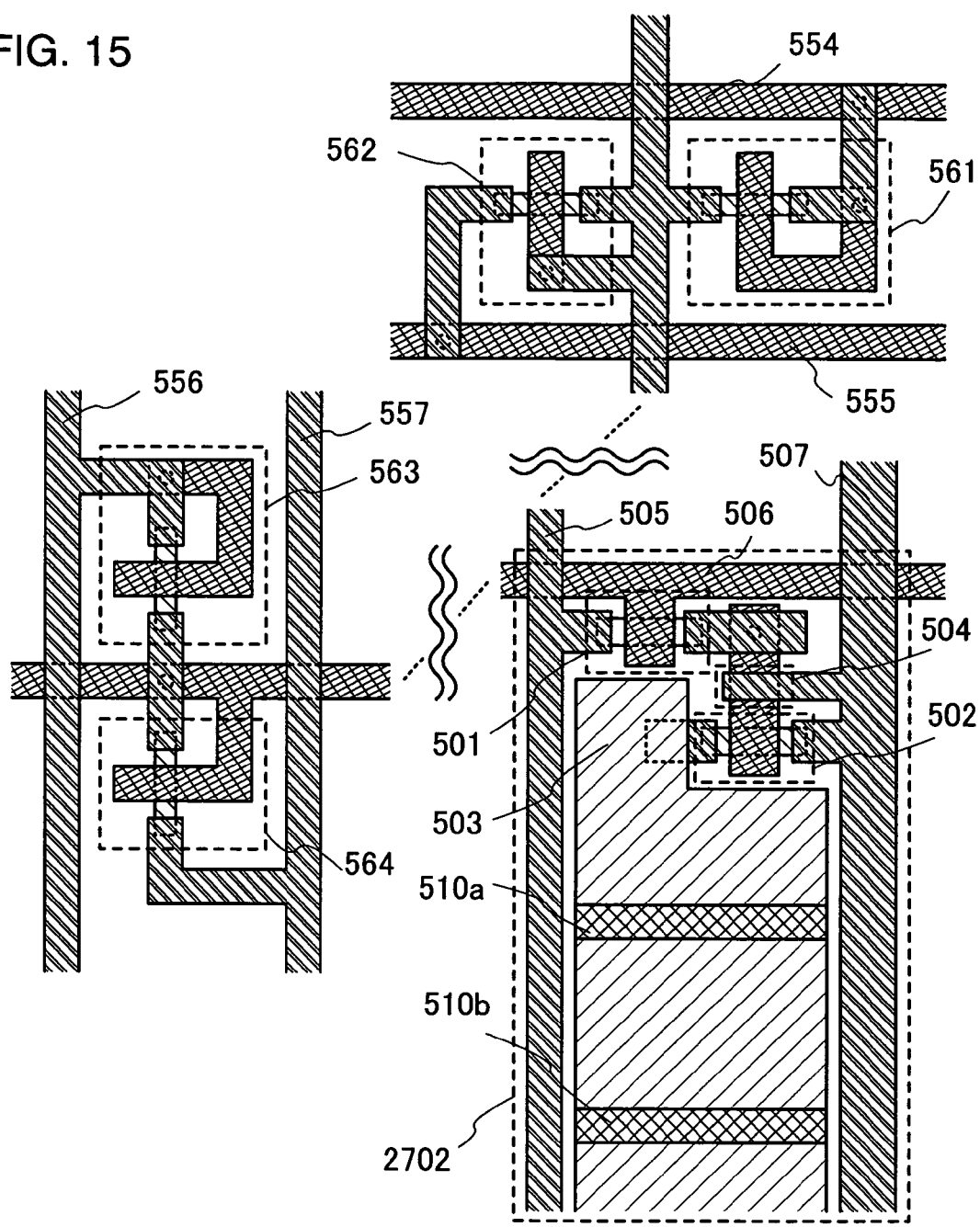
FIG. 15 is a top plan view showing a display device of the invention.

Hereinafter described with reference to FIG. 15 is a mode in which a protective diode is provided for a scan line side input terminal portion and a signal line side input terminal portion. In FIG. 15, a pixel 2702 is provided with TFTs 501 and 502, a capacitor 504, and a pixel electrode layer 503. These TFTs have similar structures to Embodiment Mode 1. Spacers 510a and 510b are provided over the pixel electrode layer 503. These spacers support a vapor deposition mask used for forming an electroluminescent layer over the pixel electrode layer 503. Accordingly, it can be prevented that the mask contacts and damages the pixel electrode layer 503.

Figure 14:
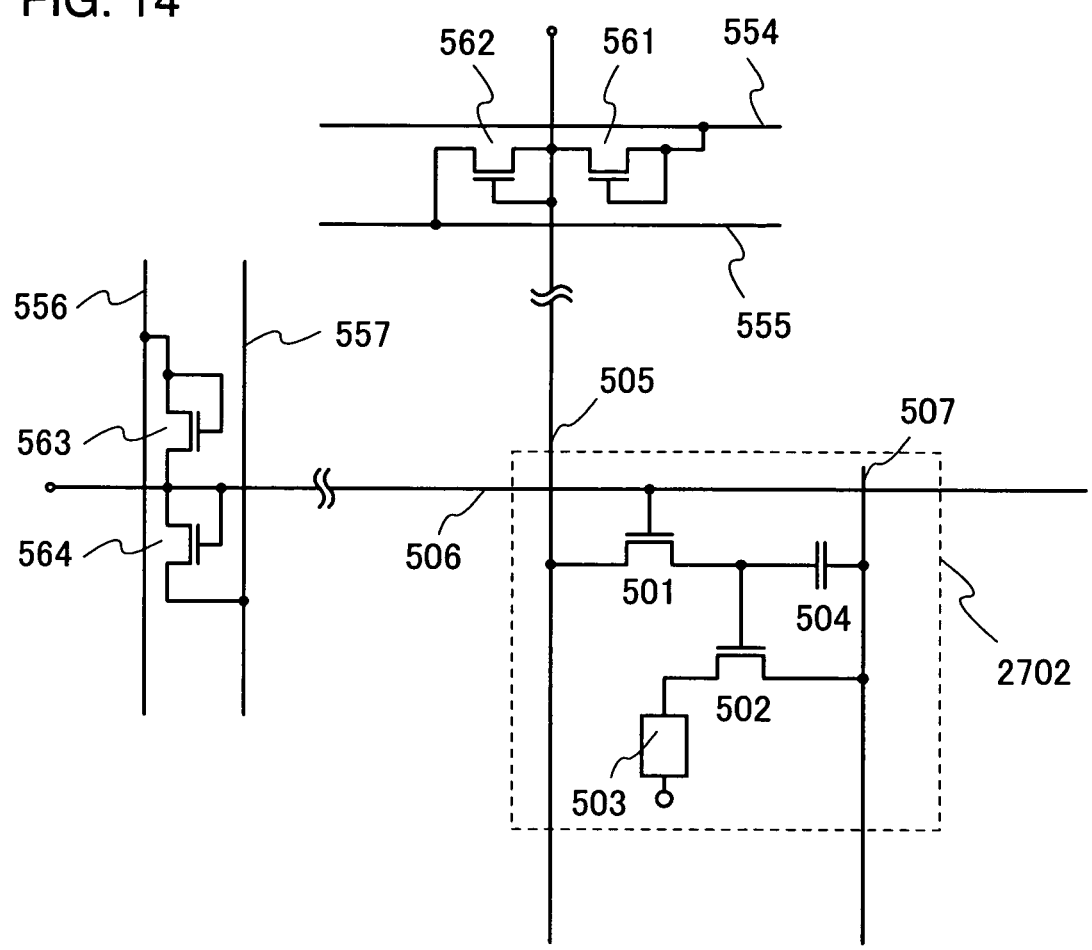
FIG. 14 is an equivalent circuit diagram of an EL display device shown in FIG. 15.

Protective diodes 561 and 562 are provided in the signal line side input terminal portion. These protective diodes are manufactured by similar steps to the TFTs 501 and 502, thereby a gate and one of a drain and a source are connected to operate as a diode. FIG. 14 shows an equivalent circuit diagram of a top plan view of FIG. 15.

The protective diode 561 includes a gate electrode layer, a semiconductor layer, and a wiring layer. The protective diode 562 has a similar structure. Common potential lines 554 and 555 connected to these protective diodes are formed of the same layer as the gate electrode layer. Accordingly, a contact hole is required to be formed in an insulating layer so as to be electrically connected to the wiring layer.

A contact hole in the insulating layer may be formed by forming a mask layer and applying etching thereto. In this case, by applying etching of atmospheric pressure discharge, local electric discharge can be performed, in which case a mask layer is not required to be formed over the entire surface of the substrate.

The signal wiring layer is formed of the same layer as a source and drain wiring layer 505. The signal wiring layer and the source or drain side are connected to each other.

An input terminal portion on the scan signal line side has a similar structure. A protective diode 563 includes a gate electrode layer, a semiconductor layer, and a wiring layer. A protective diode 564 has a similar structure. Common potentials 556 and 557 connected to these protective diodes are formed of the same layer as the source electrode layer and drain electrode layer. The protective diodes provided in the input stage can be formed at the same time. It is to be noted that the protective diode is not limited to be disposed at a position shown in this embodiment mode, but may be disposed between a driver circuit and a pixel.

EMBODIMENT MODE 6

Figure 16C:
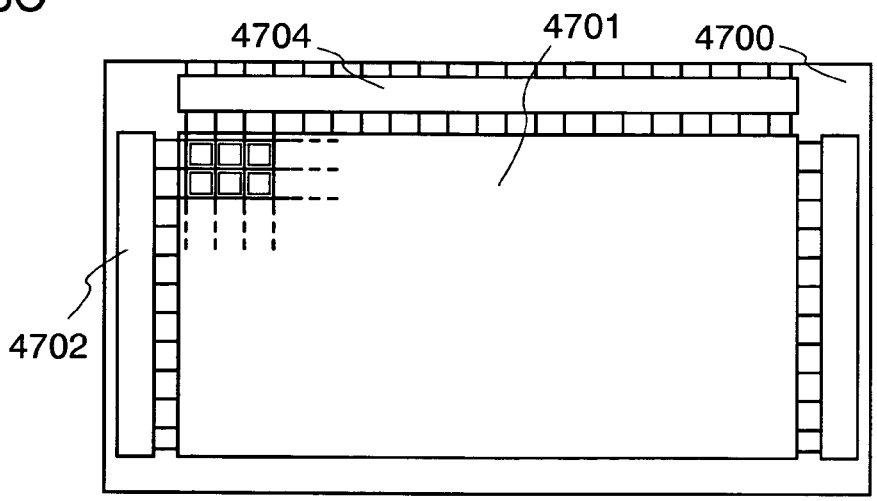

By using a display device formed by the invention, a television device can be completed. A display panel may have any one of a structure shown in FIG. 16A in which only a pixel portion is formed and a scan line side driver circuit and a signal line side driver circuit are mounted by a TAB method as shown in FIG. 17B or a COG method shown in FIG. 17A, a structure shown in FIG. 16B in which a TFT is formed of SAS, a pixel portion and a scan line side driver circuit are integrated over the substrate, and a signal line side driver circuit is mounted as a driver IC separately, a structure as shown in FIG. 16C in which a pixel portion, a signal line side driver circuit, and a scan line side driver circuit are integrated over the substrate, and the like.

Other external circuits include, on the video signal input side, a video signal amplifier circuit for amplifying a video signal received by a tuner, a video signal processing circuit for converting the outputted signal into a color signal corresponding to each color of red, green and blue, a control circuit for converting the video signal so as to be inputted to a driver IC, and the like. The control circuit outputs a signal to each of the scan line side and the signal line side. In the case where the display panel is driven in a digital manner, a configuration in which an input digital signal is divided into m signals to be supplied may be adopted by providing a signal divider circuit on the signal line side.

An audio signal received by the tuner is transmitted to an audio signal amplifier circuit of which output is supplied to a speaker through an audio signal processing circuit. A control circuit receives data on receiving station (received frequency) and volume control from an input portion, and transmits the signals to the tuner or the audio signal processing circuit.

Figure 20A:
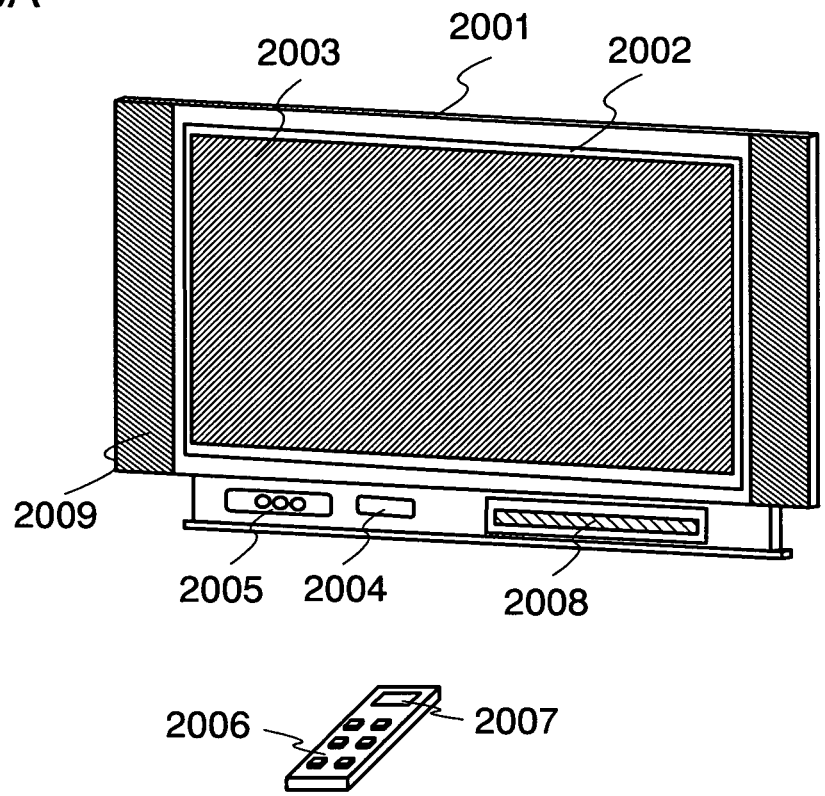
FIGS. 20A and 20B are views of electronic devices to which the invention is applied.
Figure 20B:
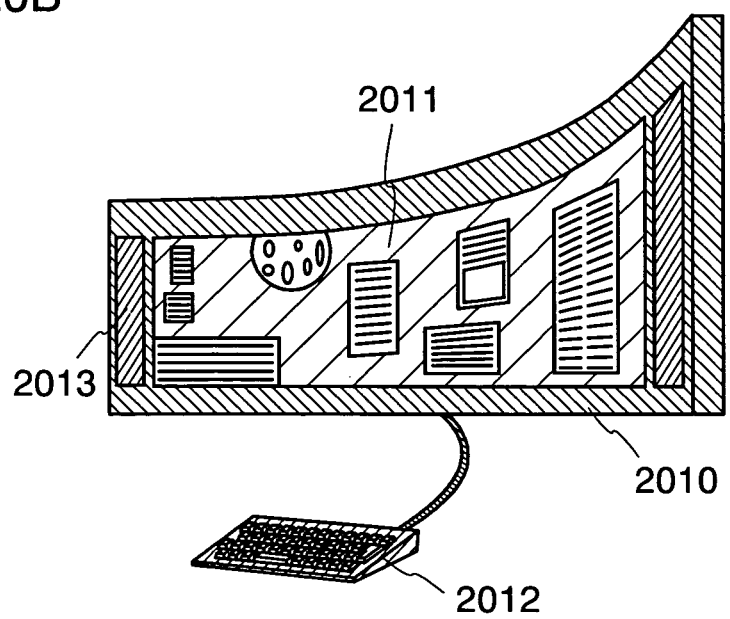

By incorporating the display module into a housing, a television device as shown in FIGS. 20A and 20B can be completed. A display panel to which an FPC is attached as shown in FIG. 5 is generally referred to an EL display module. Accordingly, by using the EL display module as shown in FIG. 5, an EL television device can be completed. A main display 2003 is formed of a display module which is provided with a speaker portion 2009, operating switches and the like as accessory equipment. In this manner, a television device can be completed.

Further, a retardation plate or a polarizing plate may be used to block the reflection of external incident light. In the case of the top emission type structure, an insulating layer serving as a partition may be colored to be used as a black matrix. This partition can be formed by the droplet discharge method and the like. For example, it can be formed by using a black pigment resin, or mixing a carbon black or the like into a resin material such as polyimide. Further, a stacked-layer structure of the partitions may also be used. The partition may be formed by discharging different materials at the same region a plurality of times by the droplet discharge method. As retardation plates, λ/4 and λ/2 plates may be used to control light. A TFT element substrate, a light emitting element, a sealing substrate (sealing member), the retardation plates, (λ/4 and λ/2 plates), and polarizing plate are sequentially stacked. Light generated from the light emitting element is emitted outside through the polarizing plate. The retardation plates and polarizer may be disposed on a side through which light is emitted. In the case of a dual emission type display device which emits light both upward and downward, retardation plates and polarizing plate can be provided over both surfaces of the display device. In addition, an anti-reflection film may be provided over the outer sides of the polarizing plate. According to this structure, high resolution and fine image can be displayed.

As shown in FIG. 20A, a display panel 2002 using a display element is incorporated in a housing 2001 and a receiver 2005 is connected to a communication network by wired or wireless connections via a modem 2004 to receive general TV broadcast so that one-way (from a sender to a receiver) or two-way (between a sender and a receiver or between receivers) information communication can be carried out. The television device can be operated by using a switch built in the housing or a remote control unit 2006. Also, a display portion 2007 for displaying output information may also be provided in the remote control unit.

Further, the television device may include a sub screen 2008 formed using a second display panel to display channels, volume, and the like, in addition to the main screen 2003. In this structure, the main screen 2003 may be formed by using an EL display panel having wide viewing angle and the sub screen may be formed by using a liquid crystal display panel capable of displaying images at lower power consumption. Alternatively, in order to give priority to the reduction in power consumption, the main screen 2003 may be formed by using a liquid crystal display panel capable of displaying at lower power consumption and the sub screen may be formed by using an EL display panel having wide view angle, which can be switched on/off. According to the present invention, a highly reliable display device can be formed even when a large size substrate is used and a large number of TFTs or electronic components are used.

FIG. 20B shows a television device having a display portion with a size of 20 to 80 inches. The television device includes a housing 2010, a keyboard portion 2012 that is an operation portion, a display portion 2011, speakers 2013 and the like. The invention is applied to the display portion 2011. Since the display portion of FIG. 20B is formed using a flexible substance, this television device has a curved display portion. Since the shape of the display portion can be designed freely in such a manner, a television device with a predetermined shape can be manufactured.

By using the invention, the manufacturing process can be simplified and cost can be reduced as well. Therefore, a television device using the invention can be formed at low cost even with a large display portion. Accordingly, a high performance television device with high reliability can be manufactured with high yield.

It is needless to say that the invention is not limited to the television device and can be used as a large area display medium for various applications such as a monitor of a personal computer, an information display at a train station, airport and the like, an advertisement display on the streets, and the like.

EMBODIMENT MODE 7

This embodiment mode is described with reference to FIGS. 21A and 21B. In this embodiment mode, description is made on an example of a module using a panel with a display device manufactured according to Embodiment Modes 1 to 6.

Figure 21A:
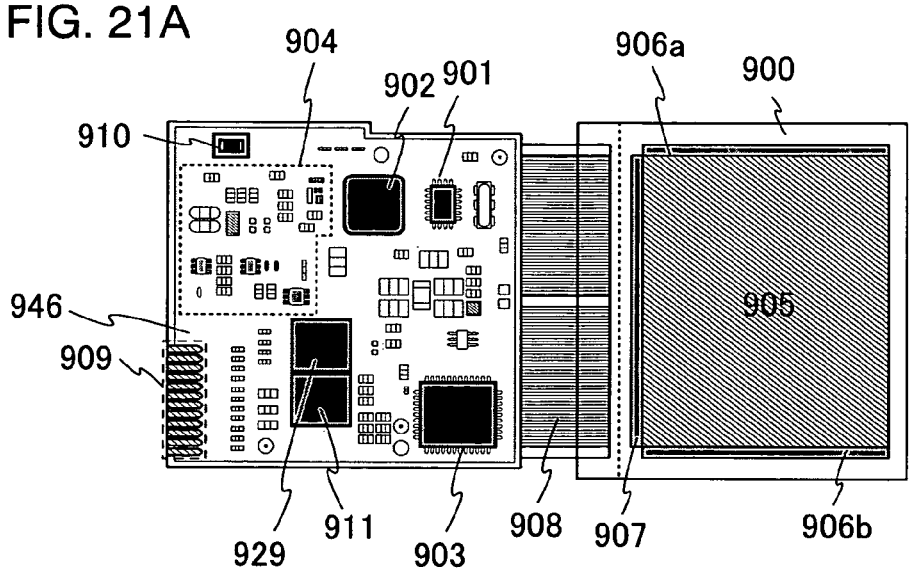
FIGS. 21A and 21B are views of electronic devices to which the invention is applied.

An information terminal module shown in FIG. 21A has a printed circuit board 946 over which a controller 901, a central processing unit (CPU) 902, a memory 911, a power source circuit 903, an audio processing circuit 929, a transmission/reception circuit 904, and other elements such as a resistor, a buffer, and a capacitor and mounted. Further, a panel 900 is connected to the printed circuit board 946 through a flexible printed circuit (FPC) 908.

The panel 900 includes a pixel portion 905 in which each pixel has a light emitting element, a first scan line side driver circuit 906a and a second scan line side driver circuit 906b which select a pixel in the pixel portion 905, and a signal line driver circuit 907 which supplies a video signal to the selected pixel.

Various signals are inputted and outputted through an interface (I/F) portion 909 provided over the printed circuit board 946. An antenna port 910 for transmitting and receiving signals with an antenna is provided over the printed circuit board 946.

It is to be noted that the printed circuit board 946 is connected to the panel 900 through the FPC 908 in this embodiment mode, however, the invention is not limited to this structure. The controller 901, the audio processing circuit 929, the memory 911, the CPU 902 or the power source circuit 903 may be directly mounted to the panel 900 by the COG (Chip On Glass) method. Further, various elements such as a capacitor and a buffer are provided over the printed circuit board 946, thereby it can be prevented that a noise occurs in the power source voltage and signals and the signal rise time becomes slow.

Figure 21B:
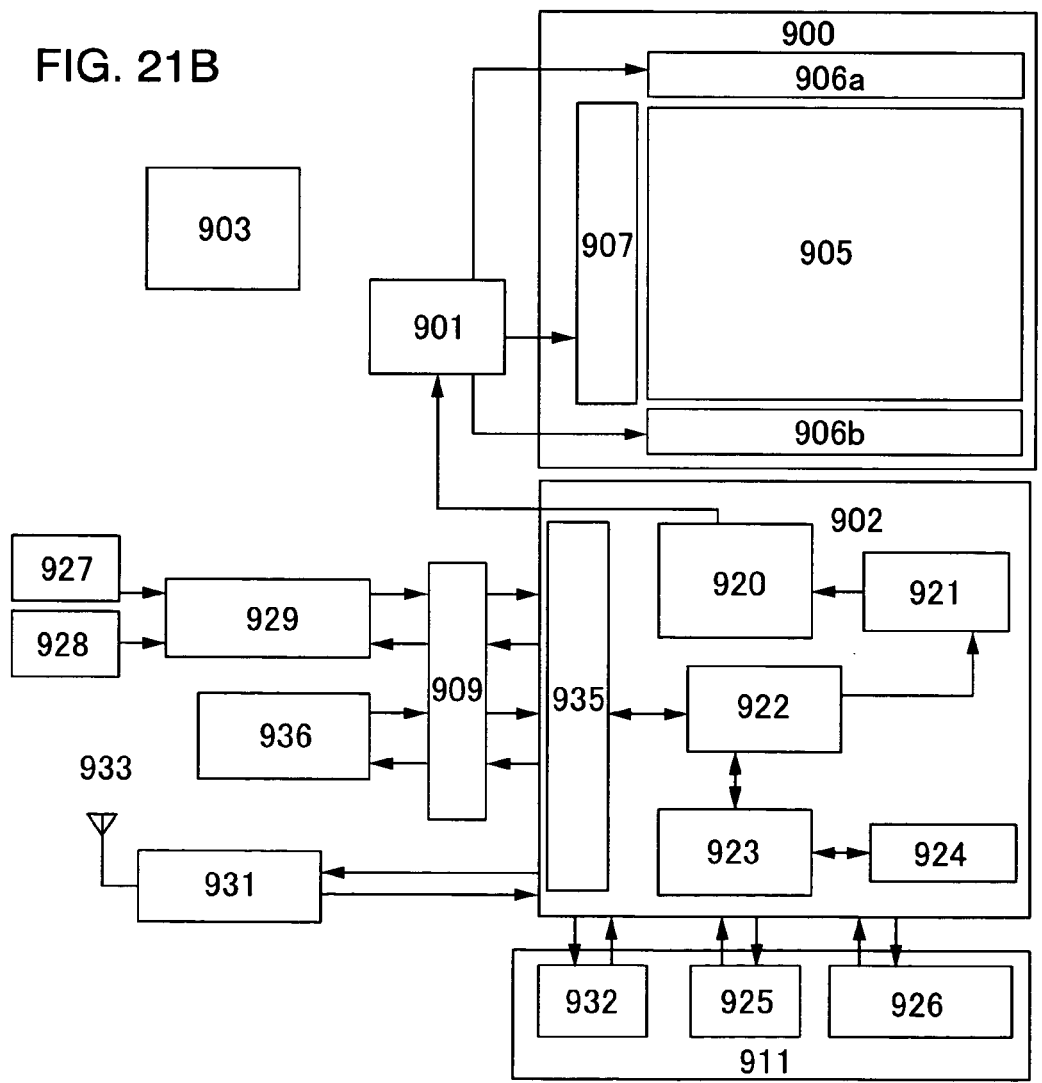

FIG. 21B is a block diagram of a module shown in FIG. 21A. This module 999 includes a VRAM 932, a DRAM 925, a flash memory 926 and the like as a memory 911. The VRAM 932 has data on the image to be displayed on a panel, the DRAM 925 has image data or audio data, and the flash memory has various programs.

The power source circuit 903 generates a power source voltage applied to the panel 900, the controller 901, the CPU 902, the audio processing circuit 929, the memory 911, and the transmission/reception circuit 931. There is a case where a current source is provided in the power source circuit 903 depending on the specifications of the panel.

The CPU 902 includes a control signal generating circuit 920, a decoder 921, a register 922, an arithmetic circuit 923, a RAM 924, an interface 935 for the CPU and the like. Various signals inputted to the CPU 902 through the interface 935 are held in the resister 922 and then inputted to the arithmetic circuit 923, the decoder 921 and the like. In the arithmetic circuit 923, an arithmetic operation is performed based on the inputted signal, and the address of various instructions is determined. Meanwhile, a signal inputted to the decoder 921 is decoded and inputted to the control signal generating circuit 920. The control signal generating circuit 920 generates a signal containing various instructions based on the inputted signal, and then transmits the signals to the address determined by the arithmetic circuit 923, specifically the memory 911, the transmission/reception circuit 931, the audio processing circuit 929, the controller 901 and the like.

Each of the memory 911, the transmission/reception circuit 929, and the controller 901 operates according to the received instruction. The operation thereof is briefly described.

A signal inputted from an input means 936 is transmitted to the CPU 902 which is mounted to the printed circuit board 946 through the interface 909. The control signal generating circuit 920 converts the image data stored in the VRAM 932 into a predetermined format based on the signal transmitted from the input means 936 such as a pointing device and a keyboard, and transmits the data to the controller 901.

The controller 901 processes the signals containing image data transmitted from the CPU 902 according to the specifications of the panel and then transmits the signals to the panel 900. Further, the controller 901 generates an Hsync signal, a Vsync signal, a clock signal CLK, an alternating current voltage (AC Cont), and a switching signal L/R based on the power source voltage inputted from the power source circuit 903 and the various signals inputted from the CPU 902, and supplies the signals to the panel 900.

The transmission/reception circuit 904 processes signals which are transmitted and received as electromagnetic waves by an antenna 933. In specific, the transmission/reception circuit 904 includes a high frequency circuit such as an isolator, a band pass filter, a VCO (Voltage Controlled Oscillator), an LPF (Low Pass Filter), a coupler, and a balun. A signal containing audio data among the signals transmitted and received by the transmission/reception circuit 904 is transmitted to the audio processing circuit 929 according to the instruction of the CPU 902.

The signal containing audio data transmitted according to the instruction of the CPU 902 is demodulated into an audio signal by the audio processing circuit 929 and transmitted to a speaker 928. An audio signal transmitted from a microphone 927 is modulated by the audio processing circuit 929 and transmitted to the transmission/reception circuit 904 according to the instruction of the CPU 902.

The controller 901, the CPU 902, the power source circuit 903, the audio processing circuit 929, and the memory 911 can be mounted as a package of this embodiment mode. This embodiment mode can be applied to any circuits but a high frequency circuit such as an isolator, a band pass filter, a VCO (Voltage Controlled Oscillator), an LPF (Low Pass Filter), a coupler, and a balun.

The panel 900 is provided with a spacer over a pixel electrode or an insulator covering the periphery of the pixel electrode. Accordingly, a module provided with this panel 900 supports a mask used for forming an electroluminescent layer so as not to contact a pixel electrode, therefore, a damage to the pixel electrode can be prevented, thereby a display of high image quality and reliability can be obtained.

EMBODIMENT MODE 8

Figure 22:
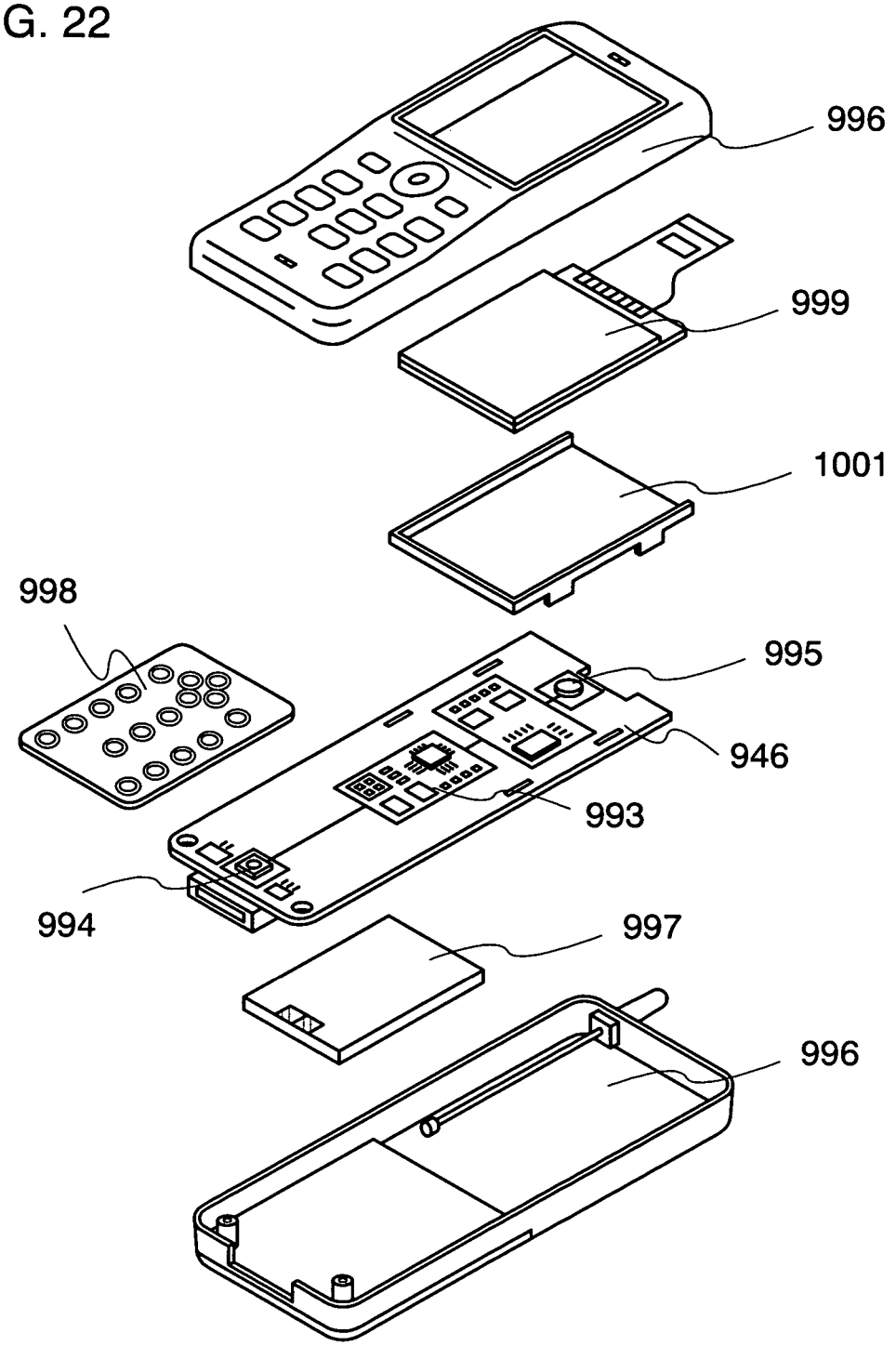
FIG. 22 is a view of an electronic device to which the invention is applied.

This embodiment mode is described with reference to FIGS. 21A to 22. FIG. 22 shows one mode of a wireless compact phone (portable phone) including the module manufactured according to Embodiment Mode 8. The panel 900 which is detachable can be incorporated in a housing 1001 and easily integrated with the module 999. The shape and size of the housing 1001 can be appropriately changed according to an electronic device.

The housing 1001 to which the panel 900 is fixed is mounted on the printed circuit board 946 and completed as a module. The printed circuit board 946 incorporates a controller, a CPU, a memory, a power source circuit, and other elements such as a resistor, a buffer, and a capacitor. Further, an audio processing circuit including a microphone 994 and a speaker 995, and a signal processing circuit 993 such as a transmission/reception circuit are provided. The panel 900 is connected to the printed circuit board 946 through the FPC 908.

Such module 999, an input means 998, and a buttery 997 are stored in a housing 996. A pixel portion of the panel 900 is disposed to be seen from an opening window formed in the housing 996.

The panel 900 is provided with a spacer over a pixel electrode or an insulator covering the periphery of the pixel electrode. Accordingly, a module provided with this panel 900 supports a mask used for forming an electroluminescent layer so as not to contact a pixel electrode, therefore, damage to the pixel electrode can be prevented, thereby a display of high image quality and reliability can be obtained.

A housing 996 shown in FIG. 22 shows an example of an external appearance of a phone. An electronic device according to this embodiment mode may change into various modes according to the function and application. An example of the modes is described in the following embodiment mode.

EMBODIMENT MODE 9

By applying the invention, various display devices can be manufactured. That is, the invention can be applied to various electronic devices having the display device incorporated in a display portion thereof.

The various electronic devices include a camera such as a video camera and a digital camera, a projector, a head mounted display (a goggle type display), a car navigation, a car stereo, a personal computer, a game machine, a portable information terminal (a mobile computer, a portable phone, an electronic book or the like), an image reproducing device provided with a recording medium (in specific, a device which reproduces a recording medium such as a Digital Versatile Disc (DVD) and has a display which can display the reproduced image) and the like. Example of these are shown in FIGS. 23A to 23C.

Figure 23A:
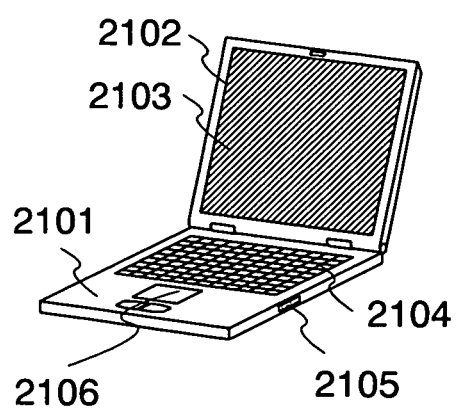
FIGS. 23A to 23C are views of electronic devices to which the invention is applied.

FIG. 23A illustrates a computer including a main body 2101, a housing 2102, a display portion 2103, a keyboard 2104, an external connecting port 2105, a pointing mouse 2106 and the like. According to the invention, a computer which displays a high quality image can be completed with high reliability even when the computer is downsized and pixels become finer.

Figure 23B:
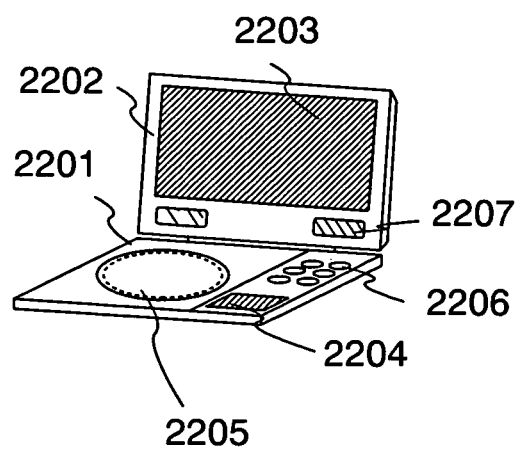

FIG. 23B illustrates an image reproducing device provided with a recording medium (specifically a DVD reproducing device) including a main body 2201, a housing 2202, a display portion A 2203, a display portion B 2204, a recording medium (such as a DVD) reading portion 2205, an operating key 2206, a speaker portion 2207 and the like. The display portion A 2203 mainly displays image data while the display portion B 2204 mainly displays text data. According to the invention, an image reproducing device which displays a high quality image with high reliability even when the image reproducing device is downsized and pixels become finer.

Figure 23C:
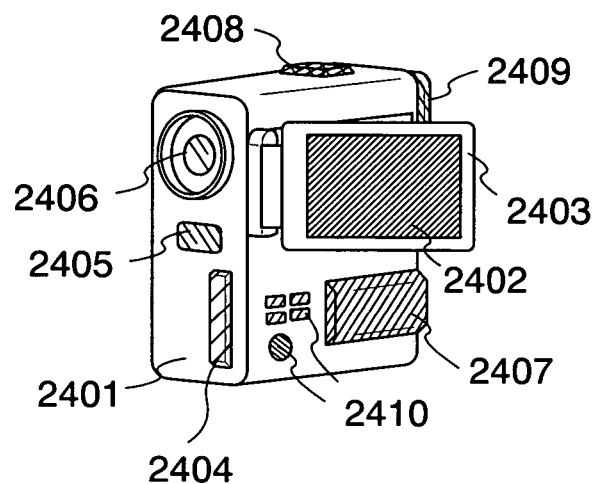

FIG. 23C illustrates a video camera including a main body 2401, a display portion 2402, a housing 2403, an external connecting port 2404, a remote control receiving portion 2405, an image receiving portion 2406, a battery 2407, an audio input portion 2408, an eyepiece portion 2409, operating keys 2410 and the like. According to the invention, a video camera which displays a high quality image with high reliability even when the video camera is downsized and pixels become finer. This embodiment mode can be freely implemented in combination with the aforementioned embodiment modes.

Figure 28A:
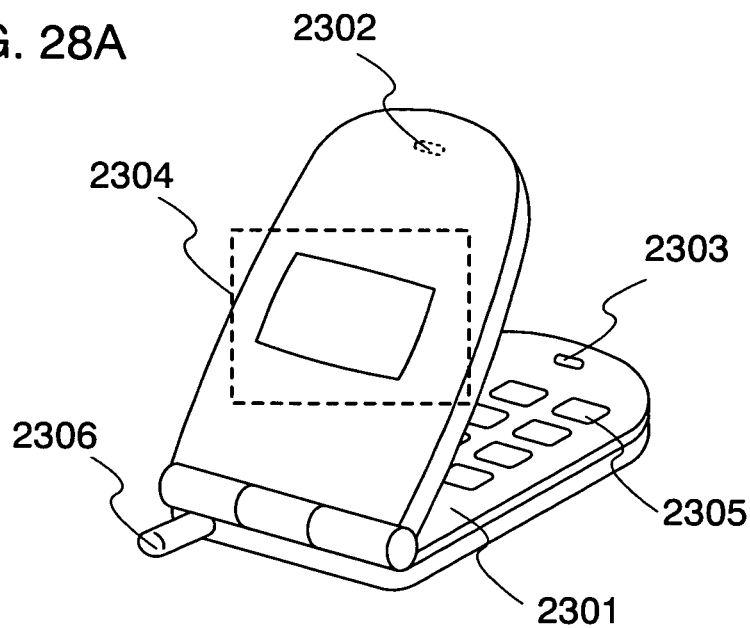
FIGS. 28A to 28C are views of an electronic device to which the invention is applied.
Figure 28B:
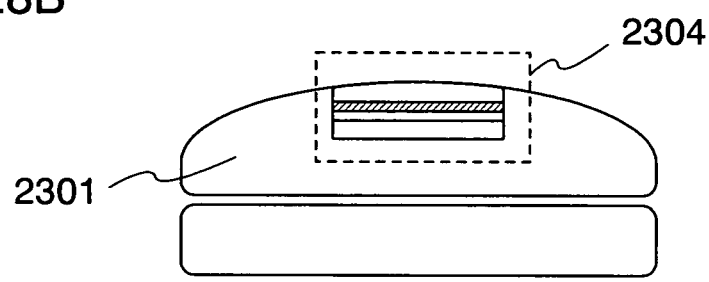
Figure 28C:
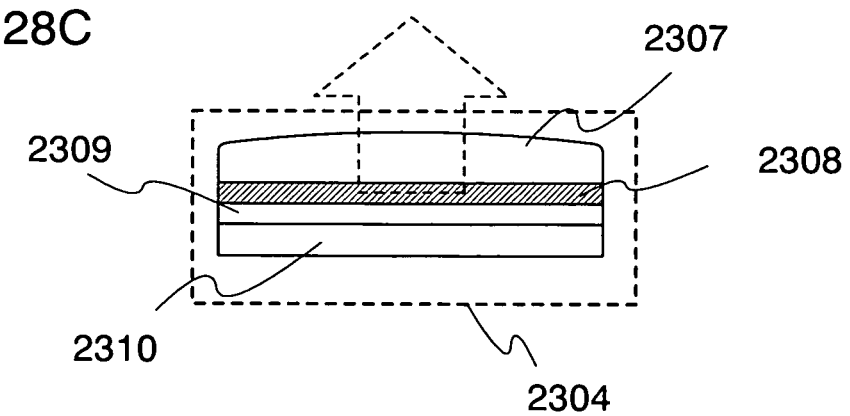

FIG. 28A illustrates a portable phone including a housing 2301, an audio output portion 2302, an audio input portion 2303, an information display 2304, an operating switch 2305, an antenna 2306 and the like. FIG. 28B is a cross sectional view including a cross section of a display module having the information display 2304. FIG. 28C is an enlarged view of a display module including the information display 2304 of FIG. 28B, which is formed of a sealing substrate 2307, a layer 2308 including an EL element, a layer 2309 including an element, and a substrate 2310. Light is emitted in a direction of an arrow from the layer 2308 including an EL element, thereby an image can be displayed. The sealing substrate 2307 has a curved surface which is attached to fit the curved surface of the housing 2301. By manufacturing the portable phone in this manner, the housing 2301 and the information display 2304 are more integrated, which looks better. According to the invention, a portable phone which displays a high quality image with high reliability even when the portable phone is downsized and pixels become finer is provided.

EMBODIMENT 1

The display devices described in Embodiment Modes 1 and 2 are manufactured and observed. The observation is carried out by a scanning electron microscope (SEM).

Figure 26A:
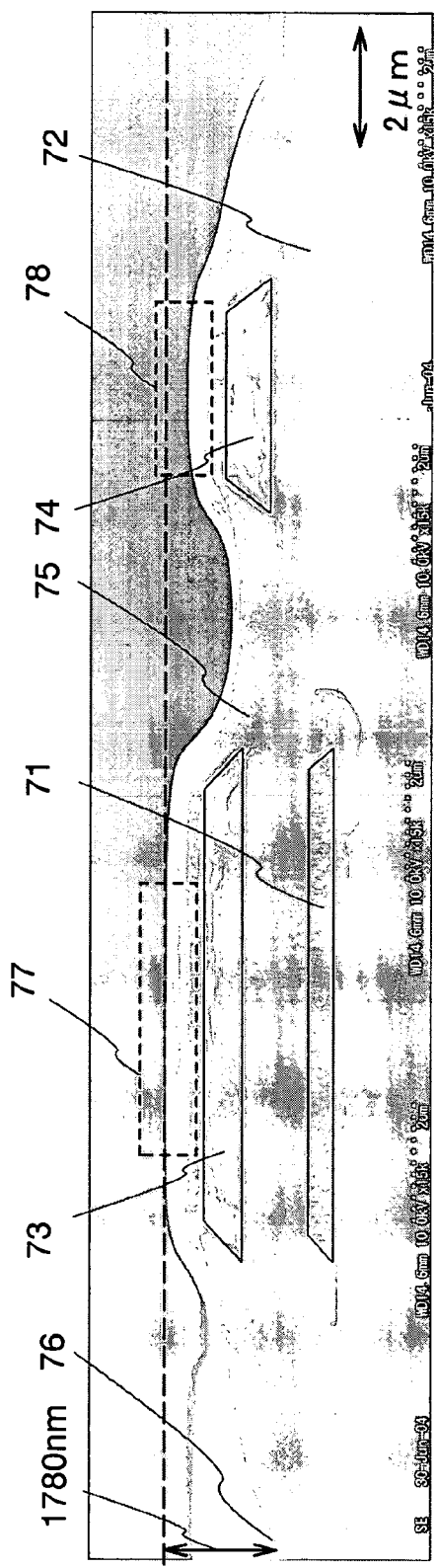
FIGS. 26A and 26B are SEM pictures showing cross sectional views of a display device of the invention.
Figure 26B:
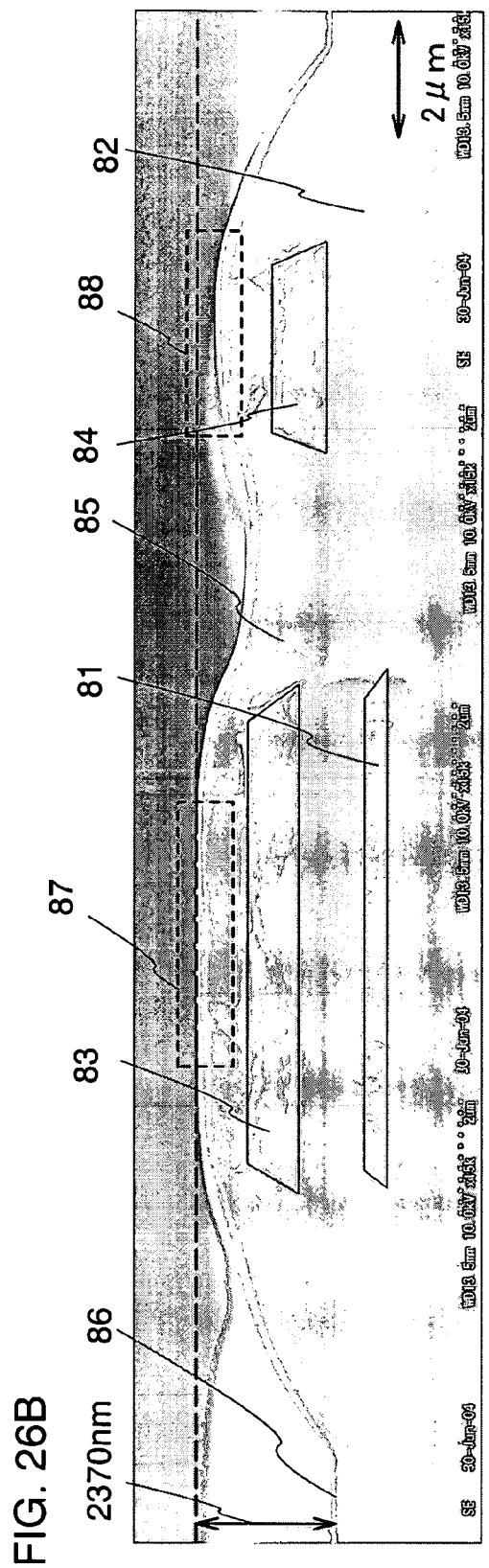

FIGS. 26A and 26B are SEM pictures corresponding to the cross section along the line J-I in FIG. 1. The SEM picture in FIG. 26A is formed of a plurality of pictures connected to each other. In FIG. 26A, a gate electrode layer 71, an insulating film 72, a source electrode layer or drain electrode layer 73, a source electrode layer or drain electrode layer 74, an insulator 75 which functions as a partition, and a pixel electrode layer forming region 76 are shown. The surface of the insulator 75 has projection portions 77 and 78 affected by a height of a stacked object in a forming region. A height from the surface of the pixel electrode layer forming region 76 to the projection portion 77 is 1780 nm.

In FIG. 26B, a gate electrode layer 81, an insulating film 82, a source electrode layer or drain electrode layer 83, a source electrode layer or drain electrode layer 84, an insulator 85 which functions as a partition, and a pixel electrode layer forming region 86 are shown. The surface of the insulator 85 has projection portions 87 and 88 affected by a height of a stacked object in a forming region. A height from the surface of the pixel electrode layer forming region 86 to the projection portion 87 is 2370 nm.

The insulators 75 and 85 are formed of an insulating material (a siloxane material) having a skeleton of Si—O bond. The insulator 75 is formed by spin coating with a coating condition of a spin rate of 1500 rpm for 12.5 sec and exposure time of 2500 msec. The insulator 85 is formed by spin coating with a coating condition of a spin rate of 1000 rpm for 10 sec and exposure time of 5000 msec.

In this manner, the height from the surface of the pixel electrode layer to the surface of the insulator is formed high by providing a projection portion, thereby the top surface of the insulator can function as a spacer. A mask used when depositing an electroluminescent layer does not contact the pixel electrode layer as the mask is supported by the spacer formed over the pixel electrode layer and an insulator covering the periphery of the pixel electrode layer as a partition. Accordingly, a defect in shape of the pixel electrode layer due to a mask can be prevented, which leads to manufacture a display device with high reliability and image quality without the first electrode layer generating a light emission defect and a display defect.

This application is based on Japanese Patent Application serial no. 2004-300877 filed in Japan Patent Office on 14, Oct. 2004, the entire contents of which are hereby incorporated by reference.

What is claimed is:
1. A display device comprising:
   a pixel comprising:
      a substrate;
      a semiconductor layer over the substrate;
      a gate insulating layer over the semiconductor layer;
      a gate electrode layer over the gate insulating layer;

an insulating layer over the gate electrode layer;
a source electrode layer or a drain electrode layer over the insulating layer;
a first electrode layer in contact with the source electrode layer or the drain electrode layer over the insulating layer;
an insulator covering and being in contact with the insulating layer, the source electrode layer or the drain electrode layer, and a portion of the first electrode layer;
an electroluminescent layer over and in contact with a first surface of the first electrode layer and the insulator; and
a second electrode layer over and in contact with the electroluminescent layer and the insulator,
wherein the insulator has a first projection portion over a region where the source electrode layer or the drain electrode layer overlaps with the gate electrode layer,
wherein the insulator has a second projection portion over the source electrode layer or the drain electrode layer, wherein the second projection portion does not overlap with the gate electrode layer,
wherein a height of the first projection portion from a surface of the substrate is higher than a height of the second projection portion from the surface of the substrate;
wherein the insulator covers a periphery of the first electrode layer, and
wherein the insulator crosses over the first surface of the first electrode layer parallel to a short side of the first surface of the first electrode layer in two places so that the insulator has a first aperture, a second aperture and a third aperture overlapping with the first surface of the first electrode layer.

2. The display device according to claim 1, wherein the first electrode layer is a pixel electrode layer.

3. The display device according to claim 1, further comprising:
a passivation film over the second electrode layer and the insulator.

4. An electronic device having the display device according to claim 1, wherein the electronic device is one selected from the group consisting of a video camera, a digital camera, a projector, a head mounted display, a car navigation, a car stereo, a personal computer, a game machine, a mobile computer, a portable phone, an electronic book, and an image reproducing device.

5. The display device according to claim 1, the insulator has a depressed portion between the first projection portion and the second projection portion.

6. A display device comprising:
a pixel comprising:
a substrate;
a thin film transistor including a semiconductor layer, a gate electrode layer and a gate insulating layer between the semiconductor layer and the gate electrode layer over the substrate;
an insulating layer over the thin film transistor;
a source electrode layer or a drain electrode layer over the insulating layer;
a first electrode layer in contact with the source electrode layer or the drain electrode layer over the insulating layer;
an insulator covering and being in contact with the insulating layer, the source electrode layer or the drain electrode layer, and a portion of the first electrode layer;
an electroluminescent layer over and in contact with a first surface of the first electrode layer and the insulator; and
a second electrode layer over and in contact with the electroluminescent layer and the insulator,
wherein the insulator has a first projection portion over a region where the source electrode layer or the drain electrode layer overlaps with the gate electrode layer,
wherein the insulator has a second projection portion over the source electrode layer or drain electrode layer, wherein the second projection portion does not overlap with the gate electrode layer,
wherein a height of the first projection portion from a surface of the substrate is higher than a height of the second projection portion from the surface of the substrate;
wherein the insulator covers a periphery of the first electrode layer, and
wherein the insulator crosses over the first surface of the first electrode layer parallel to a short side of the first surface of the first electrode layer in two places so that the insulator has a first aperture, a second aperture and a third aperture overlapping with the first surface of the first electrode layer.

7. The display device according to claim 6, wherein the first electrode layer is a pixel electrode layer.

8. The display device according to claim 6, further comprising:
a passivation film over the second electrode layer and the insulator.

9. An electronic device having the display device according to claim 6, wherein the electronic device is one selected from the group consisting of a video camera, a digital camera, a projector, a head mounted display, a car navigation, a car stereo, a personal computer, a game machine, a mobile computer, a portable phone, an electronic book, and an image reproducing device.

10. The display device according to claim 6, the insulator has a depressed portion between the first projection portion and the second projection portion.

\* \* \* \* \*

UNITED STATES PATENT AND TRADEMARK OFFICE
CERTIFICATE OF CORRECTION

PATENT NO. : 8,772,783 B2  
APPLICATION NO. : 11/240568  
DATED : July 8, 2014  
INVENTOR(S) : Misako Hirosue et al.

Page 1 of 1

It is certified that error appears in the above-identified patent and that said Letters Patent is hereby corrected as shown below:

In the Specification:

Col. 18, line 41, "aluminum oxynitride (AION)" should read "aluminum oxynitride (AlON)"

Col. 38, lines 6-8, "4-dicyanomethylene-2-methyl-6-[2-(1,1,7,7-tetramethyl-9julolidyl)-ethenyl]-4H-pyran" should read "4-dicyanomethylene-2-methyl-6-[2-(1,1,7,7-tetramethyl-9-julolidyl)-ethenyl]-4H-pyran"

Col. 42, line 16, "preferable that 0 is" should read "preferable that O is"

Signed and Sealed this  
Twenty-fifth Day of November, 2014

Michelle K. Lee  
*Deputy Director of the United States Patent and Trademark Office*